(12) United States Patent
Kim et al.

(10) Patent No.: US 12,262,577 B2
(45) Date of Patent: Mar. 25, 2025

(54) THREE-DIMENSIONAL PEROVSKITE NANOPIXELS FOR ULTRAHIGH-RESOLUTION COLOR DISPLAYS AND MULTILEVEL ANTI-COUNTERFEITING

(71) Applicant: The University of Hong Kong, Hong Kong (CN)

(72) Inventors: Jitae Kim, Hong Kong (CN); Mojun Chen, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 608 days.

(21) Appl. No.: 17/647,709

(22) Filed: Jan. 11, 2022

(65) Prior Publication Data

US 2023/0225146 A1  Jul. 13, 2023

(51) Int. Cl.

| | |
|---|---|
| *H01L 51/50* | (2006.01) |
| *C07F 7/24* | (2006.01) |
| *C09D 11/037* | (2014.01) |
| *C09D 11/50* | (2014.01) |
| *C09K 11/06* | (2006.01) |
| *H10K 50/135* | (2023.01) |
| *H10K 59/10* | (2023.01) |

(Continued)

(52) U.S. Cl.
CPC ............ *H10K 50/135* (2023.02); *C07F 7/24* (2013.01); *C09D 11/037* (2013.01); *C09D 11/50* (2013.01); *C09K 11/06* (2013.01); *H10K 59/10* (2023.02); *H10K 71/00* (2023.02); *H10K 71/13* (2023.02); *H10K 71/40* (2023.02); *B42D 25/387* (2014.10); *C09K 2211/10* (2013.01); *H10K 85/30* (2023.02)

(58) Field of Classification Search
CPC ...... H10K 50/135; H10K 59/10; H10K 71/13; H10K 71/00; H10K 71/40; H10K 85/30; C07F 7/24; C09D 11/50; C09K 11/06
See application file for complete search history.

(56) References Cited

U.S. PATENT DOCUMENTS

2017/0321117 A1*  11/2017  Weidman ............... C09K 11/06

OTHER PUBLICATIONS

Kumar, K., et al., "Printing colour at the optical diffraction limit," Nature Nanotechnology, 2012, 7:557-561.

(Continued)

*Primary Examiner* — Nathan T Leong
(74) *Attorney, Agent, or Firm* — Saliwanchik, Lloyd & Eisenschenk

(57) ABSTRACT

A method for preparing three-dimensional perovskite nanopixels of a digital display is provided. The method includes steps of preparing precursor ink by mixing methylammonium halide and lead halide and adding them into another mixture, adding the precursor ink into a nanopipette, placing the nanopipette with the precursor ink above a silicon substrate and apart from the silicon substrate by a certain distance, configuring the nanopipette to come into contact with the Si substrate such that a portion of the precursor ink having an interface surface of a shape of a meniscus is formed between the nanopipette and the silicon substrate, performing rapid evaporation of the portion of the precursor ink to facilitate crystallization of perovskite, moving the nanopipette upwardly at a constant speed such that the crystallization of perovskite proceeds upwardly, and terminating the crystallization of perovskite to generate a freestanding nanopixel for emitting light.

18 Claims, 55 Drawing Sheets

(51) Int. Cl.
| | |
|---|---|
| H10K 71/00 | (2023.01) |
| H10K 71/13 | (2023.01) |
| H10K 71/40 | (2023.01) |
| B42D 25/387 | (2014.01) |
| H10K 85/30 | (2023.01) |

(56) References Cited

OTHER PUBLICATIONS

Zhu, X., et al., "Plasmonic colour laser printing," Nature Nanotechnology, 2016, 11:325-330.
Franklin, D., et al., "Actively addressed single pixel full-colour plasmonic display," Nature Communications, 2017, 8(15209):1-10.
Su, M., et al., "A 3D Self-Shaping Strategy for Nanoresolution Multicomponent Architectures," Advanced Materials, 2018, 30:1-8.
Li, Q., et al., "Grayscale Nanopixel Printing at Sub-10-nanometer Vertical Resolution via Light-Controlled Nanocapillarity," ACS Nano, 2020, 14:6058-6066.
Ko, J., et al., "Ligand-Assisted Direct Photolithography of Perovskite Nanocrystals Encapsulated with Multifunctional Polymer Ligands for Stable, Full-Colored, High-Resolution Displays," Nano Letters, 2021, 21:2288-2295.
Kwak, J., et al., "Bright and Efficient Full-Color Colloidal Quantum Dot Light-Emitting Diodes Using an Inverted Device Structure," Nano Letters, 2012, 12:2362-2366.
Zhang, F., et al., "Brightly Luminescent and Color-Tunable Colloidal CH3NH3PbX3 (X = Br, I, Cl) Quantum Dots: Potential Alternatives for Display Technology," ACS Nano, 2015, 9(4):4533-4542.
Bae, J., et al., "3D-Printed Quantum Dot Nanopixels," ACS Nano, 2020, 14:10993-11001.
Sun, B., et al., "3D Computational Imaging with Single-Pixel Detectors," Science, 2013, 340:844-848.
Phillips, D.B., et al., "Adaptive foveated single-pixel imaging with dynamic supersampling," Science Advances, 2017, 3(4):1-11.
Gao, Y., et al., "Lead Halide Perovskite Nanostructures for Dynamic Color Display," ACS Nano, 2018, 12:8847-8854.
Carro-Temboury, M.R., et al., "An optical authentication system based on imaging of excitation-selected anthanide luminescence," Science Advances, 2018, 4(1):1-8.
Tan, M., et al., "Temporal Multilevel Luminescence Anticounterfeiting through Scattering Media," ACS Nano, 2020, 14:6532-6538.
Zang, X., et al., "Polarization Encoded Color Image Embedded in a Dielectric Metasurface," Advanced Materials, 2018, 30:1-6.
Liu, Y., et al., "Inkjet-printed unclonable quantum dot fluorescent anti-counterfeiting labels with artificial intelligence authentication," Nature Communications, 2019, 10(2409):1-9.
Ren, W., et al., "Optical Nanomaterials and Enabling Technologies for High-Security-Level Anticounterfeiting," Advanced Materials, 2020, 32:1-15.
Deng, J., et al., "Multiplexed Anticounterfeiting Meta-image Displays with Single-Sized Nanostructures," Nano Letters, 2020, 20:1830-1838.
Protesescu, L., et al., "Nanocrystals of Cesium Lead Halide Perovskites (CsPbX3, X = Cl, Br, and I): Novel Optoelectronic Materials Showing Bright Emission with Wide Color Gamut," Nano Letters, 2015, 15:3692-3696.
Miao, Y., et al., "Stable and bright formamidinium-based perovskite light-emitting diodes with high energy conversion efficiency," Nature Communications, 2019, 10(3624):1-7.
Lu, M., et al., "Bright CsPbI3 Perovskite Quantum Dot Light-Emitting Diodes with Top-Emitting Structure and a Low Efficiency Roll-Off Realized by Applying Zirconium Acetylacetonate Surface Modification," Nano Letters, 2020, 20:2829-2836.
Xing, G., et al., "Low-temperature solution-processed wavelength-tunable perovskites for lasing," Nature Materials, 2014, 13:476-480.
Fu, Y., et al., "Broad Wavelength Tunable Robust Lasing from Single-Crystal Nanowires of Cesium Lead Halide Perovskites (CsPbX3, X = Cl, Br, I)," ACS Nano, 2016, 10:7963-7972.

Xing, J., et al., "Vapor Phase Synthesis of Organometal Halide Perovskite Nanowires for Tunable Room-Temperature Nanolasers," Nano Letters, 2015, 15:4571-4577.
Kojima, A., et al., "Organometal Halide Perovskites as Visible-Light Sensitizers for Photovoltaic Cells," J. Am. Chem. Soc., 2009, 131(17):6050-6051.
Green, M.A., et al., "The emergence of perovskite solar cells," Nature Photonics, 2014, 8:506-514.
Yang, W.S., et al., "Iodide management in formamidinium-lead-halide-based perovskite layers for efficient solar cells," Science, 2017, 356(6345):1-5.
Veldhuis, S.A., et al., "Perovskite Materials for Light-Emitting Diodes and Lasers," Advanced Materials, 2016, 28:6804-6834.
Zhu, M., et al., "Electrohydrodynamically Printed High-Resolution Full-Color Hybrid Perovskites," Advanced Functional Materials, 2019, 29:1-7.
Liu, Y., "Fluorescent Microarrays of in Situ Crystallized Perovskite Nanocomposites Fabricated for Patterned Applications by Using Inkjet Printing," ACS Nano, 2019, 13:2042-2049.
Shi, L., et al., "In Situ Inkjet Printing Strategy for Fabricating Perovskite Quantum Dot Patterns," Advanced Functional Materials, 2019, 29:1-6.
Zhang, N., et al., "Highly Reproducible Organometallic Halide Perovskite Microdevices based on Top-Down Lithography," Advanced Materials, 2017, 29:1-9.
Wang, S., et al., "Lead Halide Perovskite Based Microdisk Lasers for On-Chip Integrated Photonic Circuits," Advanced Optical Materials, 2018, 6:1-7.
Lyashenko, D., et al., "High-resolution patterning of organohalide lead perovskite pixels for photodetectors using orthogonal photolithography," Phys. Status Solidi A, 2017, 214(1):1-7.
Harwell, J., et al., "Patterning Multicolor Hybrid Perovskite Films via Top-Down Lithography," ACS Nano, 2019, 13:3823-3829.
Xing, D., et al., "Self-Healing Lithographic Patterning of Perovskite Nanocrystals for Large-Area Single-Mode Laser Array," Advanced Functional Materials, 2021, 31:1-9.
Wang, H., et al., "Nanoimprinted Perovskite Nanograting Photodetector with Improved Efficiency," ACS Nano, 2016, 10:10921-10928.
Li, Z., et al., "Room-Temperature Continuous-Wave Operation of Organometal Halide Perovskite Lasers," ACS Nano, 2018, 12:10968-10976.
Jeong, B., et al., "Micro- and Nanopatterning of Halide Perovskites Where Crystal Engineering for Emerging Photoelectronics Meets Integrated Device Array Technology," Advanced Materials, 2020, 32:1-35.
Kim, B.H., et al., "High-Resolution Patterns of Quantum Dots Formed by Electrohydrodynamic Jet Printing for Light-Emitting Diodes," Nano Letters, 2015, 15:969-973.
Richner, P., et al., "Full-Spectrum Flexible Color Printing at the Diffraction Limit," ACS Photonics, 2016, 3:754-757.
Park, N.-G., "Green solvent for perovskite solar cell production," Nature Sustainability, 2021, 4:192-193.
Chen, J., et al., "Vapor-Phase Epitaxial Growth of Aligned Nanowire Networks of Cesium Lead Halide Perovskites (CsPbX3, X = Cl, Br, I)," Nano Letters, 2017, 17:460-466.
Hu, X., et al., "Direct Vapor Growth of Perovskite CsPbBr3 Nanoplate Electroluminescence Devices," ACS Nano, 2017, 11:9869-9876.
Chen, M., et al., "3D Nanoprinting of Perovskites," Advanced Materials, 2019, 31:1-8.
Chen, M., et al., "Meniscus-on-Demand Parallel 3D Nanoprinting," ACS Nano, 2018, 12:4172-4177.
Kim, J.T., et al., "Three-Dimensional Writing of Conducting Polymer Nanowire Arrays by Meniscus-Guided Polymerization," Advanced Materials, 2011, 23:1968-1970.
Hu, J., et al., "Meniscus-Confined Three-Dimensional Electrodeposition for Direct Writing of Wire Bonds," Science, 2010, 329(5989):313-317.
Yi, Z., et al., "Vertical, capacitive microelectromechanical switches produced via direct writing of copper wires," Microsystems & Nanoengineering, 2016, 2:1-7.

* cited by examiner bi-color (R-G) code

R code

R code

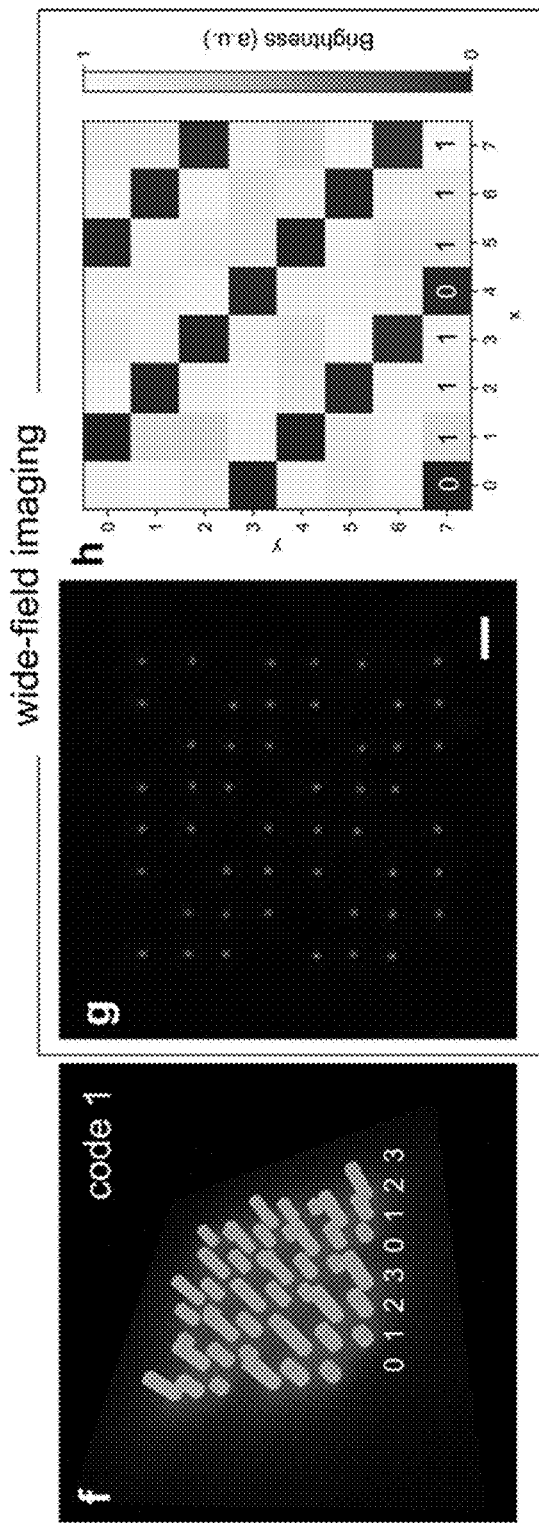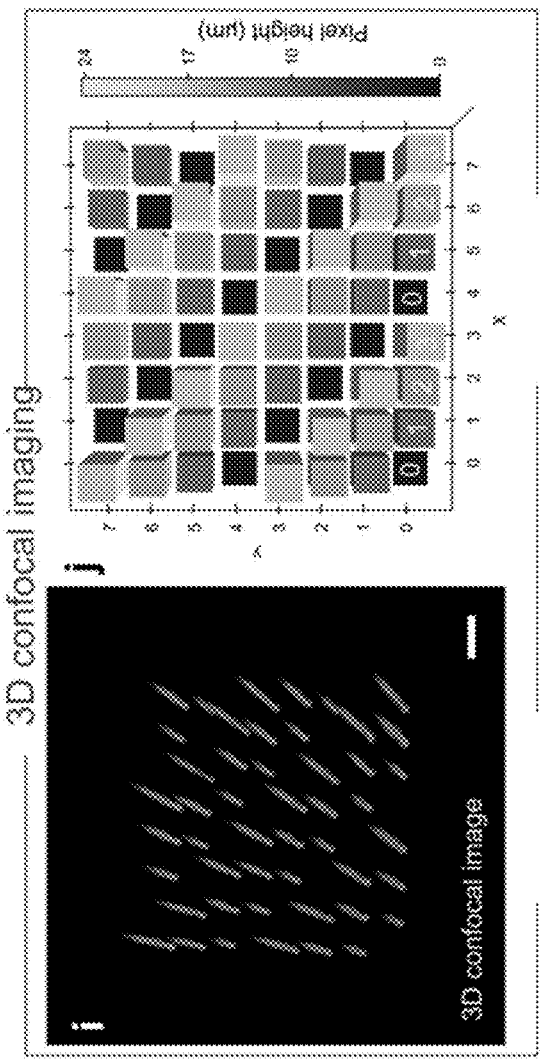
FIG. 4F
FIG. 4G
FIG. 4H
FIG. 4I
FIG. 4J

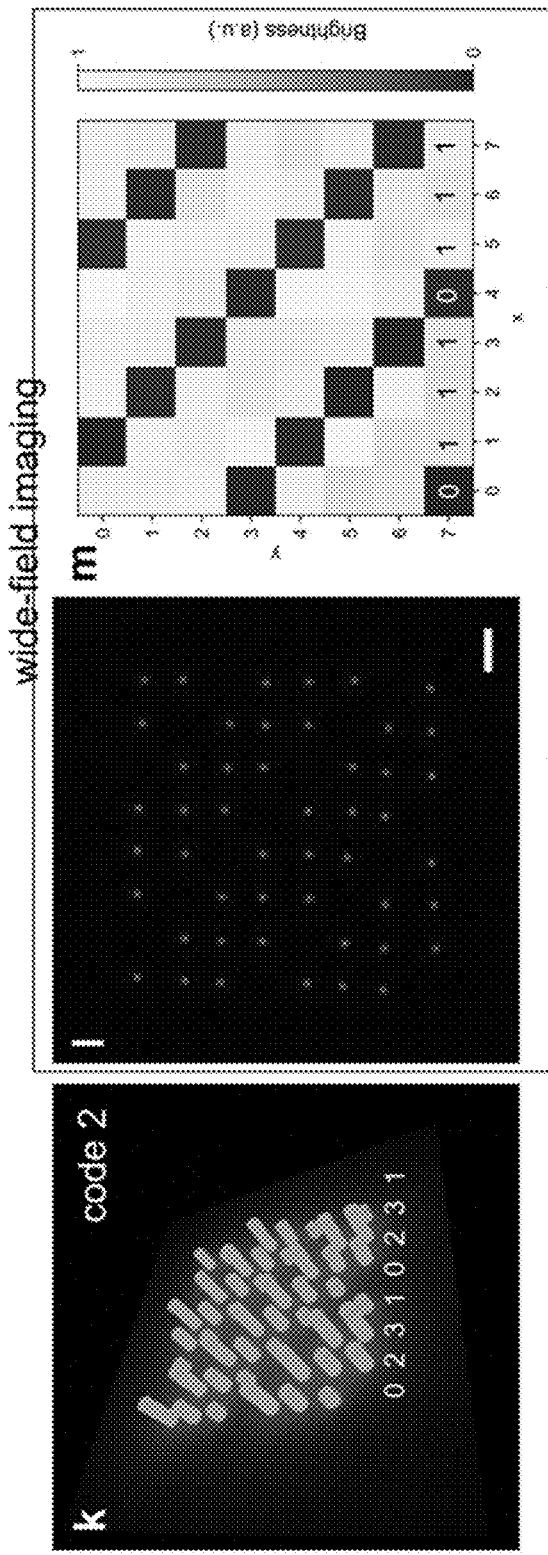
FIG. 4K
FIG. 4L
FIG. 4M
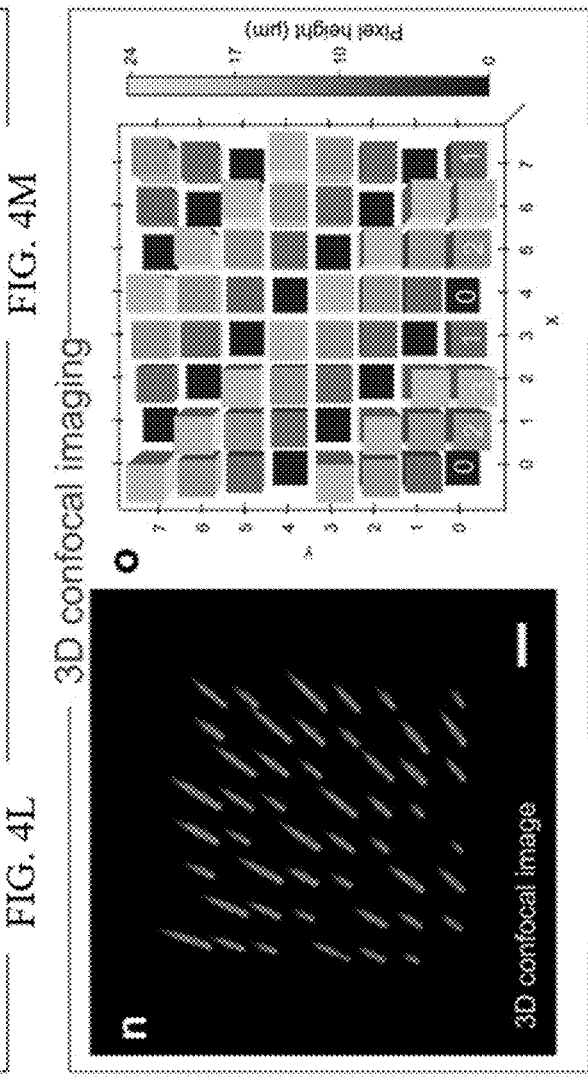
FIG. 4N
FIG. 4O

THREE-DIMENSIONAL PEROVSKITE NANOPIXELS FOR ULTRAHIGH-RESOLUTION COLOR DISPLAYS AND MULTILEVEL ANTI-COUNTERFEITING

BACKGROUND OF THE INVENTION

A pixel is the smallest unit of digital photonics for displaying or storing information and there are continual demands for pixels that are smaller,[1-6] brighter,[7-9] and smarter.[10-12] For guarding access to the information stored in the pixels, appropriate encryption and authentication techniques are required to overcome the global issue of counterfeiting.[13-15] Extensive research on material, fabrication methods and device architecture has been undertaken to develop pixels meeting these challenges for advanced applications.[16-18]

Among the proposed materials, hybrid perovskites show great potentials for full-color display applications, thanks to their excellent optoelectronic properties such as strong,[19-21] tunable,[8,12,22-24] and high-color-purity photoluminescence and electroluminescence,[25-27] which can be obtained at low cost by a low temperature solution process.[28] In contrast, achieving both high performance and low fabrication cost is still challenging for other materials commonly used for display applications, such as inorganic iii-v semiconductors, colloidal quantum dots, and organic molecules/polymers.

The excellent solution processability of hybrid perovskites enables direct printing of color pixels onto large-area substrates via inkjet printing or electrohydrodynamic jet printing methods.[29-31] The printed pixels, however, suffer from coarse spatial resolution ranging from a few micrometers to tens of micrometers, which is much larger than the diffraction limit of their emitted light.

More sophisticated methods, such as electron beam lithography,[32,33] photolithography,[34-36] and nanoimprinting,[37,38] have been developed to prepare micropatterns and nano-patterns of perovskites.[39] Nevertheless, these fabrication techniques are limited to production of low-aspect-ratio thin-film pixels whose emission brightness is significantly decreased due to the reduction in sizes.[9,40,41]

Other fabrication methods such as physical vapor deposition have also been investigated to produce out-of-plane perovskite structures. Nonetheless, the technological challenges associated with precise control of perovskite dimensions, placements, and chemical compositions remain unresolved for these methods.[42-44]

BRIEF SUMMARY OF THE INVENTION

There continues to be a need in the art for improved designs and techniques for on-demand fabrication of bright nanopixels for ultrahigh-resolution color displays.

Embodiments of the subject invention pertain to methods and systems preparing freestanding hybrid perovskite nanopixels with programmed colors, dimensions, and placements by femtoliter meniscus-guided crystallization processes.

According to an embodiment of the subject invention, a method for preparing three-dimensional perovskite nanopixels of a digital display comprises preparing precursor ink by mixing methylammonium halide and lead halide at a certain volume ratio and adding them into another mixture; stirring the precursor ink for a period of time at a certain temperature; adding the precursor ink into a nanopipette; placing the nanopipette with the precursor ink above a silicon (Si) substrate and apart from the Si substrate by a certain distance; configuring the nanopipette to come into contact with the Si substrate such that a portion of the precursor ink having an interface surface of a shape of a meniscus is formed between the nanopipette and the Si substrate; performing rapid evaporation of the portion of the precursor ink to facilitate crystallization of perovskite in the portion of the precursor ink; moving the nanopipette upwardly at a constant speed such that the crystallization of perovskite proceeds upwardly; and abruptly moving the nanopipette at a speed higher than the constant speed such that the crystallization of perovskite is terminated to generate a freestanding nanopixel with a desired height for emitting light. The methylammonium halide may comprise at least one of $CH_3NH_3I$, $CH_3NH_3Br$, and $CH_3NH_3Cl$ and the lead halide may comprise at least one of $PbI_2$, $PbBr_2$, and $PbCl_2$. The another mixture may comprise N,N-dimethylformamide (DMF) and dimethyl sulfoxide (DMSO). Moreover, the volume ratio of the methylammonium halide and the lead halide is 1:1. The stirring the precursor ink is carried out for about two hours and at about 60° C. The nanopipette may have an aperture with a size of about 600 nm. Furthermore, the adding the precursor ink into the nanopipette is carried out at room temperature and at a relative humidity of about 10%. The nanopipette with the precursor ink is spaced apart from the Si substrate by a distance in a range between 0.1 μm and 10 μm. The portion of the precursor ink having an interface surface of a shape of a meniscus may have a volume in a range between 0.1 femtoliter and 9.9 femtoliter. The rapid evaporation of the portion of the precursor ink is performed at a certain evaporate rate. When the methylammonium halide comprises $CH_3NH_3I$ and the lead halide comprises $PbI_2$, the freestanding nanopixel generated emits light of a red color. When the methylammonium halide comprises $CH_3NH_3Br$ and the lead halide comprises $PbBr_2$, the freestanding nanopixel generated emits light of a green color. When the methylammonium halide comprises $CH_3NH_3Cl$ and the lead halide comprises $PbCl_2$, the freestanding nanopixel generated emits light of a blue color. The moving the nanopipette at a constant speed may be carried out at a speed of 5 μm/s and the abruptly moving the nanopipette at a speed higher than the constant speed may be carried out at the higher speed equal to 100 μm/s. The method may further comprise controlling a size of a cross-sectional area of the nanopixel by varying size of the aperture of nanopipette or by varying the constant moving speed of the nanopipette.

In certain embodiments of the subject invention, a digital display device comprising a plurality of three-dimensional perovskite nanopixels prepared according to the method of discussed above is provided.

In other embodiments of the subject invention, a digital anti-counterfeiting system comprising a plurality of three-dimensional perovskite nanopixels prepared according to the method discussed above and at least one band-pass filter is provided.

BRIEF DESCRIPTION OF THE DRAWINGS

FIGS. 1D-1G show corresponding energy dispersive X-ray spectroscopy images of chemical compositions of the three nanopixels of FIG. 1C, wherein FIG. 1D shows a corresponding energy dispersive X-ray spectroscopy image of lead of the three nanopixels, wherein FIG. 1E shows a corresponding energy dispersive X-ray spectroscopy image of iodide of the three nanopixels, wherein FIG. 1F shows a corresponding energy dispersive X-ray spectroscopy image of bromide of the three nanopixels, wherein FIG. 1G shows a corresponding energy dispersive X-ray spectroscopy image of chloride of the three nanopixels, and wherein the scale bar has a length of 2 μm in FIGS. 1D-1G, according to an embodiment of the subject invention.

FIG. 4F shows an image of a schematic design of code 1 (2-bit, 8×8) 3D matrix code comprising G perovskite nanopixels with four different heights, according to an embodiment of the subject invention.

FIG. 4G shows a wide-field PL image of the 3D-printed matrix code 1 of FIG. 4F, wherein the scale bar has a length of 5 µm, according to an embodiment of the subject invention.

FIG. 4H shows the corresponding binary information of the 3D-printed matrix code 1 of FIG. 4G, according to an embodiment of the subject invention.

FIG. 4I shows a schematic representation of the 3D-printed code decrypted via 3D confocal PL imaging, wherein the scale bar has a length of 5 µm, according to an embodiment of the subject invention.

FIG. 4J shows a schematic representation of the decrypted 3D information, according to an embodiment of the subject invention.

FIG. 4K shows a schematic design of code 2 having a first row encrypting "02310231," which is a code different from code 1, according to an embodiment of the subject invention.

FIG. 4L shows a wide-field PL image of the 3D-printed code 2, wherein the scale bar has a length of 5 µm, according to an embodiment of the subject invention.

FIG. 4M shows the corresponding binary information of the 3D-printed code 2, according to an embodiment of the subject invention.

FIG. 4N shows a corresponding 3D confocal PL image of the 3D-printed code 2, wherein the scale bar has a length of 5 µm, according to an embodiment of the subject invention.

FIG. 4O shows acquired 3D information of the 3D-printed code 2, according to an embodiment of the subject invention.

(FIG. 7C) nanopixel printing by a nanopipette with an aperture size of 1200 nm; wherein the optical micrographs of the first and second rows show the meniscus-guided 3D printing processes and the FE-SEM images of the third row show the printed perovskite nanopixels; and wherein the printing processes of FIGS. 7A-7C are performed at room temperature and relative humidity of 10% and at a constant printing speed of 5 µm/s, according to an embodiment of the subject invention.

(FIGS. 14A and 14B) FE-SEM images; (FIG. 14C) a side view optical image, and (FIG. 14D) a bottom view optical image, according to an embodiment of the subject invention.

(FIGS. 18A-18D) side view optical images of an array of nanopixels with different pitches of (FIG. 18A) 9.5 µm, (FIG. 18B) 6.3 µm, (FIG. 18C) 3.2 µm, and (FIG. 18D) 1.6 µm; (FIG. 18E) a side view FE-SEM image of two nanopixels having a pitch of about 1.2 µm, of which no nanopixel overlap occurs, (FIG. 18F) a side view FE-SEM image of two nanopixels with a pitch of about 0.8 µm, wherein the feet of these two nanopixels are overlapped, and (FIG. 18G) an array of high-density nanopixels with a pitch of about 1.3 µm, according to an embodiment of the subject invention.

DETAILED DISCLOSURE OF THE INVENTION

Embodiments of the subject invention are directed to methods and systems for preparing meniscus-guided 3D printing of freestanding perovskite nanopixels with programmed colors, dimensions, and placements.

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not prelude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention pertains. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

When the term "about" is used herein, in conjunction with a numerical value, it is understood that the value can be in a range of 90% of the value to 110% of the value, i.e. the value can be +/−10% of the stated value. For example, "about 1 kg" means from 0.90 kg to 1.1 kg.

In describing the invention, it will be understood that a number of techniques and steps are disclosed. Each of these has individual benefits and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Figure 1A:
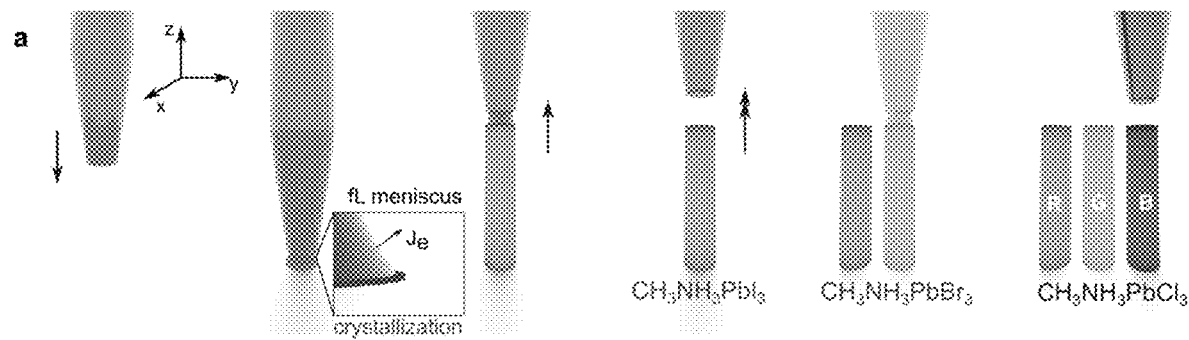
FIG. 1A is a schematic representation of the meniscus-guided crystallization process for the 3D printing of perovskites, the process comprising (i) preparation of a nanopipette filled with a precursor ink, (ii) meniscus formation by pipette-substrate contact, (iii) meniscus-guided perovskite crystallization by upward movement of the pipette, and (iv) termination of crystallization by abruptly increasing the speed of pipette movement, wherein fL stands for femtoliter, according to an embodiment of the subject invention.

Referring to FIG. 1A, the 3D perovskite printing method based on meniscus-guided crystallization comprises the steps of: preparation of a nanopipette filled with a precursor ink, meniscus formation at interface surface between the nanopipette and a silicon (Si) substrate, meniscus-guided perovskite crystallization by upward movement of the nanopipette, and termination of the crystallization by abruptly increasing the speed of nanopipette movement.

The meniscus formed at the interface surface between the nanopipette and the Si substrate comprises the precursor ink of a volume of a few femtoliters to confine and guide solution-mediated evaporation-driven crystallization in mid-air, thereby enabling nanoscale 3D printing of nanopixels.

In one embodiment, for printing nanopixels emitting lights of colors of red (R), green (G), and blue (B), the precursor inks are prepared by mixing methylammonium halide and lead halide at a certain volume ratio and then adding them into a N,N-dimethylformamide (DMF) and dimethyl sulfoxide (DMSO) mixture. The mixture of N,N-dimethylformamide (DMF) and dimethyl sulfoxide (DMSO) may have any suitable volume ratio.

In other embodiments, for printing nanopixels emitting lights of colors of red (R), green (G), and blue (B), the precursor inks can be prepared by mixing methylammonium halide and lead halide at a certain volume ratio and then adding them into one of diverse selection of solvents including dimethylacetamide (DMAC), N-methyl-2-pyrrolidone (NMP), 1,3-dimethyl-2-imidazolidinone (DMI), gamma-butyrolactone (GBL), tetrahydrofuran (THF), and 1,3-dimethyl-3,4,5,6-tetrahydro-2(1H)-pyrimidinone (DMPU) for the perovskite material.

In one embodiment, the methylammonium halide and the lead halide are mixed at a volume ratio of about 1:1.

In one embodiment, the mixture of methylammonium halide and the lead halide has a weight percentage of about 40 wt %.

In one embodiment, when the methylammonium halide is $CH_3NH_3I$ and the lead halide is $PbI_2$, the freestanding nanopixels fabricated according to the methods of the subject invention emit light of a red color.

In one embodiment, when the methylammonium halide is $CH_3NH_3Br$ and the lead halide is $PbBr_2$, the freestanding nanopixels fabricated according to the methods of the subject invention emit light of a green color.

In one embodiment, when the methylammonium halide is $CH_3NH_3Cl$ and the lead halide is $PbCl_2$, the freestanding nanopixels fabricated according to the methods of the subject invention emit light of a blue color.

Therefore, the 3D perovskite printing method of the subject invention can be utilized to fabricate nanopixels emitting a variety of colors including, but not limited to, red (R), green (G), and blue (B) by preparing the precursor inks with different chemical compositions.

Figure 5A:
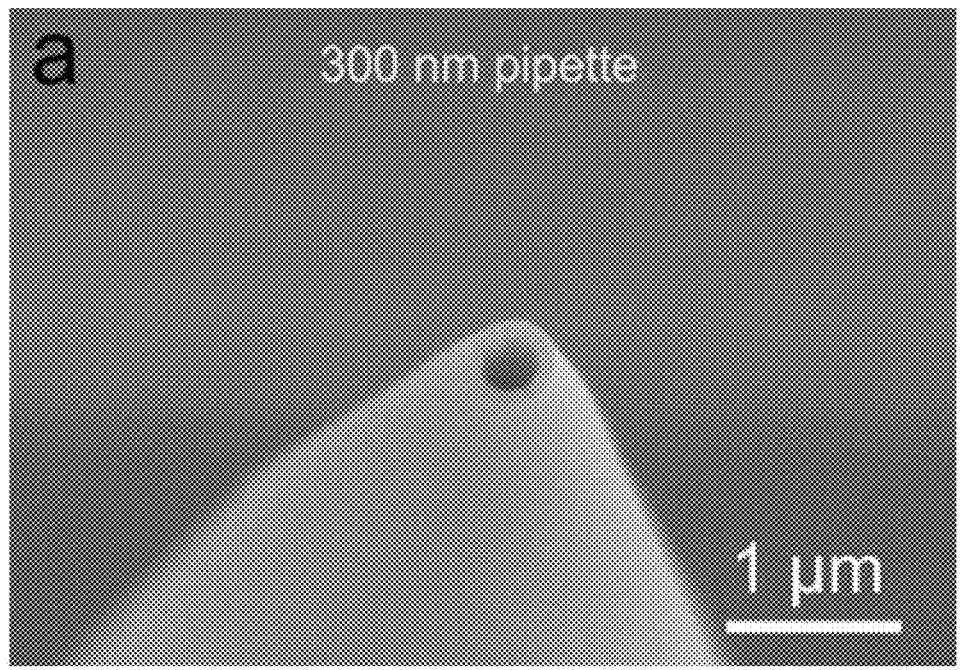
FIGS. 5A-5C show a FE-SEM image of the nanopipettes with different aperture sizes of (FIG. 5A) 300 nm, (FIG. 5B) 600 nm, and (FIG. 5C) 900 nm, according to an embodiment of the subject invention.
Figure 5B:
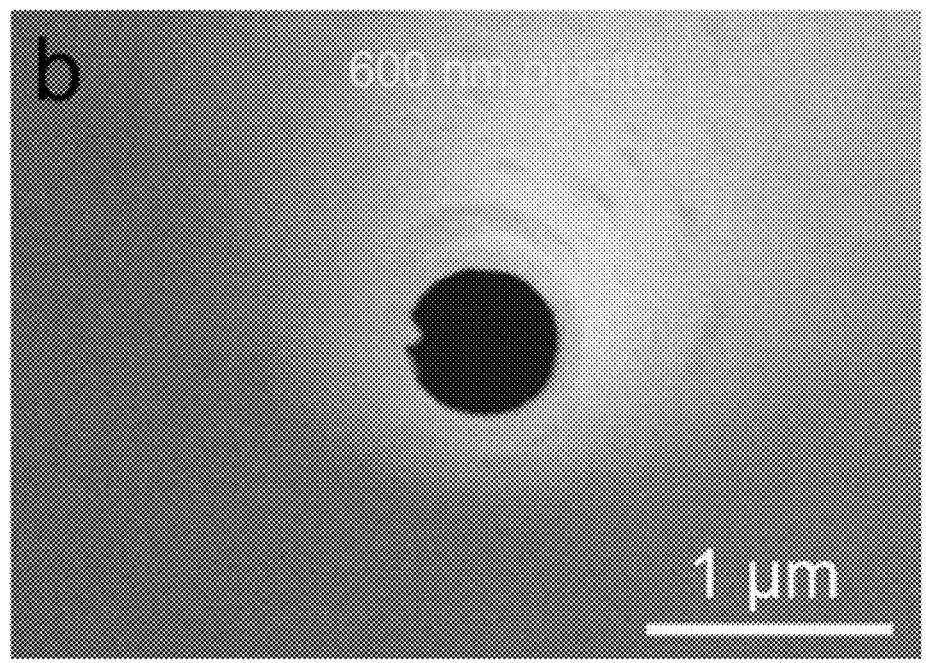
Figure 5C:
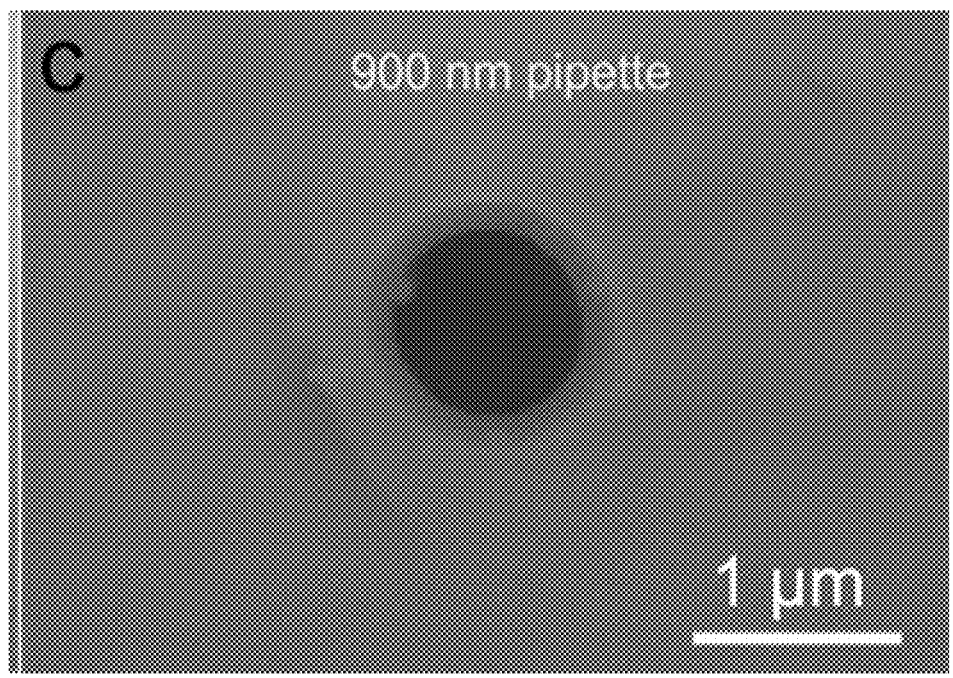

When the preparation of the precursor ink is completed, the precursor ink is stirred, for example, for 2 hours at 60° C., and then added into a nanopipette having an aperture with a size of, for example, 300 nm, 600 nm, or 900 nm as shown in FIGS. 5A-5C, at room temperature and relative humidity of 10%. The nanopipette with the precursor ink is then disposed above a silicon (Si) substrate and apart from the Si substrate by a certain distance, for example, by a few micrometers.

In one embodiment, the nanopipette is a Borosilicate nanopipette (filament embedded; World Precision Instruments) fabricated via a programmed heat-pulling process (P-97 Flaming/Brown Micropipette Puller, Sutter Instrument). The borosilicate nanopipette and the Si substrate are cleaned by ultrasonication for 5 minutes successively with volumes of acetone, isopropyl alcohol, and deionized water.

In one embodiment, the 3D printing setup comprises a glass nanopipette and a Si substrate, which are spatially controlled with submicron precision using a three-axis stepping motorized stage (XA05A, ZA05A, Kohzu Precision).

Next, the nanopipette with the precursor ink is configured to come into contact with the Si substrate such that a portion of the precursor ink having an interface surface of a shape of a meniscus is formed between the nanopipette and the Si substrate. The nanopipette may have an aperture size in a range between about 0.1 μm and tens of m for the printing and the volume of the meniscus may have a range between 10-3 femtoliter and 103 femtoliter. Further, the meniscus volume may have a wider range when the moving upward speed ("pulling speed") of the nanopipette is balanced with the crystallization speed as described below.

In one preferable embodiment, the portion of the precursor ink having an interface surface of a shape of a meniscus has a volume in a range between 0.1 femtoliter and 9.9 femtoliter.

Then, a rapid evaporation of the portion of the precursor ink is performed to facilitate crystallization of perovskite, resulting in the formation of crystals inside the portion of the precursor ink that has the interface surface of the shape of a meniscus. At room temperature (butyl acetate=1), the relative evaporation rates of the DMF and DMSO are 0.17 and 0.026, respectively. Thus, successful printing can be realized with the evaporation rate in a range between 0.026 and 0.17. Further, the evaporation rate may have a wider range when the moving upward speed ("pulling speed") of the nanopipette is well controlled for balancing the solvent evaporation.

Figure 6A:
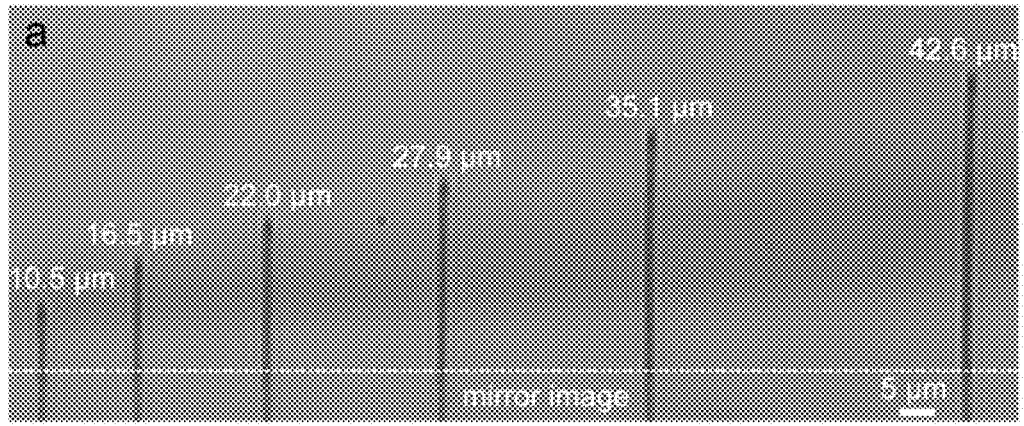
FIGS. 6A and 6B show (FIG. 6A) a side view optical image of the freestanding perovskite nanopixels with increased height from 10.5 µm to 42.6 µm, (FIG. 6B) a side view FE-SEM image of ultra-long perovskite nanopixels with an aspect ratio of about 500, according to an embodiment of the subject invention.
Figure 6B:
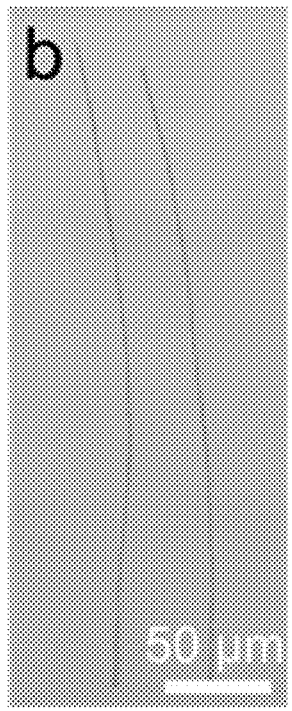

Next, the nanopipette is configured to move upwardly at a constant speed such that the crystallization of perovskite proceeds upwardly, representing the 3D printing process. To generate a freestanding nanopixel with a desired height as shown in FIGS. 6A and 6B, the speed at which the nanopipette moves is configured to increase abruptly such that the printing process is terminated.

Figure 6C:
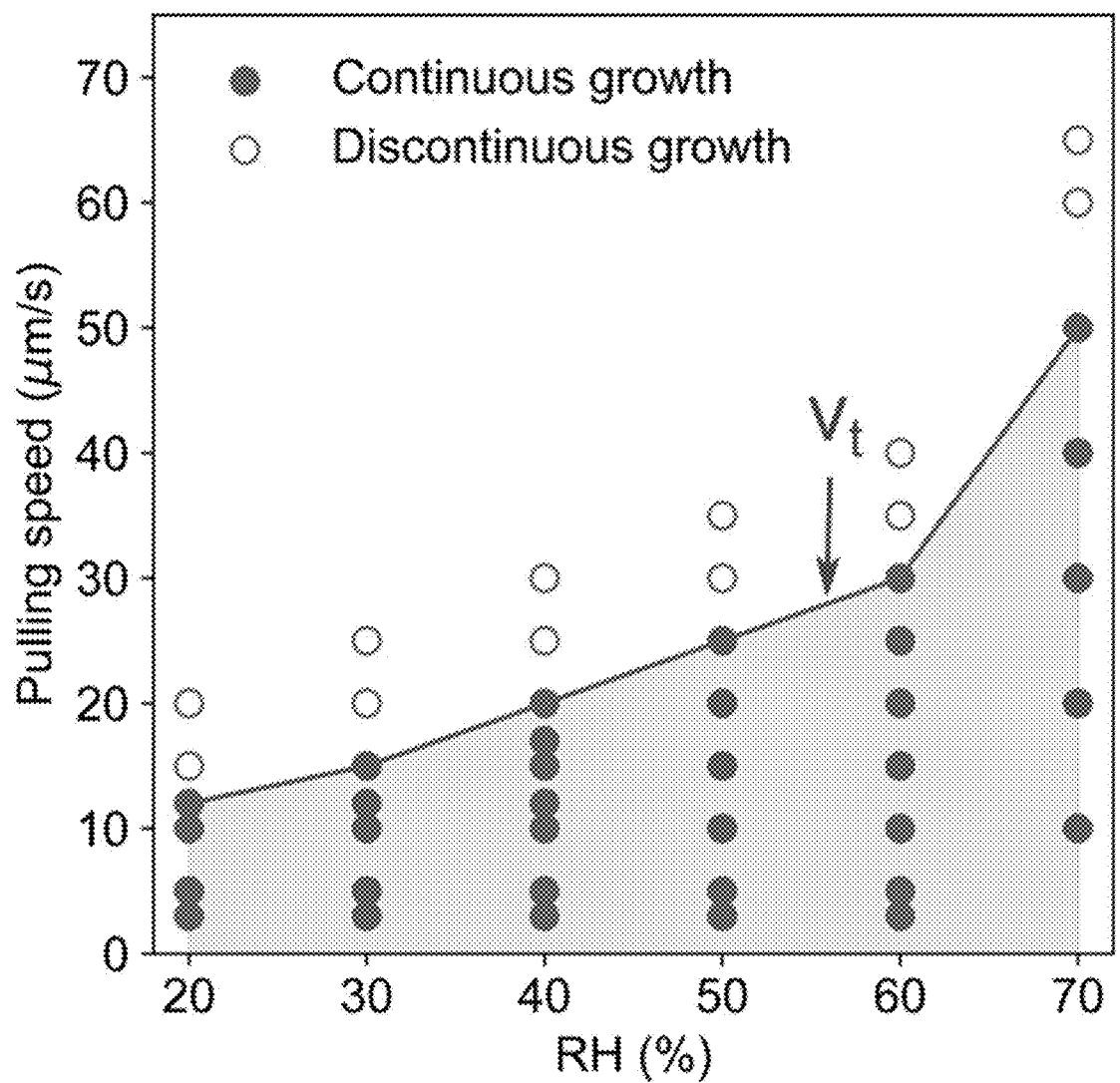
FIG. 6C shows a plot diagram revealing the relationship between the pulling speed of the nanopipette and the relative humidity, according to an embodiment of the subject invention.

There is a threshold for the moving upward speed ("pulling speed") of the nanopipette at which the pulling process is terminated. The threshold speed increases from 12 μm/s to 50 μm/s as relative humidity (RH) increases from 20% to 70% at room temperature, due to accelerated perovskite crystallization by moisture. As a result, the range of constant pulling speed increases from 0-12 μm/s to 0-50 μm/s as RH increases from 20% to 70% at room temperature as shown in FIG. 6C. Moving the nanopipette upwardly at a pulling speed that exceeds the threshold pulling speed terminates the crystallization process. Consequently, a pulling speed greater than 12 μm/s at RH of 20% or greater than 50 μm/s at RH of 70% terminates the crystallization process.

Figure 7A:
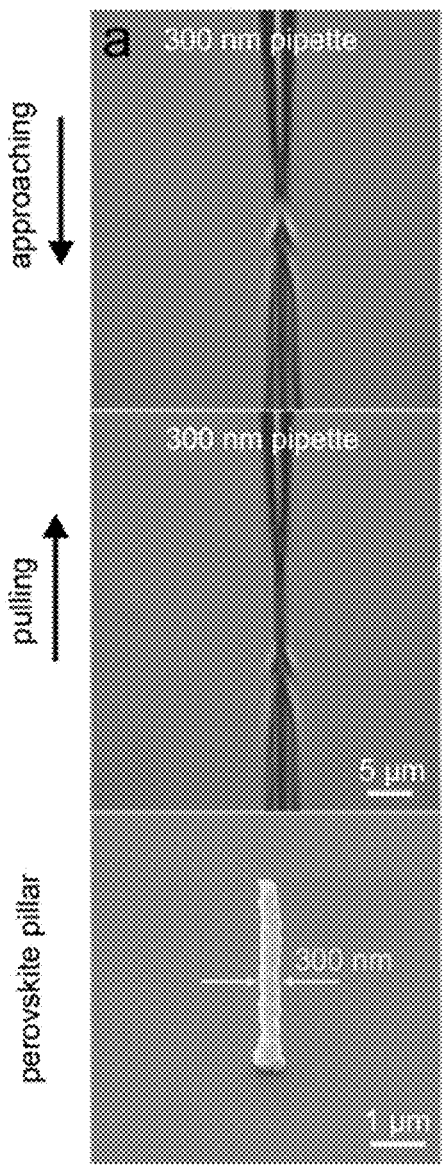
FIGS. 7A-7C show 3D printing processes of nanopixels with different nanopipette sizes, including (FIG. 7a) nanopixel printing by a nanopipette with an aperture size of 300 nm, (FIG. 7B) nanopixel printing by a nanopipette with an aperture size of 600 nm.
Figure 7B:
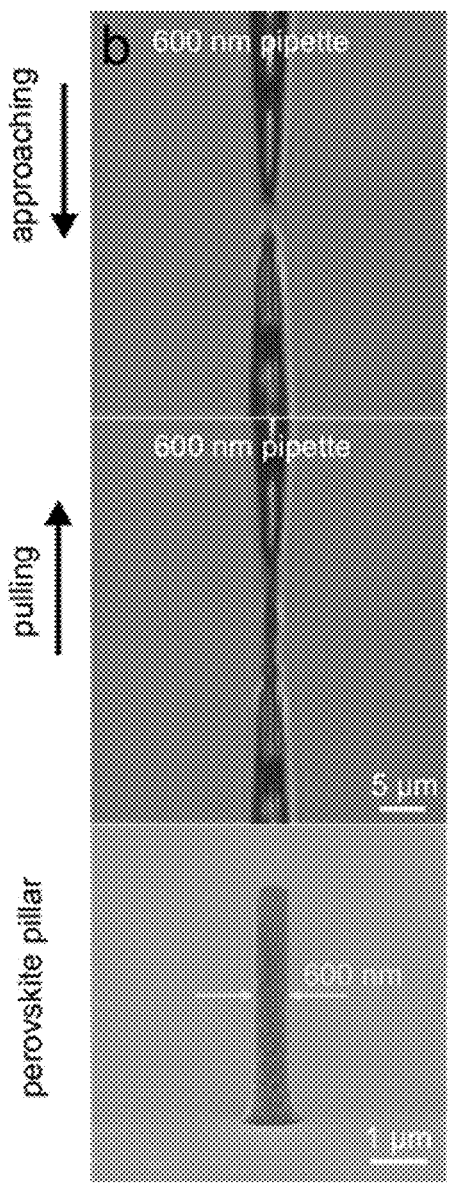
Figure 7C:
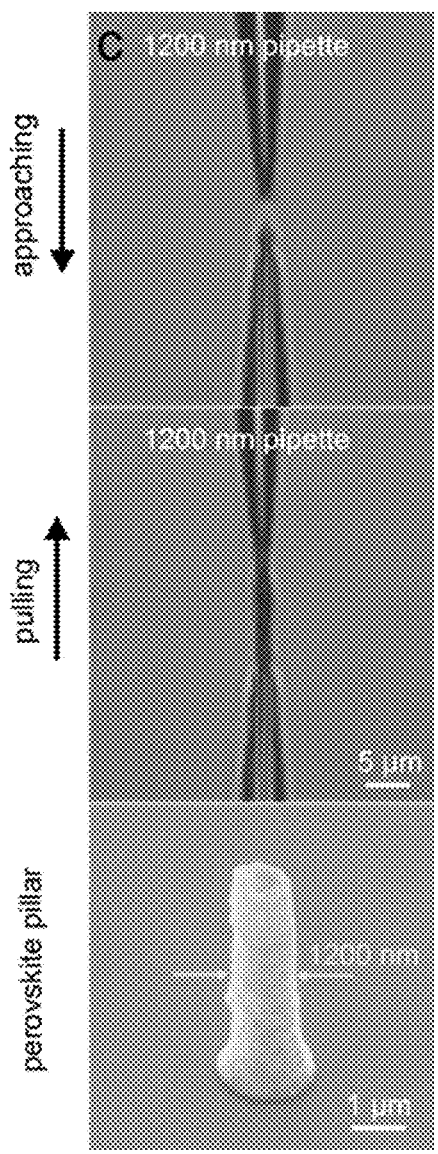
Figure 8:
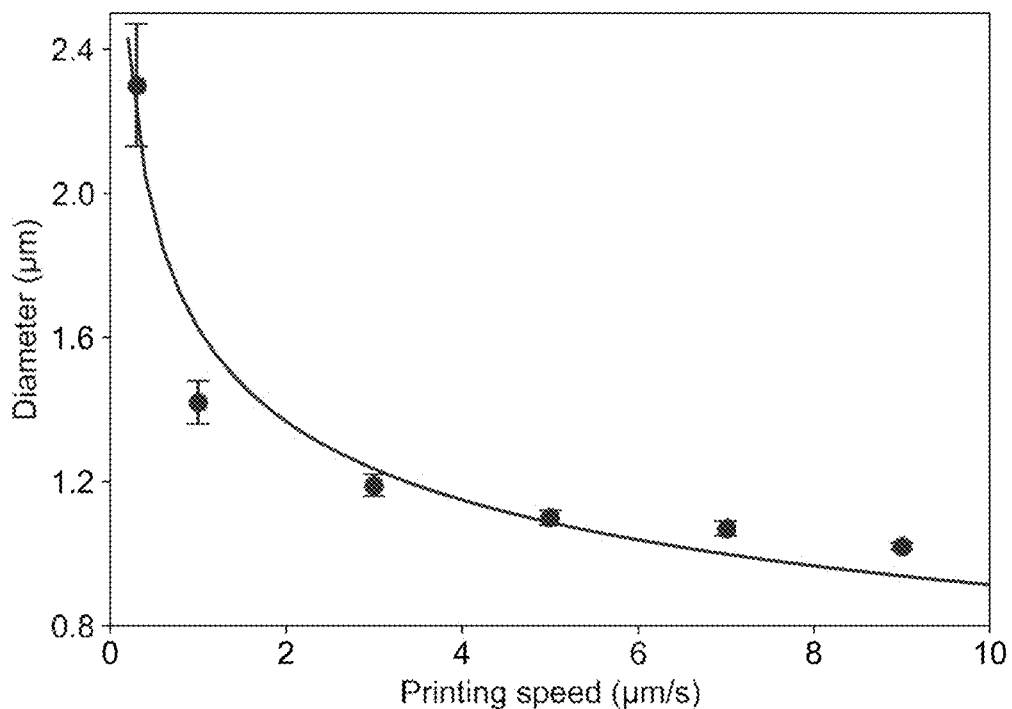
FIG. 8 shows a plot diagram revealing the relationship between the printing diameter d and the printing speed v for a nanopipette having a aperture diameter of about 1 µm, wherein the solid line corresponds to a functional dependence d~v −0.25, according to an embodiment of the subject invention.

The diameter of the nanopixel fabricated according to the method of the subject invention can be controlled by varying the aperture diameter of the nanopipette as shown in FIGS. 7A-7C or by varying the moving speed of the nanopipette in FIG. 8.

Figure 1B:
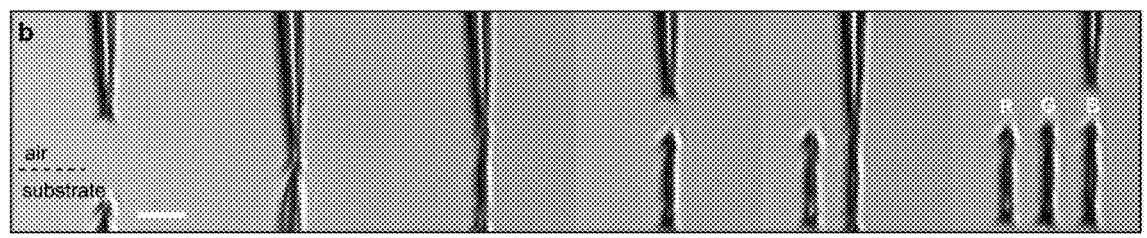
FIG. 1B shows corresponding side view real-time optical micrographs of the printing process of FIG. 1A, wherein the scale bar has a length of 5 μm, according to an embodiment of the subject invention.

The entire 3D perovskite printing process is performed inside a custom-made environmental enclosure filled with nitrogen gas at a controlled relative humidity and temperature and can be monitored in real time by side view optical imaging techniques as illustrated in FIG. 1B.

For the monitoring, a side view optical microscope comprising a 50× long-working-distance objective (Mitutoyo) and a camera equipped with a complementary metal oxide semiconductor sensor (DCC1545M, Thorlabs) are employed. The structure of the as-printed perovskite nanopixels can be examined and characterized by field emission scanning electron microscopy (FE-SEM) (Zeiss Leo 1530).

Moreover, the chemical composition of the nanopixels can be quantitatively analyzed by energy dispersive X-ray spectroscopy (EDS) under a 20-kV electron beam and the optical photoluminescence (PL) images of the perovskite nanopixels can be measured by fluorescence microscopy (Olympus CKX53, filter CKX3-RFA). The PL spectra of the perovskite nanopixels are measured using a micro-PL/Raman spectrometer under laser excitation at a wavelength of 364 nm. Furthermore, confocal imaging can be performed by confocal laser scanning microscopy (Nikon AIR) using a 40× oil-immersion objective lens. ImageJ software (National Institutes of Health, U.S.A.) can be used to reconstitute the 3D images layer-by-layer along the z-axis. Prior to the characterizations, all the fabricated nanowires are annealed at 100° C. for 30 minutes.

Figure 1C:
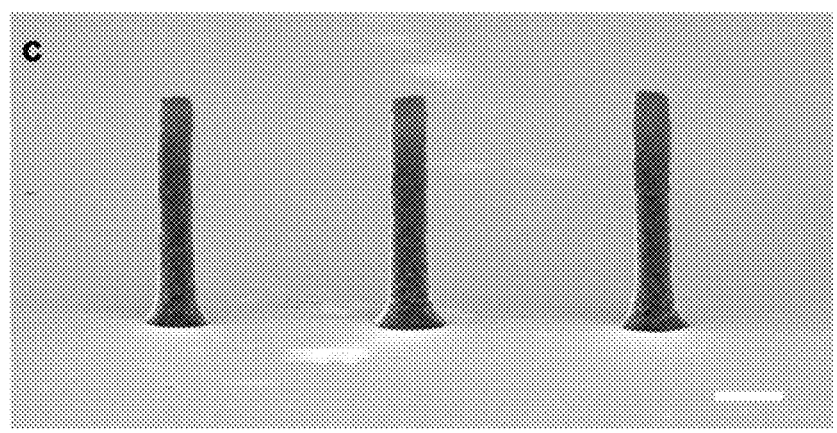
FIG. 1C shows a field emission scanning electron microscopy (FE-SEM) image of as-printed perovskite RGB triple pixels comprising $CH_3NH_3PbI_3$ (R; left), $CH_3NH_3PbBr_3$ (G; middle), and $CH_3NH_3PbCl_3$ (B; right) nanopixels, wherein the scale bar has a length of 1 μm, according to an embodiment of the subject invention.

In FIG. 1C, a FE-SEM image is provided to show exemplary perovskite triple pixels comprising $CH_3NH_3PbI_3$ (R; left), $CH_3NH_3PbBr_3$ (G; middle), and $CH_3NH_3PbCl_3$ (B; right) nanopixels in a form of, for example, a pillar, with uniform dimensions of a diameter of 550 nm, a height of 4.1 μm and a pitch of 5 μm.

Figure 1D:
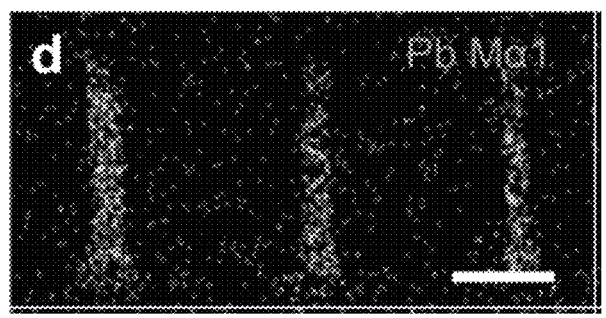
Figure 1E:
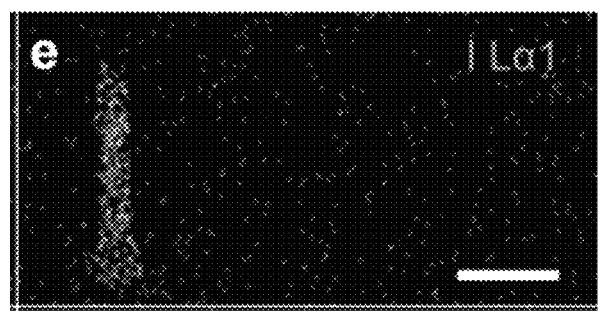
Figure 1F:
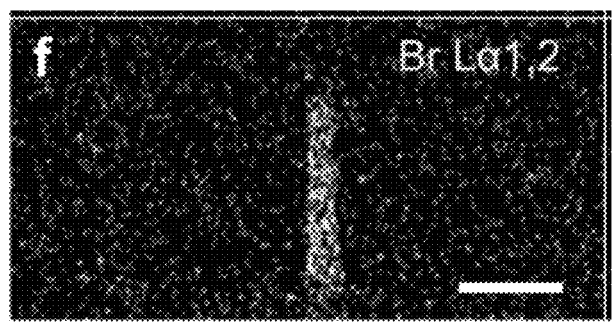
Figure 1G:
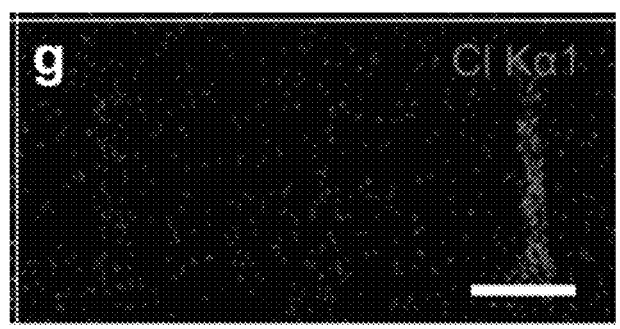

The chemical compositions of the triple pixels are revealed by energy dispersive X-ray spectroscopy (EDS) as shown in FIGS. 1D-1G. In particular, FIG. 1D shows corresponding energy dispersive X-ray spectroscopy images of lead (green) of the tri-pixels uniformly distributed over all three nanopixels; while FIG. 1E shows corresponding energy dispersive X-ray spectroscopy images of iodide (orange) of the triple pixels is well confined in the R nanopixel, FIG. 1F shows corresponding energy dispersive X-ray spectroscopy images of bromide (yellow) of the triple pixels is well confined in the G nanopixel, and FIG. 1G shows corresponding energy dispersive X-ray spectroscopy images of chloride of the triple pixels is well confined in the B nanopixel.

Figure 1H:
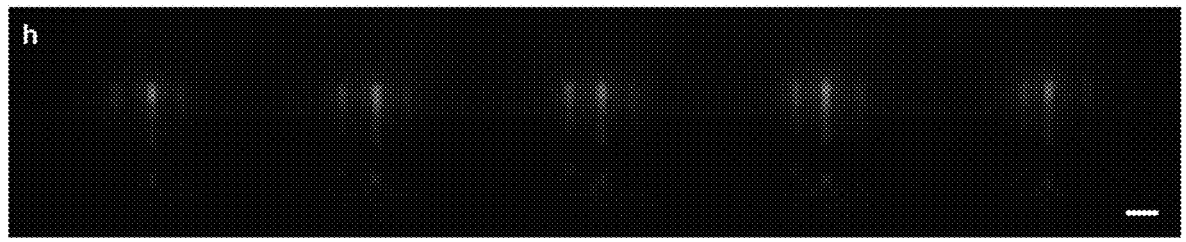
FIG. 1H shows a side view optical photoluminescence image of the array of three nanopixels emitting red light, green light, and blue light, respectively, wherein the scale bar has a length of 5 μm, according to an embodiment of the subject invention.
Figure 9:
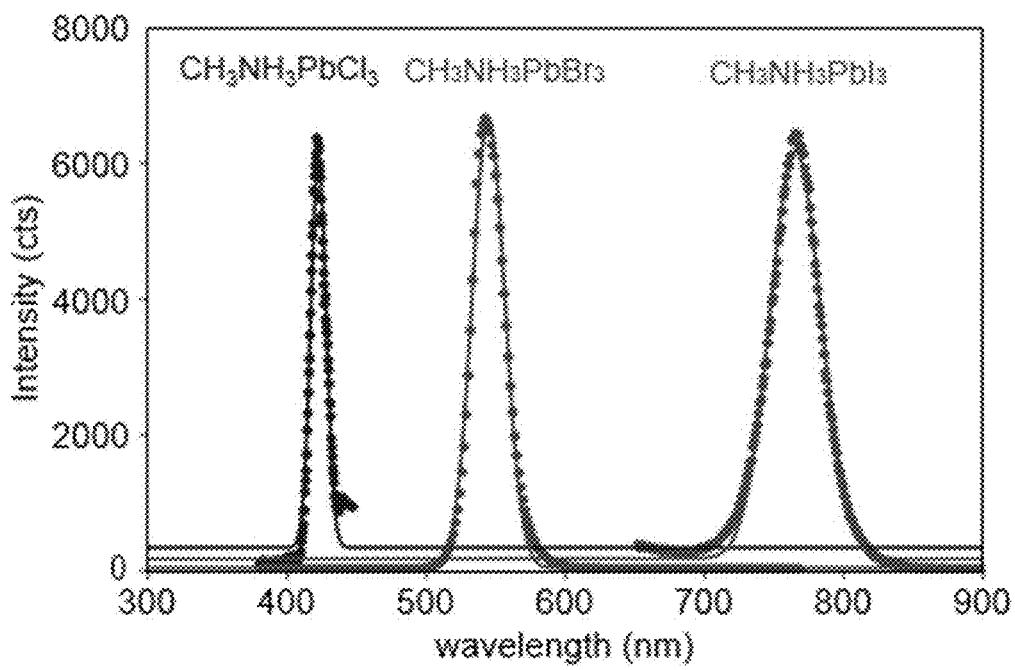
FIG. 9 shows normalized PL spectra of perovskite nanopixels respectively emitting red (R) light, green (G) light, and blue (B) light, demonstrating that emission peaks are centered at 760 nm, 535 nm and 420 nm, respectively, according to an embodiment of the subject invention.
Figure 10A:
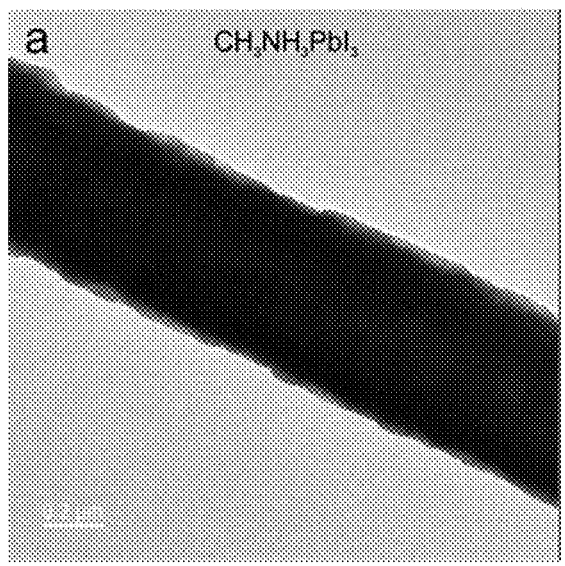
FIGS. 10A-10F show TEM characterization of the perovskite nanopixels, including (FIG. 10A) a bright-field image of $CH_3NH_3PbI_3$ nanopixel (red), (FIG. 10B) a corresponding selected area electron diffraction (SAED) pattern indexed to the tetragonal structure of the $CH_3NH_3PbI_3$ with lattice constants of a=8.800 Å and c=12.685 Å, (FIG. 10C) a bright-field image of $CH_3NH_3PbBr_3$ nanopixel (green), (FIG. 10D) a corresponding selected SAED pattern indexed to the cubic structure of $CH_3NH_3PbBr_3$ with lattice constants of a=5.900 Å, (FIG. 10E) a bright-field image of $CH_3NH_3PbCl_3$ nanopixel (blue), and (FIG. 10F) a corresponding selected SAED pattern indexed to the cubic structure of $CH_3NH_3PbCl_3$ with lattice constants of a=5.670 Å; wherein the printing is performed at room temperature and relative humidity 10% and at a constant printing speed of 5 µm/s, according to an embodiment of the subject invention.
Figure 10B:
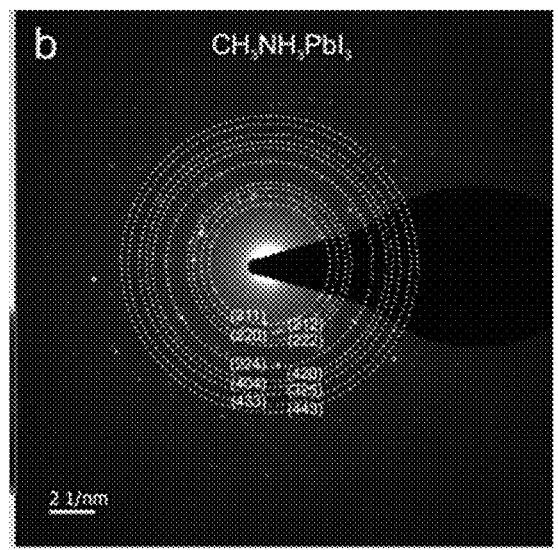
Figure 10C:
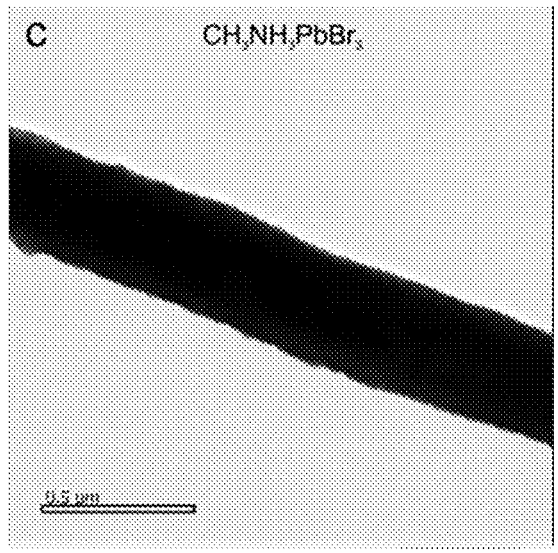
Figure 10D:
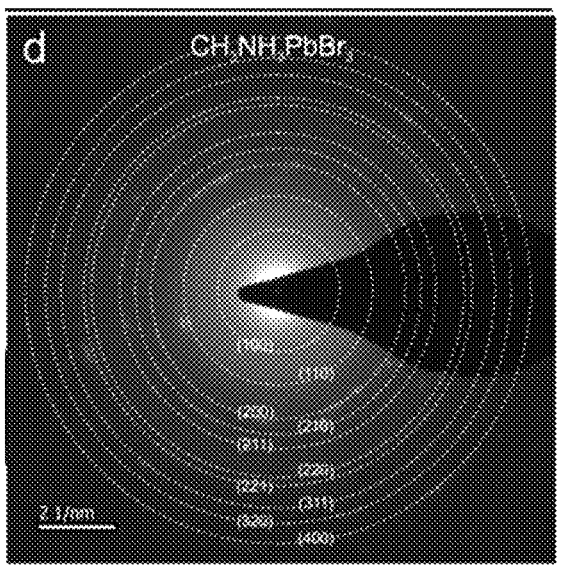
Figure 10E:
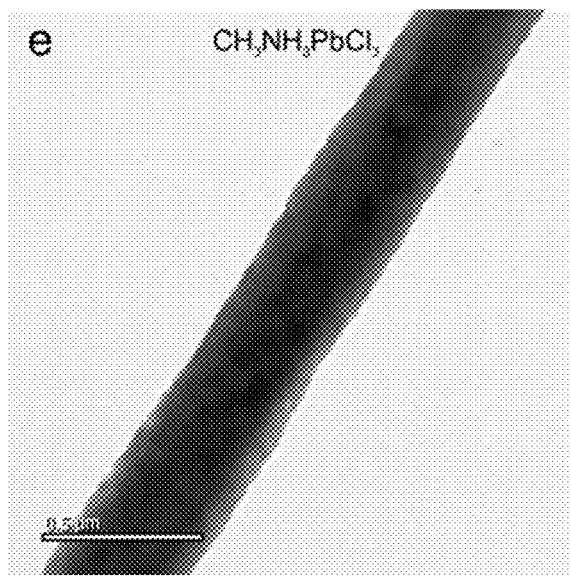
Figure 10F:
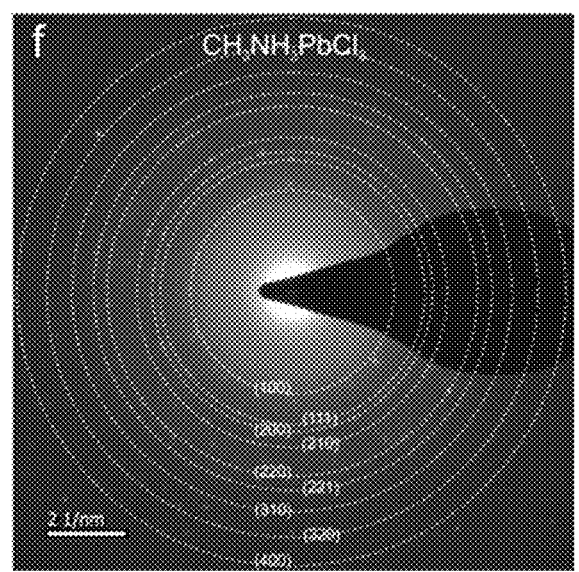
Figure 11A:
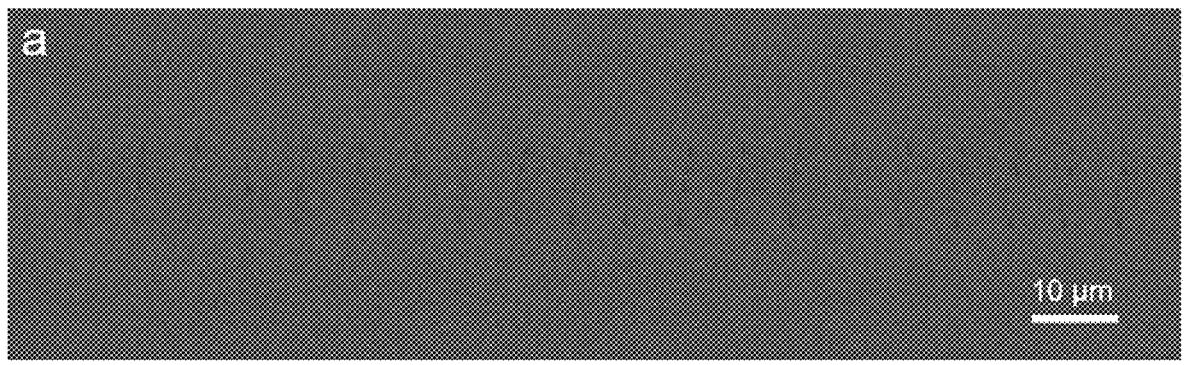
FIGS. 11A and 11B show FE-SEM images of 100 freestanding perovskite nanopixels, including (FIG. 11A) a 45°-tilted view FE-SEM image, and (FIG. 11B) a top-view FE-SEM image, according to an embodiment of the subject invention.
Figure 11B:
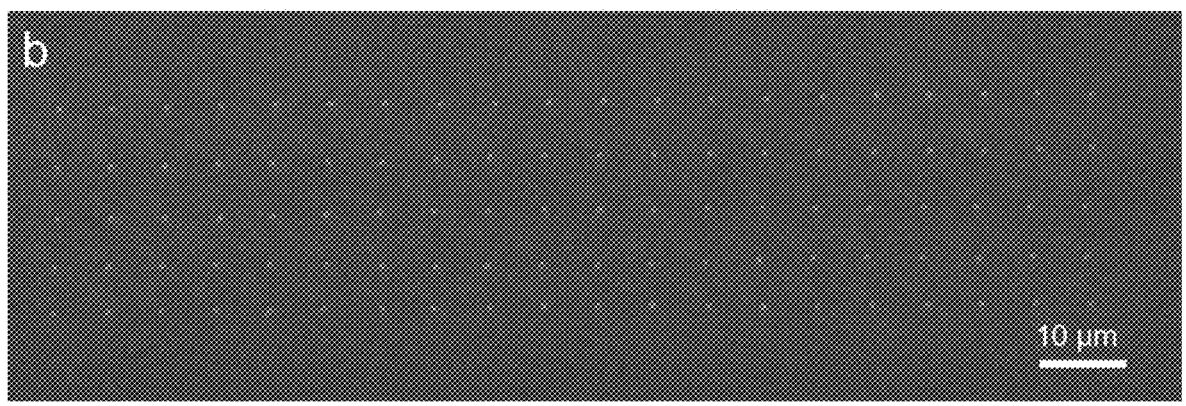
Figure 12A:
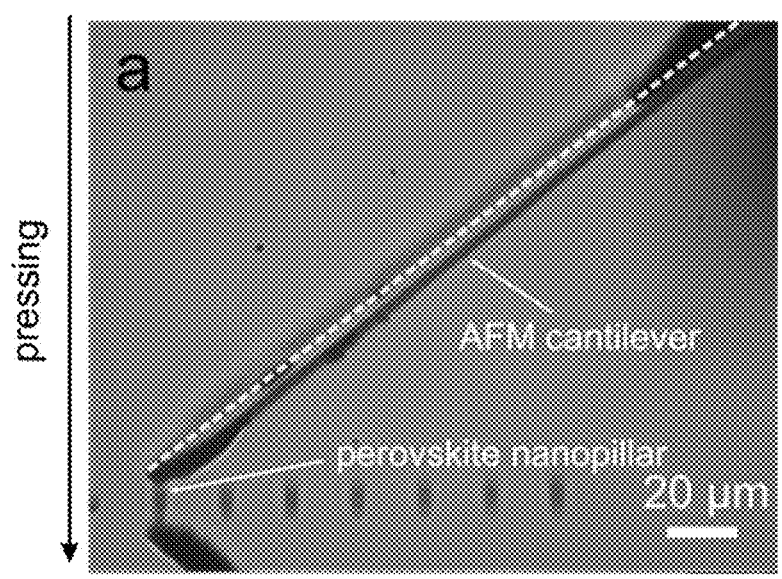
FIGS. 12A-12F show results of compression tests of the perovskite nanopixels, including (FIGS. 12A-12C) a series of side view optical micrographs demonstrating the compression process with aid of an AFM cantilever, wherein (FIG. 12A) the AFM cantilever with a length of about 175 µm and a spring constant of 3 N/m is placed a few micrometers away from a nanopixel having a diameter about 600 nm and a height about 5 µm which exceeds the saturation height of the nanopixel, wherein the dashed yellow line denotes the cantilever axis direction; wherein (FIG. 12B) the AFM cantilever contacts the nanopixel; wherein (FIG. 12C) the AFM cantilever compresses the nanopixel; wherein the red line denotes the axis direction of the bent cantilever; wherein the compressive force F acting on the nanopixel is estimated to be 27.5 µN; wherein (FIGS. 12D-12F) shows the recovery process by which both the cantilever and the perovskite nanopixel are restored to their original shapes, according to an embodiment of the subject invention.
Figure 12B:
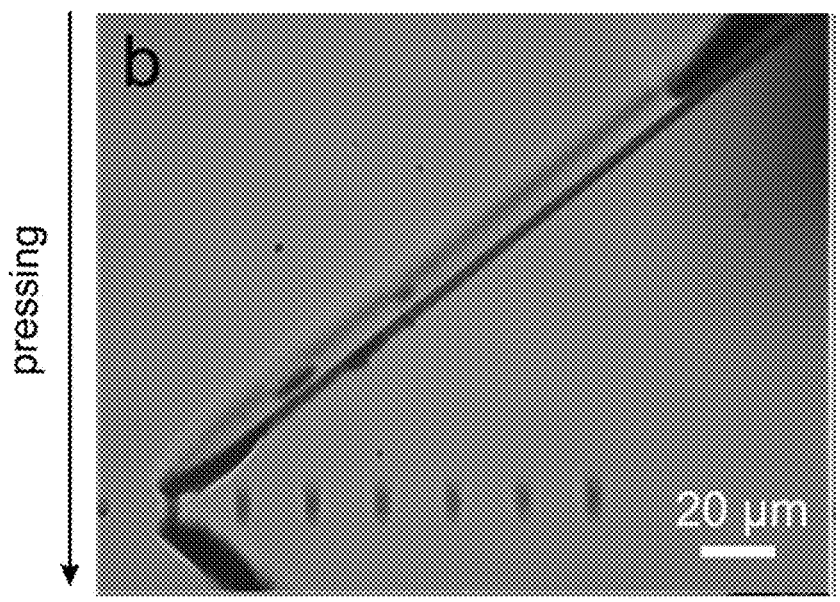
Figure 12C:
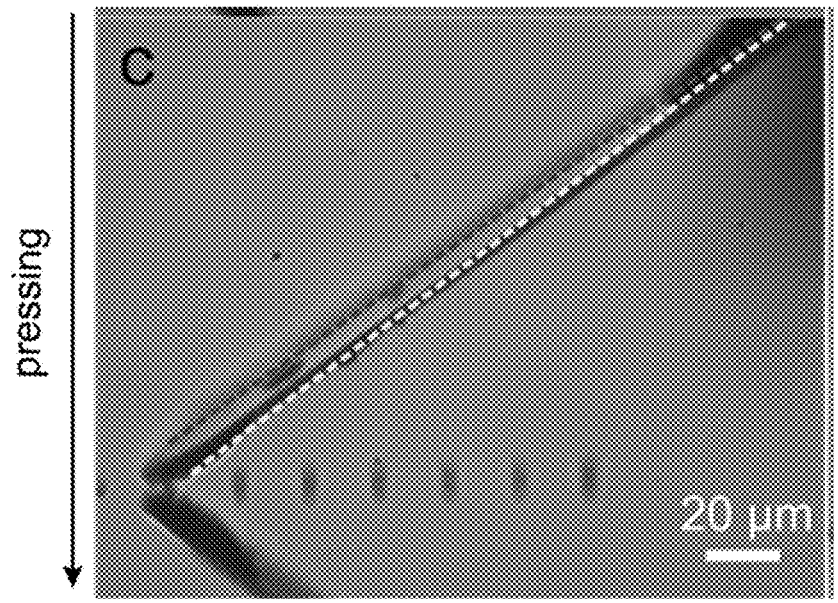
Figure 12D:
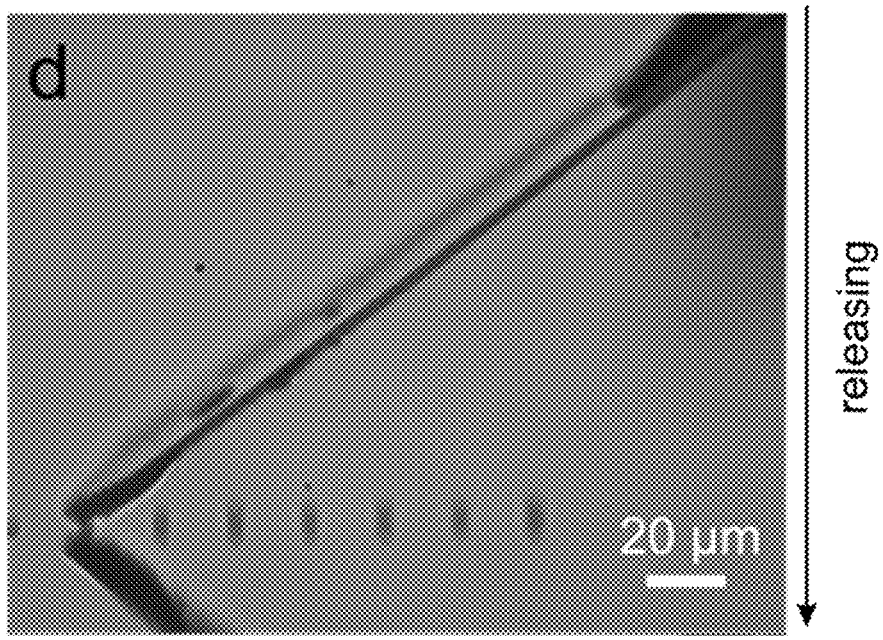
Figure 12E:
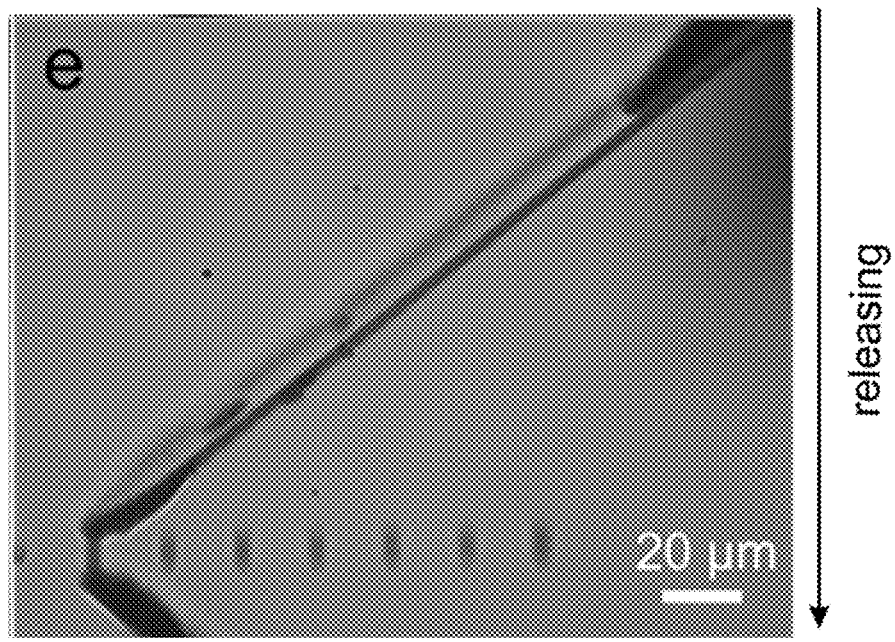
Figure 12F:
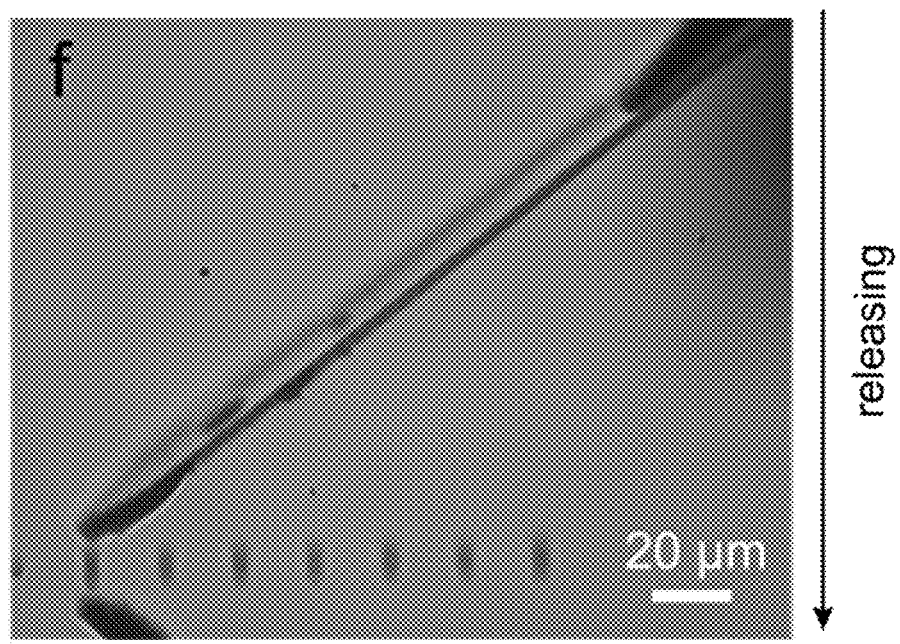
Figure 13A:
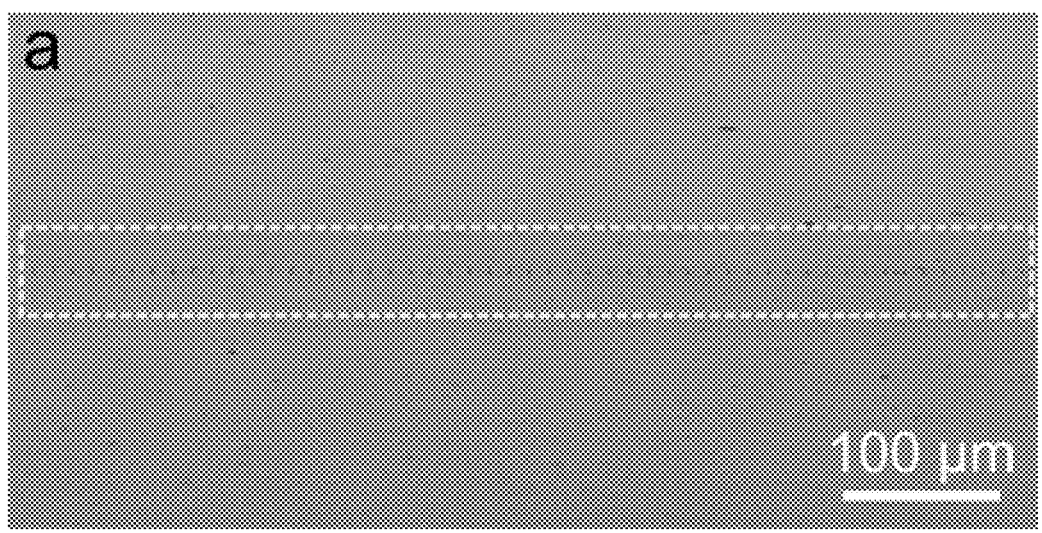
FIGS. 13A-13G show adhesion of perovskite nanopixels under substrate bending, including (FIG. 13A) a 45°-tilt-view FE-SEM image of an array of perovskite nanopixels on a flat and flexible ITO substrate, (FIG. 13B) a 45°-tilt-view FE-SEM image of a freestanding perovskite nanopixel on the ITO substrate, (FIG. 13C) an optical image of the bent ITO substrate after a 500-cycle bending test, (FIG. 13D) the corresponding FE-SEM image, (FIG. 13E) a crack passes under the nanopixel after bending, (FIG. 13F) a 45°-tilt-view FE-SEM image of an array of perovskite nanopixels on the bent ITO substrate, and (FIG. 13G) a 45°-tilt-view FE-SEM image showing a crack occurs near the nanopixel at about a distance of about 1 µm, according to an embodiment of the subject invention.
Figure 13B:
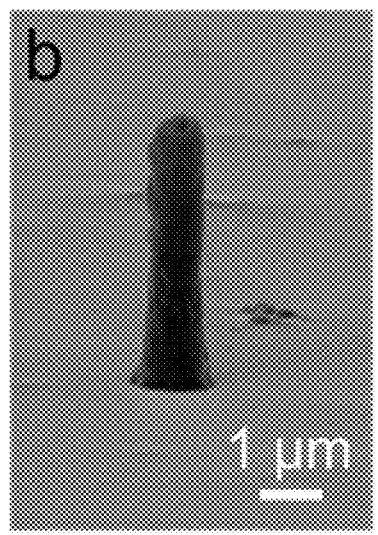
Figure 13C:
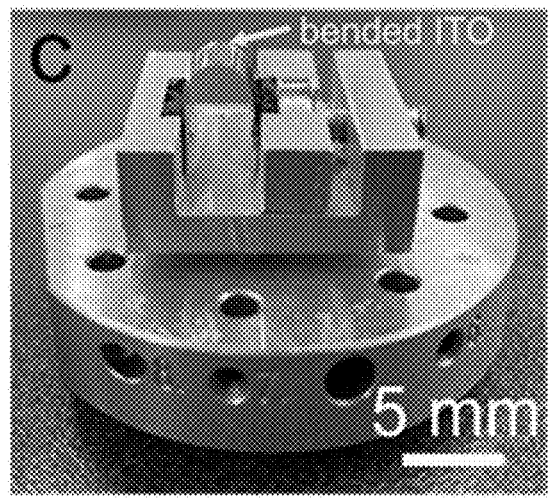
Figure 13D:
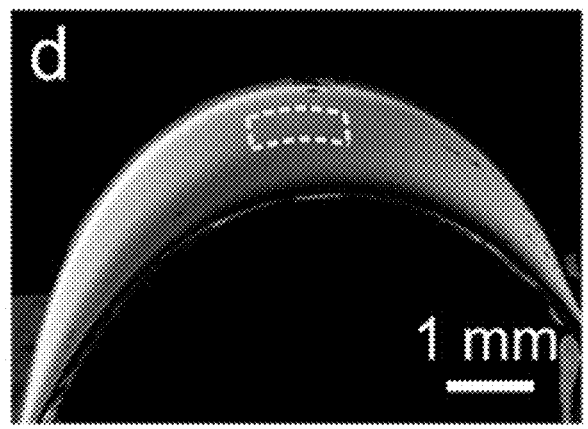
Figure 13E:
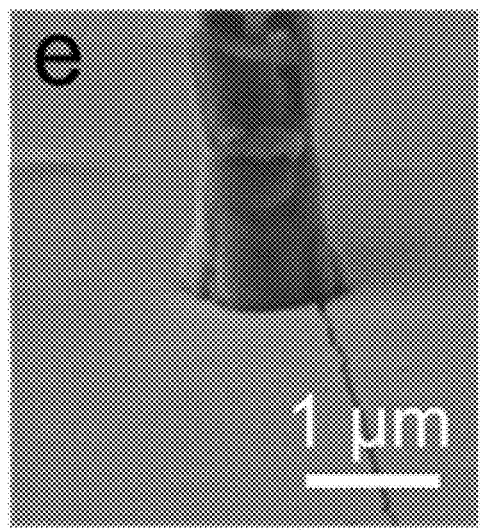
Figure 13F:
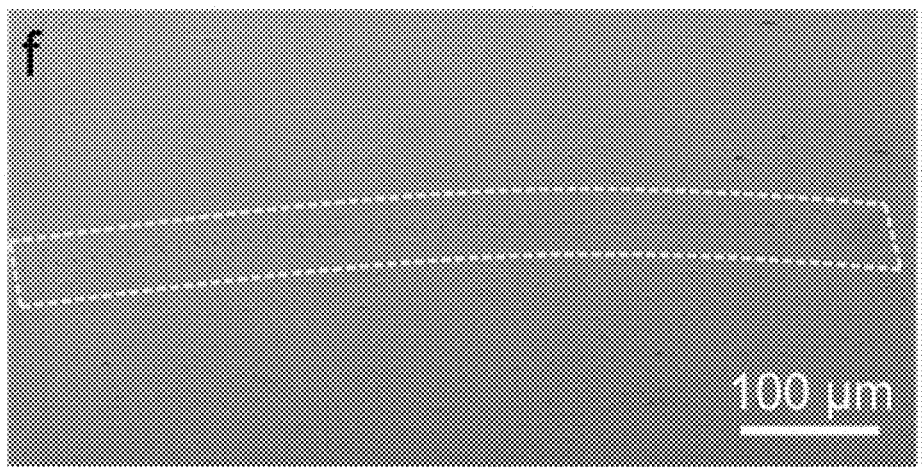
Figure 13G:
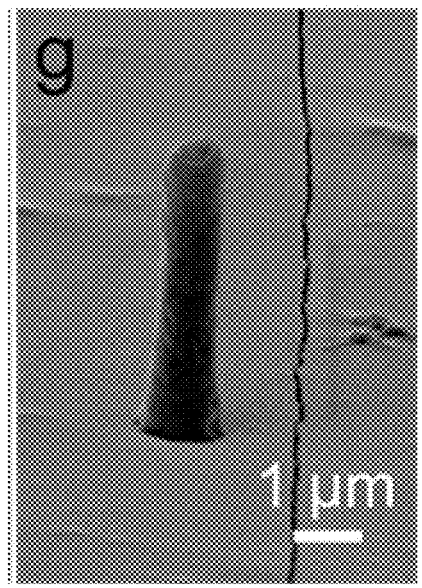
Figure 14A:
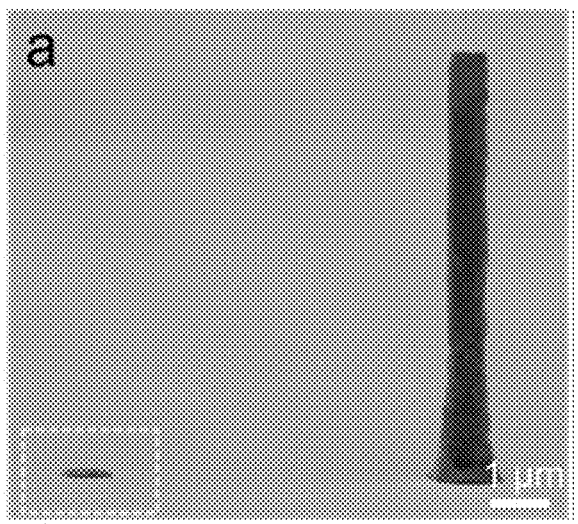
FIGS. 14A-14D show difference in brightness between a 2D dot and a 3D saturated nanopixel, including.
Figure 14B:
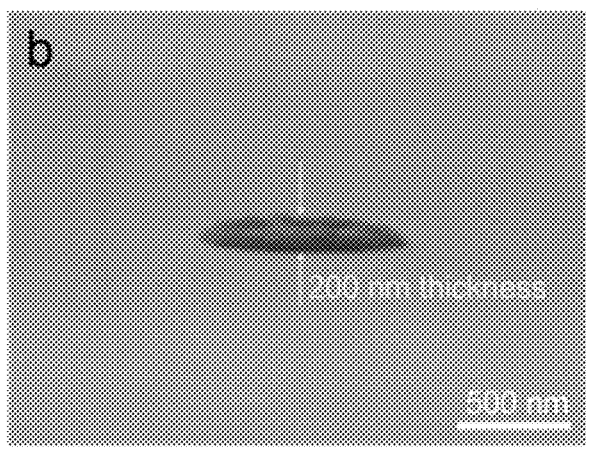
Figure 14C:
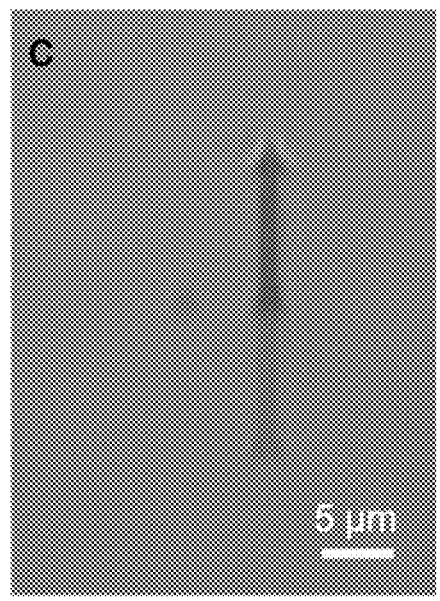
Figure 14D:
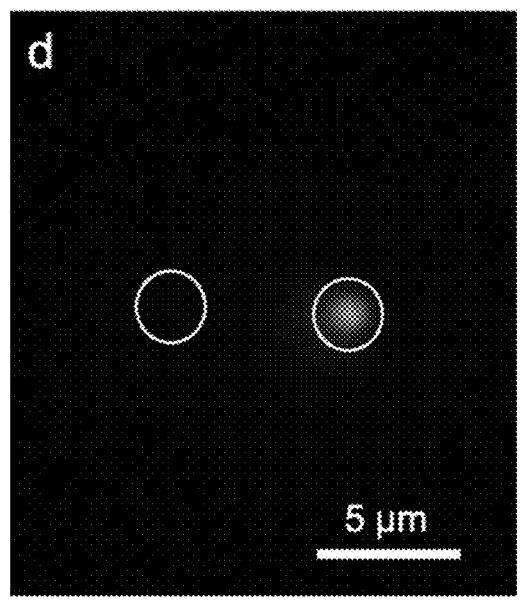
Figure 15A:
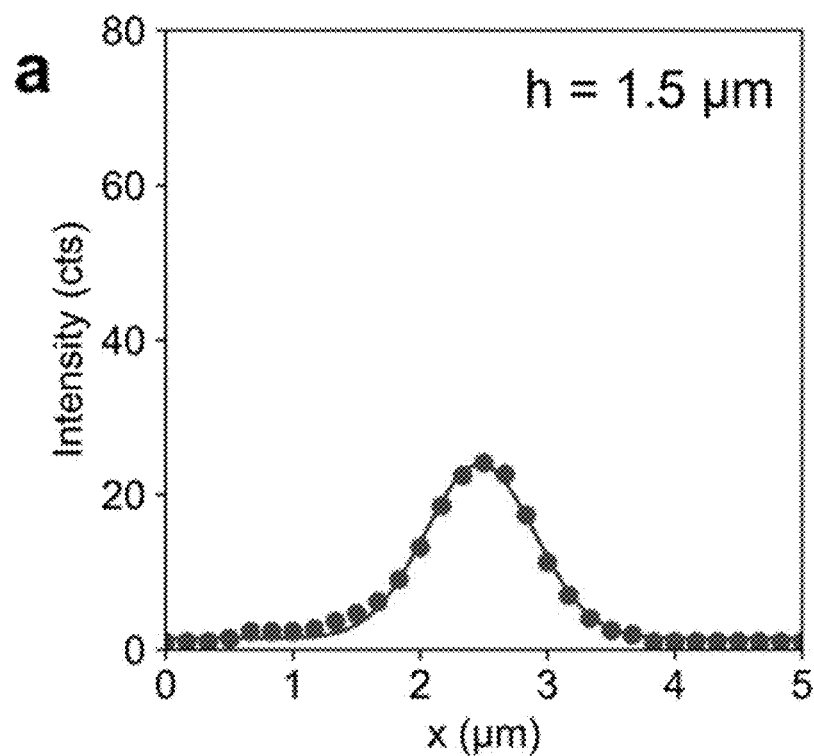
FIGS. 15A-15H show quantitative intensity analysis of an array of $CH_3NH_3PbI_3$ nanopixels of heights increasing from 1.5 µm to 8.7 µm, according to an embodiment of the subject invention.
Figure 15B:
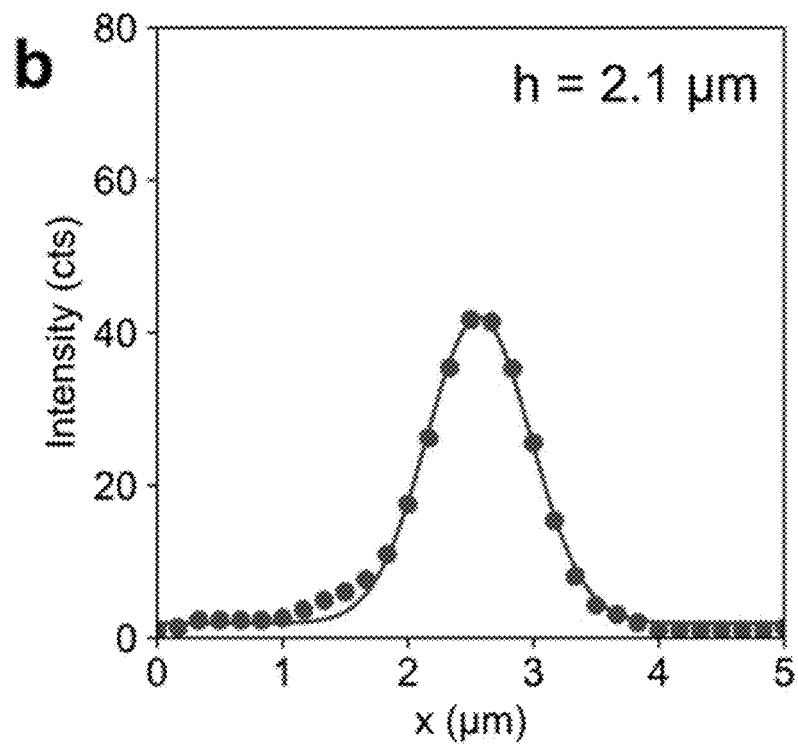
Figure 15C:
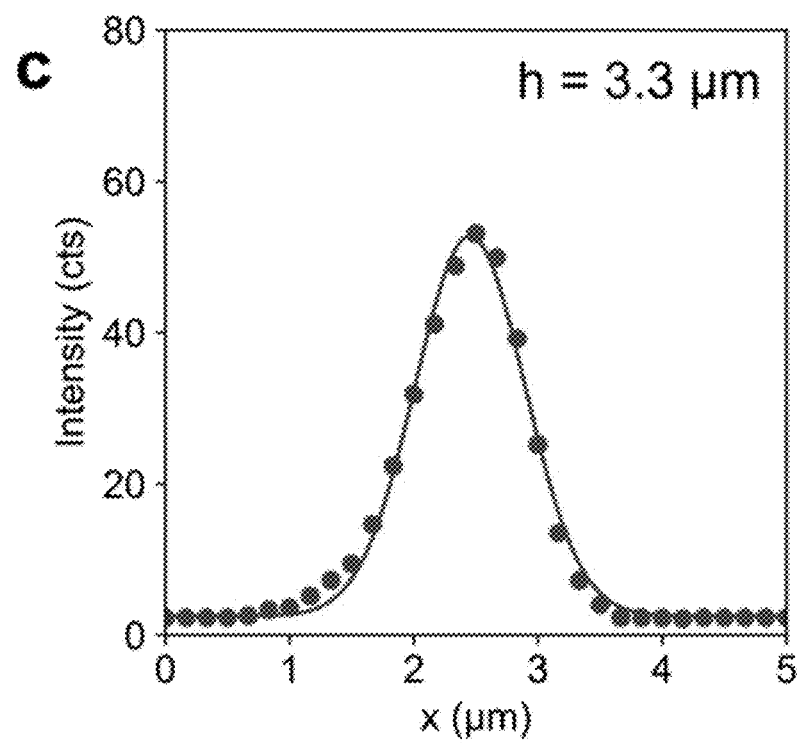
Figure 15D:
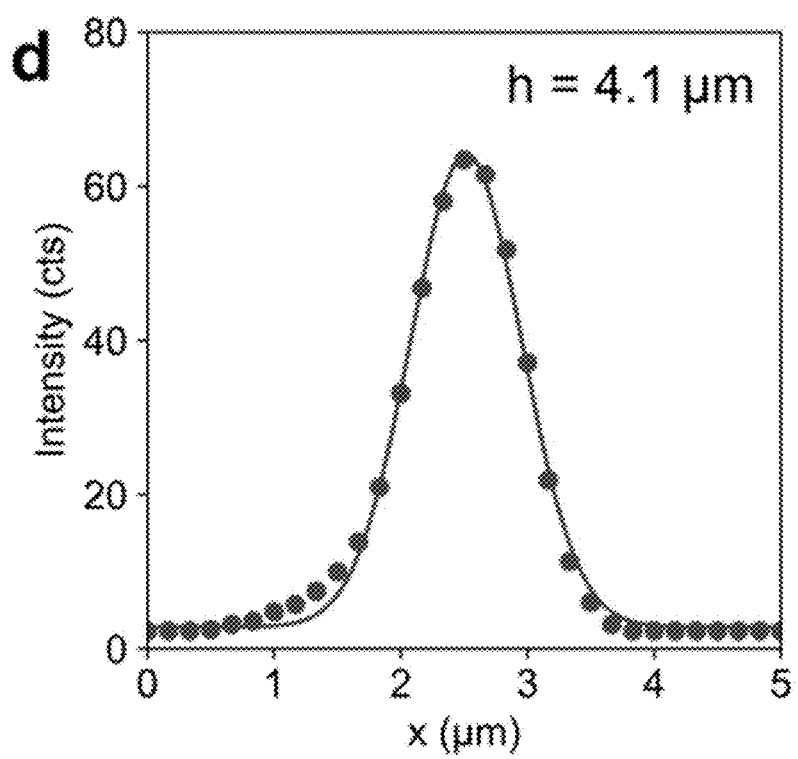
Figure 15E:
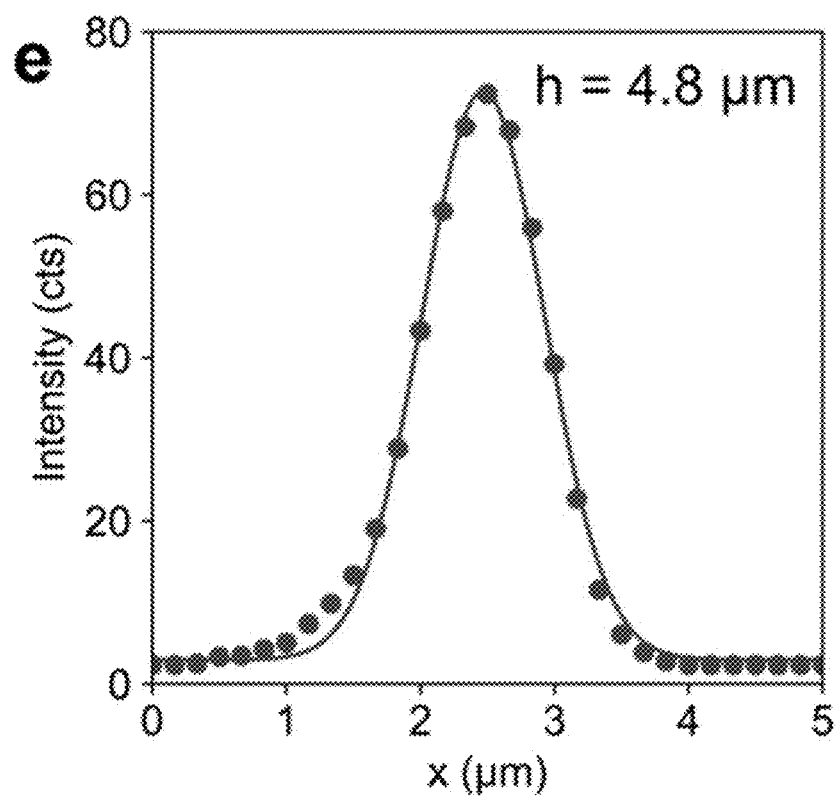
Figure 15F:
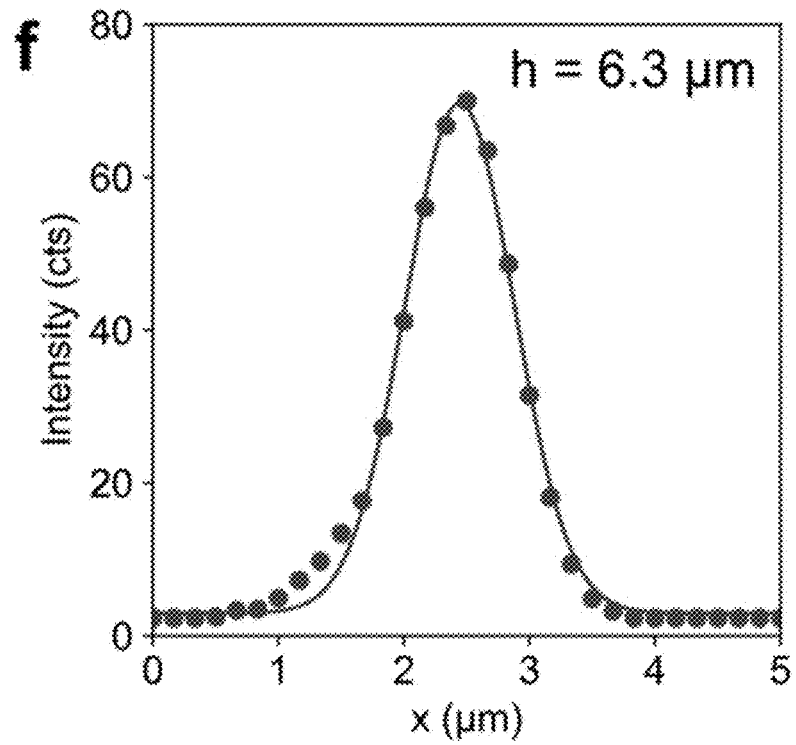
Figure 15G:
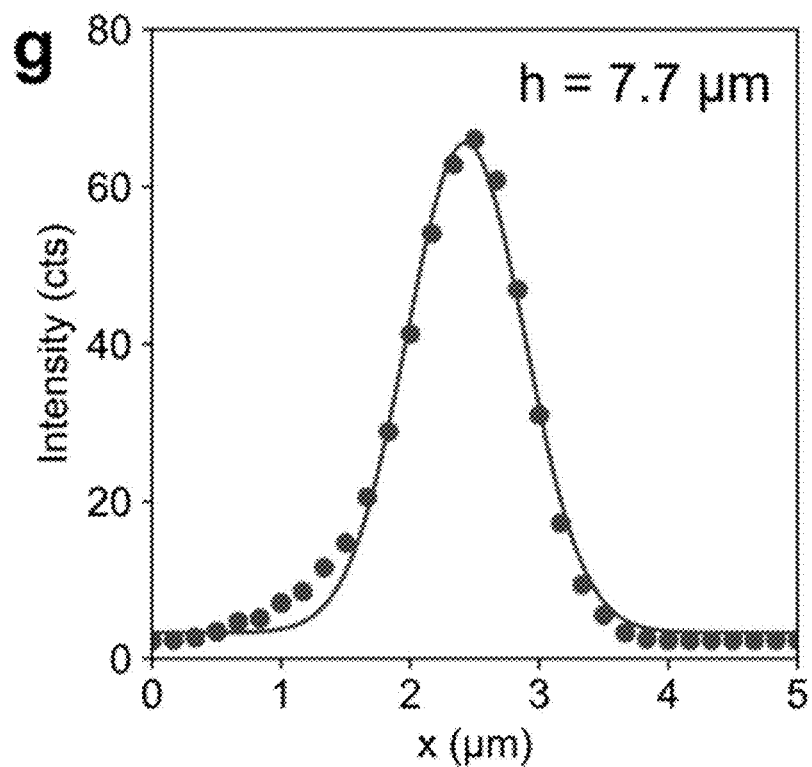
Figure 15H:
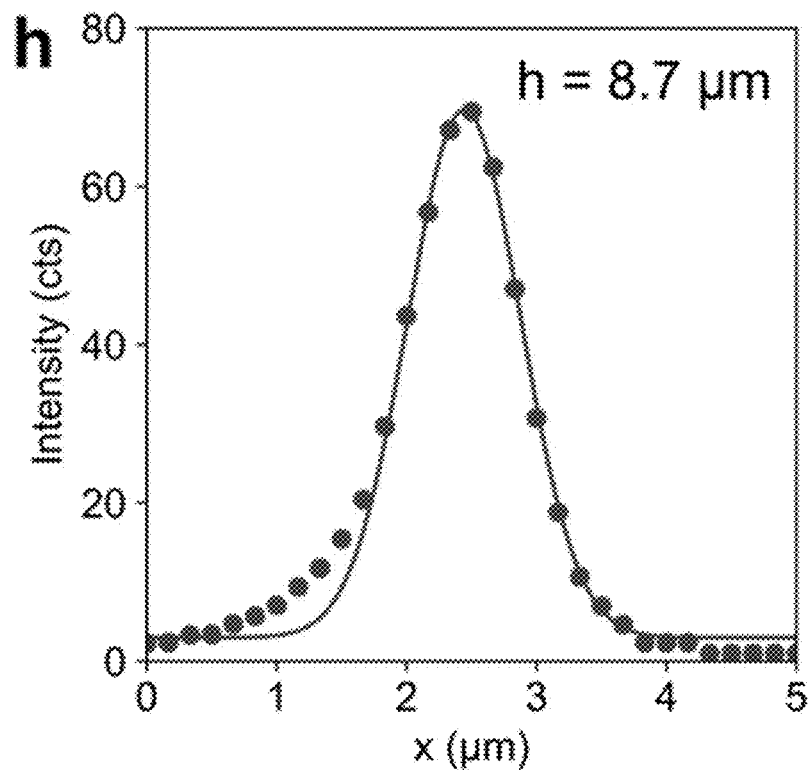
Figure 16A:
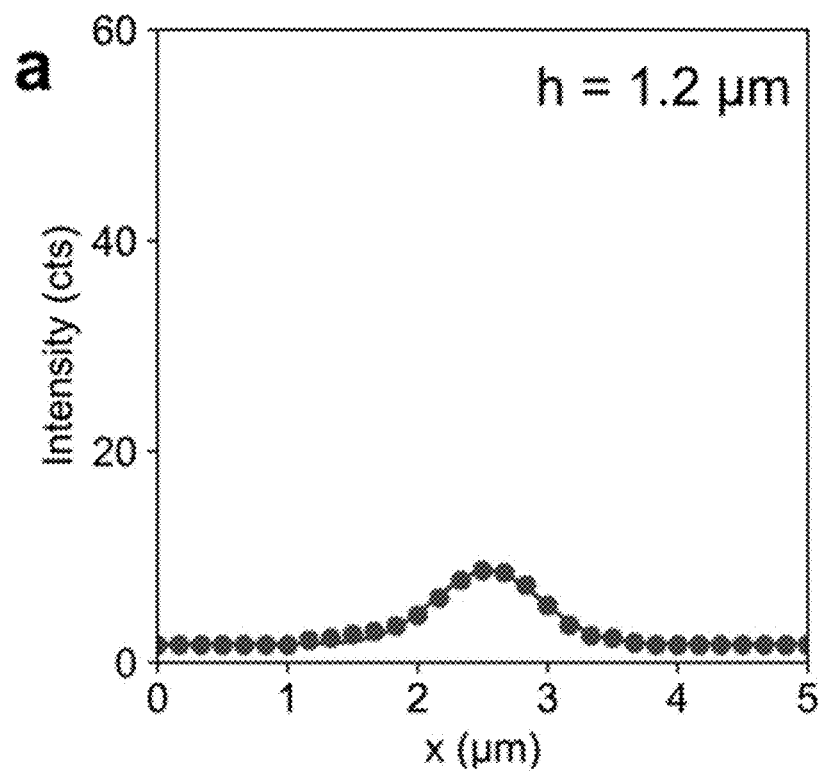
FIGS. 16A-16H show quantitative intensity analysis of an array of $CH_3NH_3PbBr_3$ nanopixels of heights increasing from 1.2 µm to 6.6 µm, according to an embodiment of the subject invention.
Figure 16B:
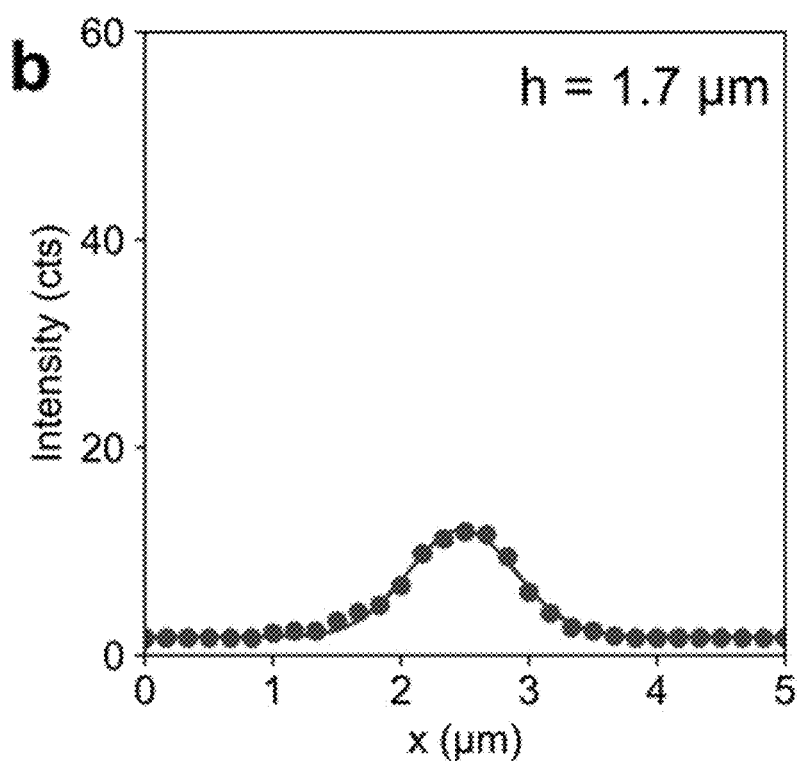
Figure 16C:
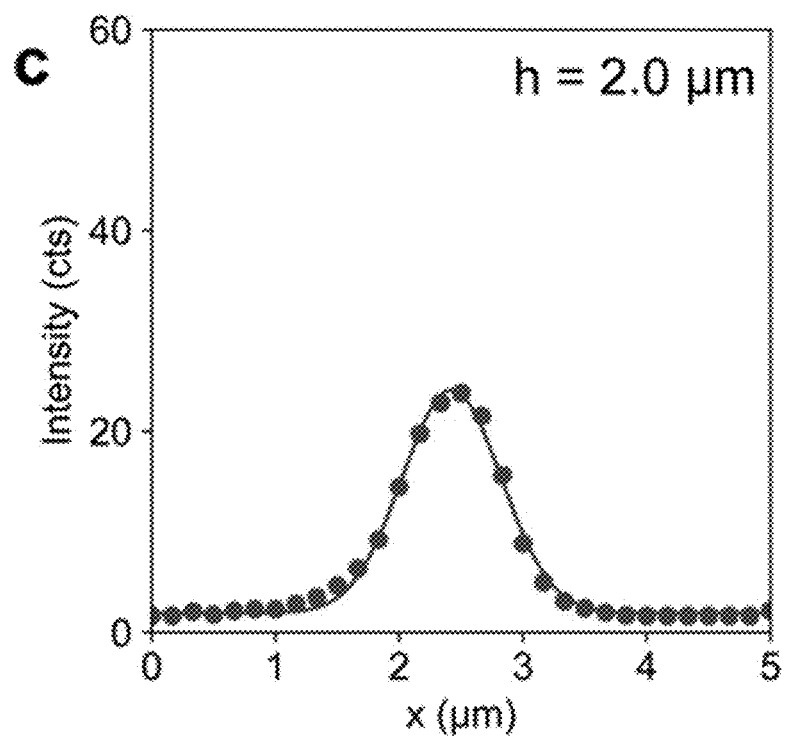
Figure 16D:
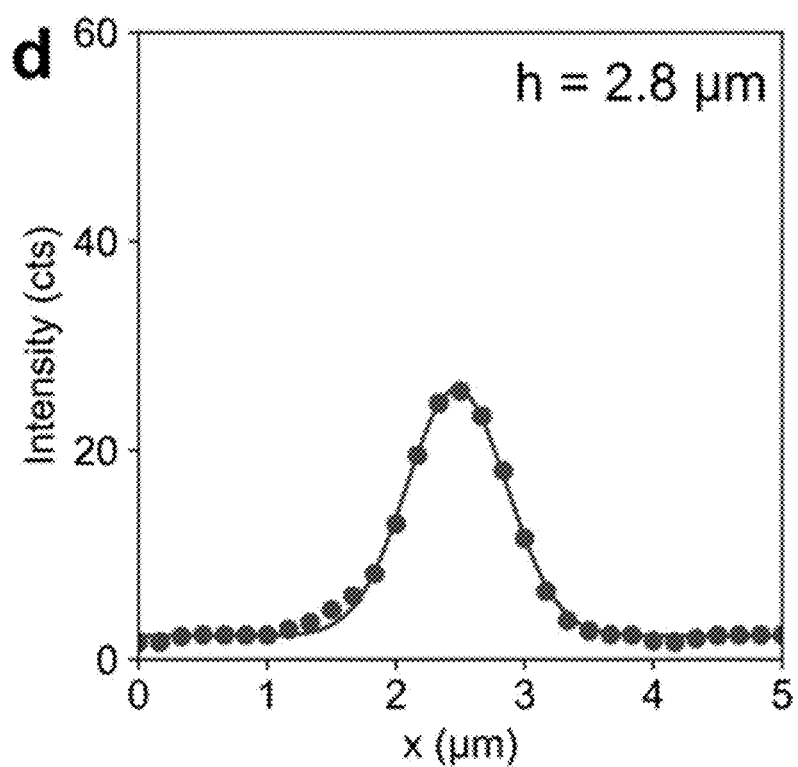
Figure 16E:
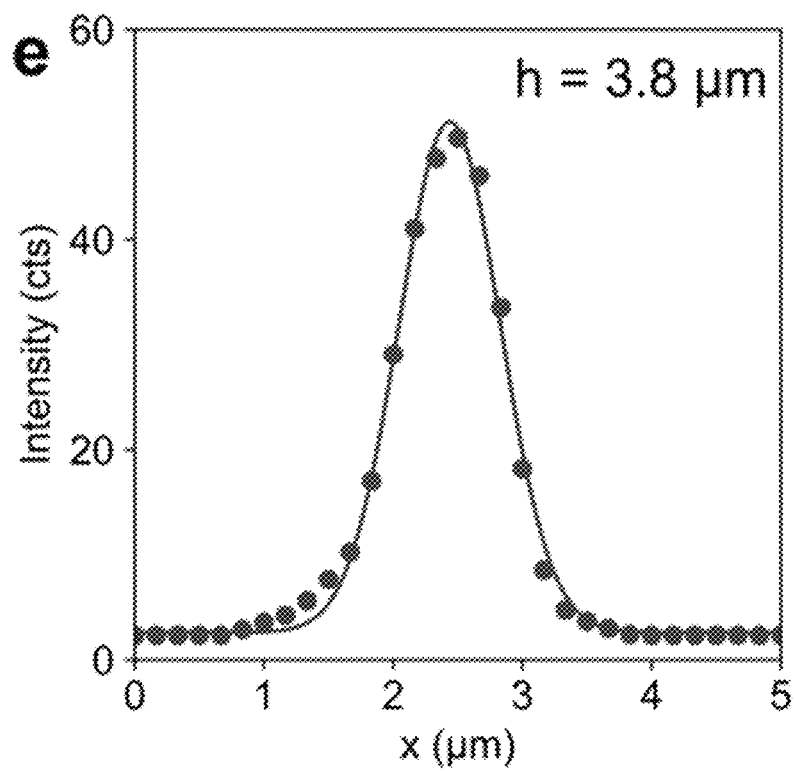
Figure 16F:
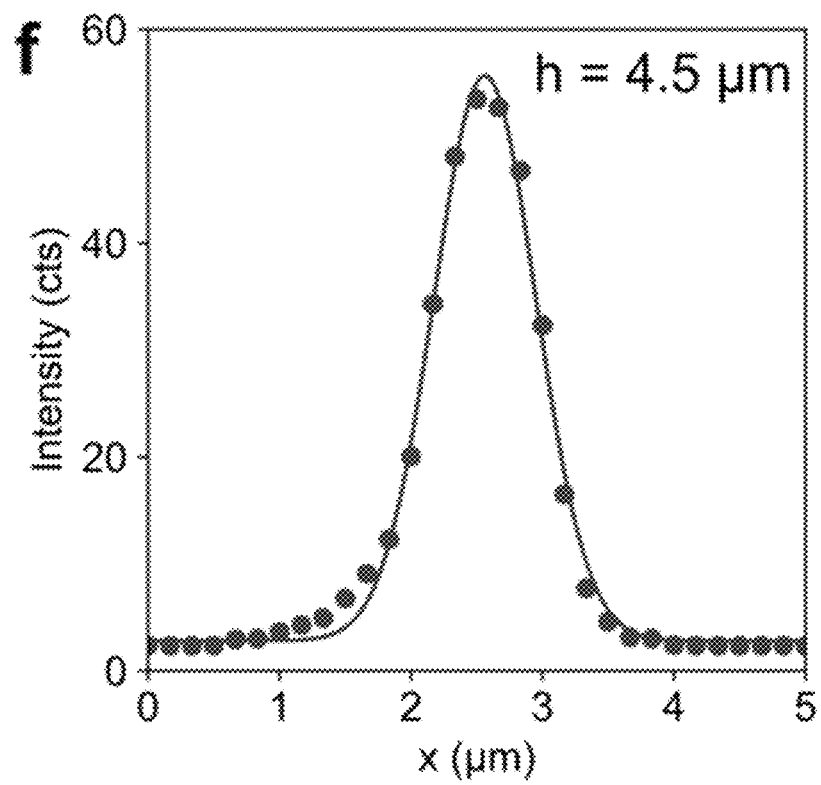
Figure 16G:
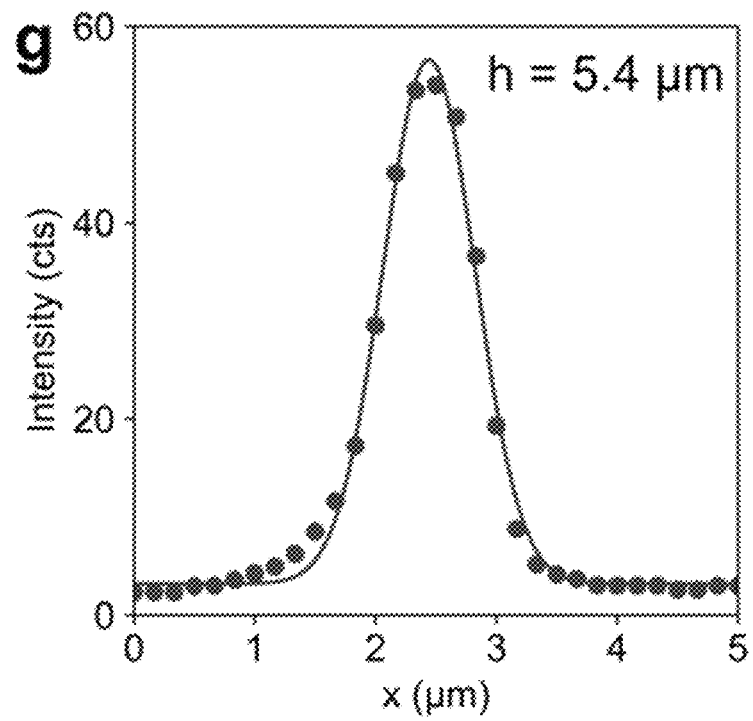
Figure 16H:
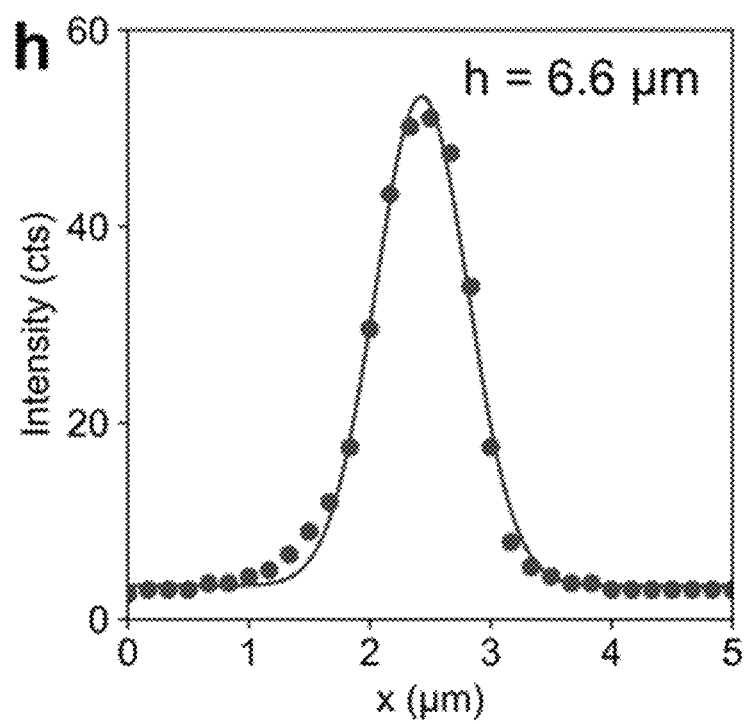
Figure 17A:
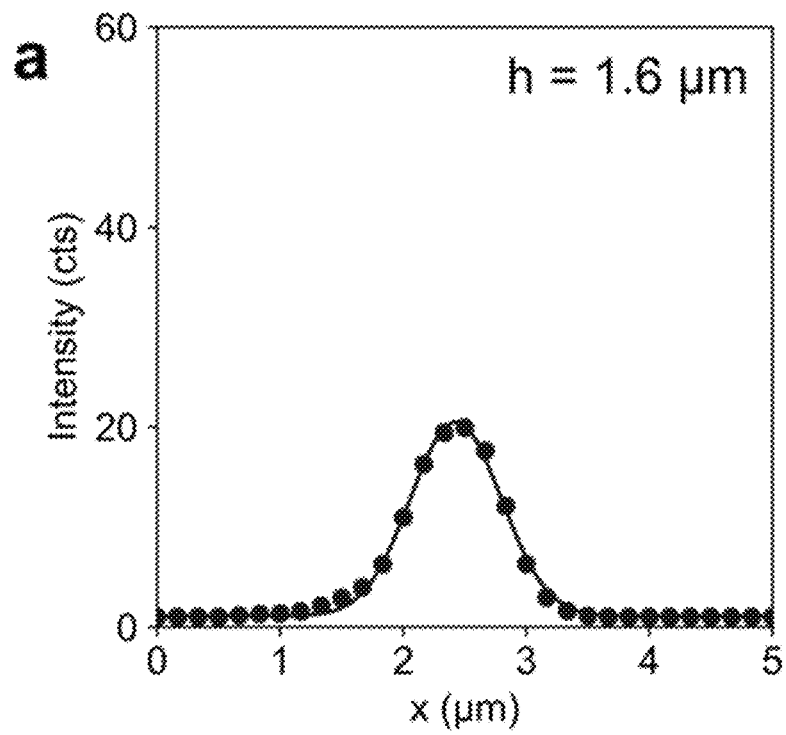
FIGS. 17A-17H show quantitative intensity analysis of an array of $CH_3NH_3PbCl_3$ nanopixels of heights increasing from 1.6 µm to 7.9 µm, according to an embodiment of the subject invention.
Figure 17B:
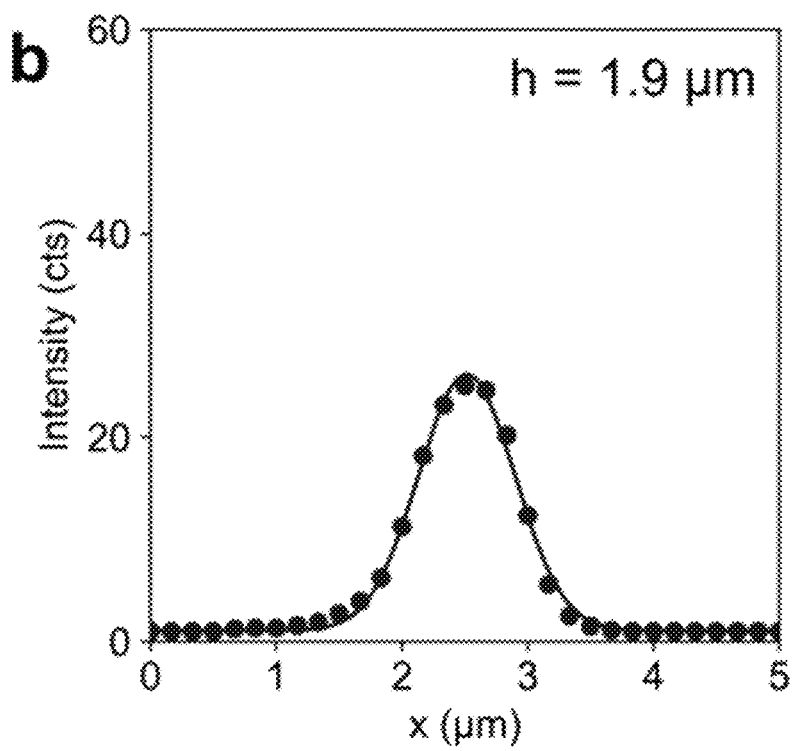
Figure 17C:
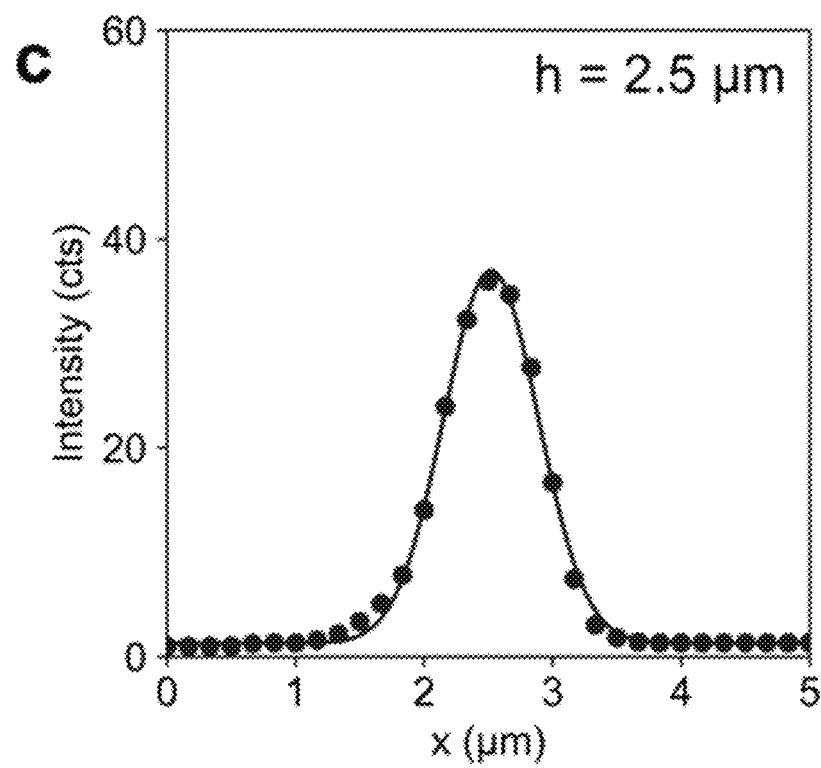
Figure 17D:
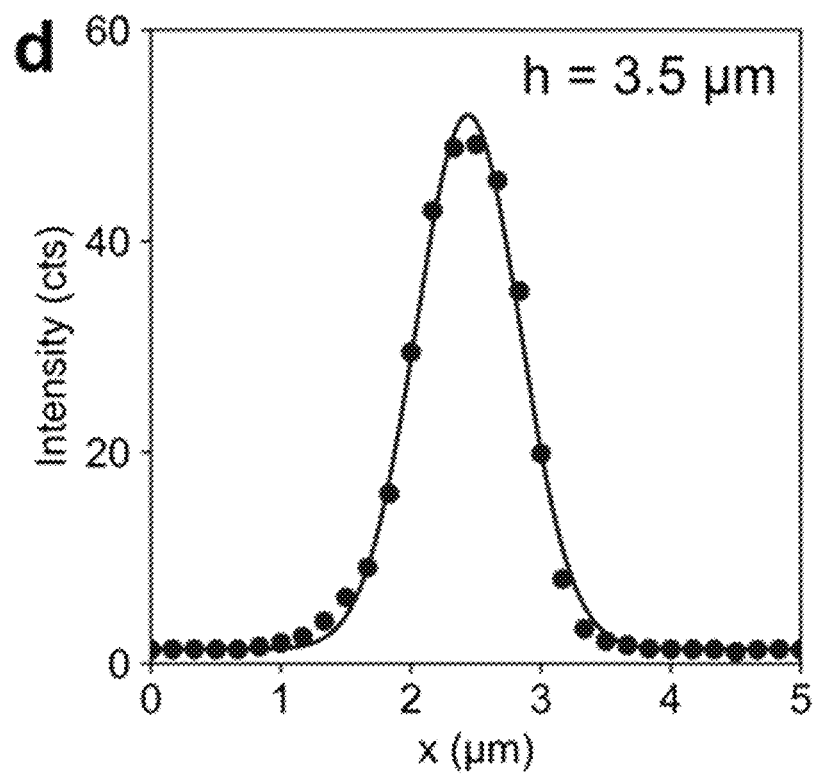
Figure 17E:
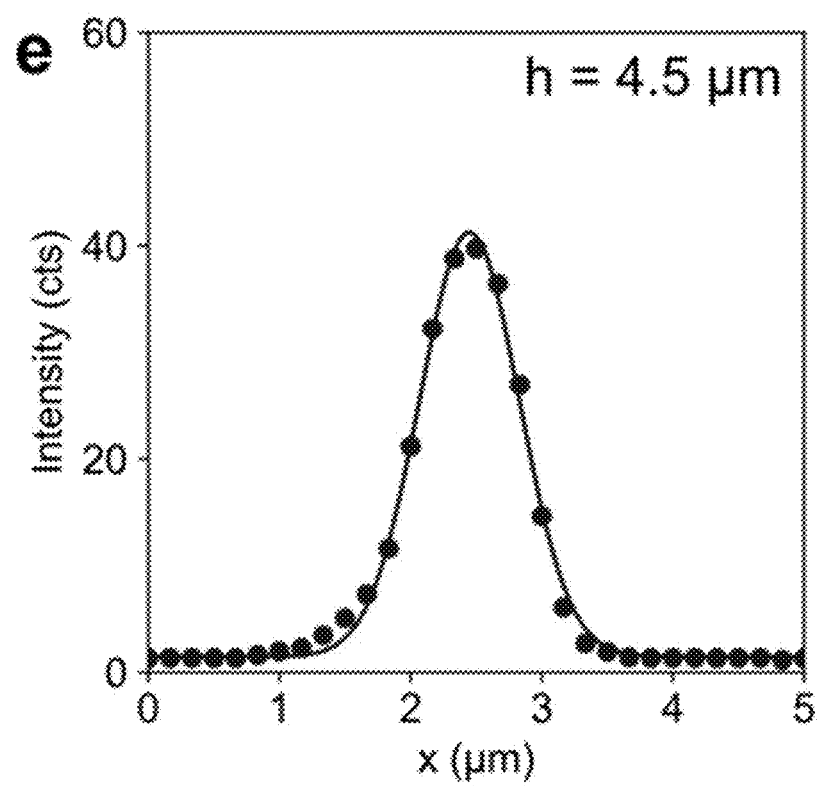
Figure 17F:
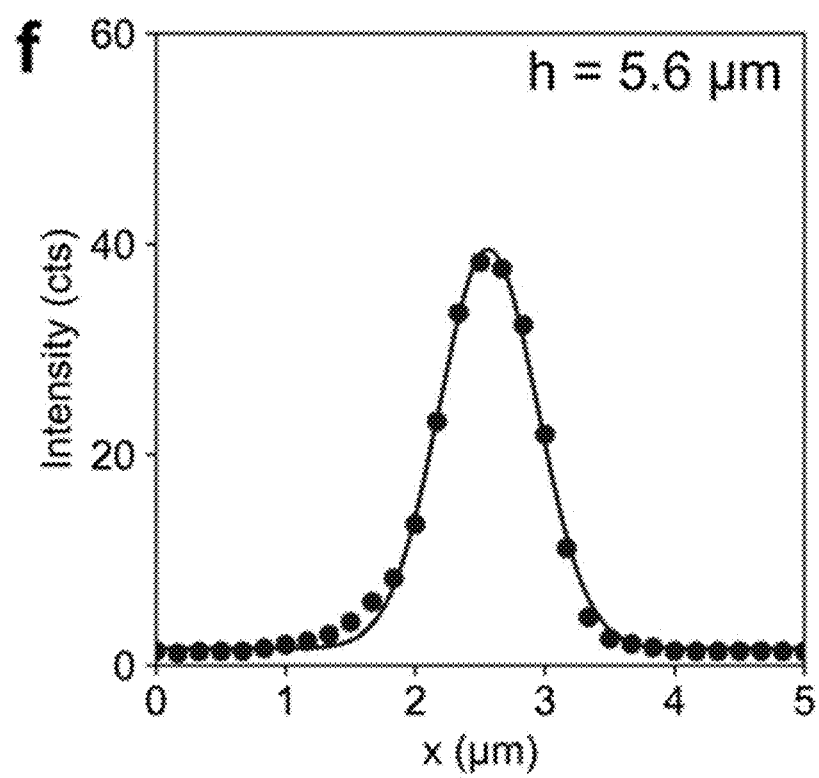
Figure 17G:
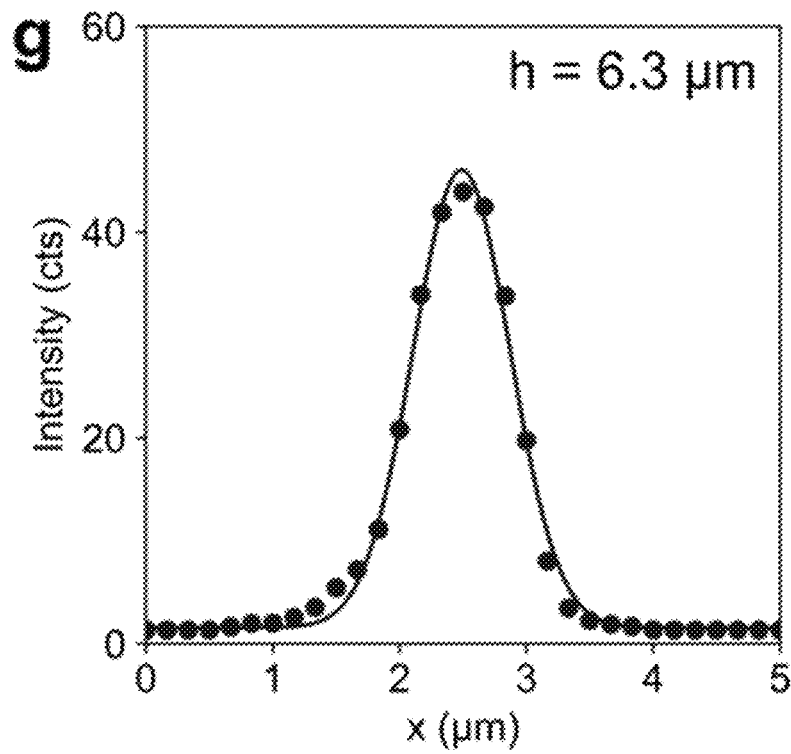
Figure 17H:
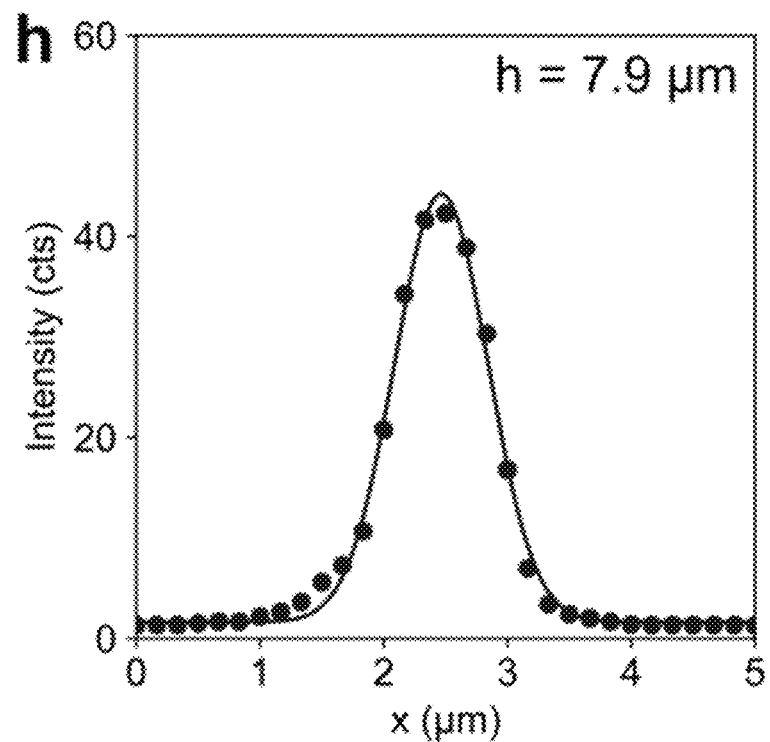
Figure 18A:
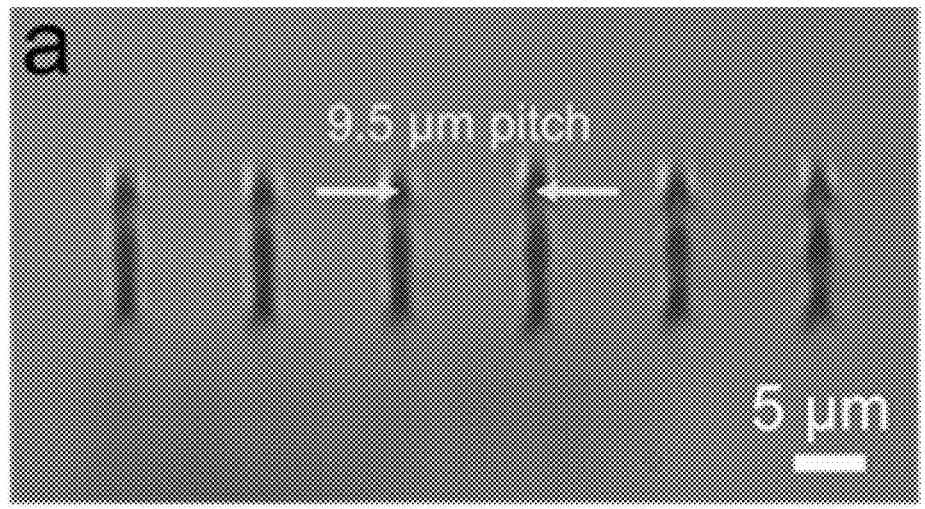
FIGS. 18A-18G show pitch control including.
Figure 18B:
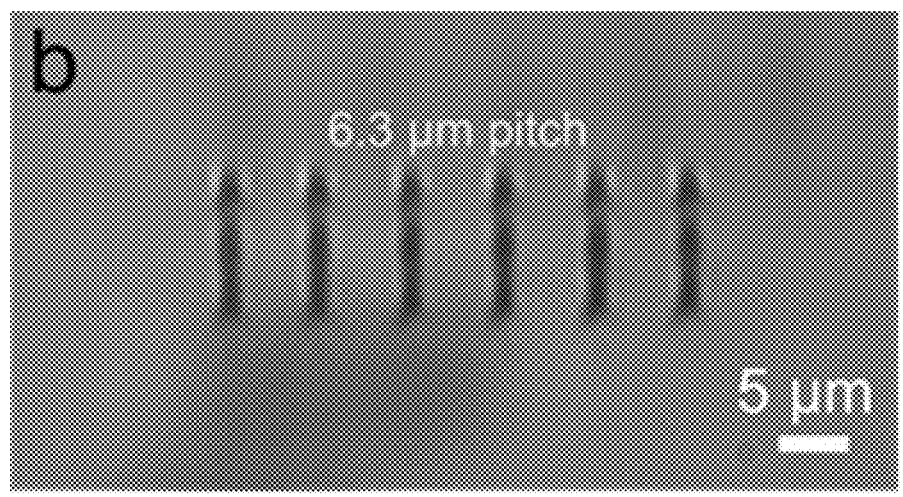
Figure 18C:
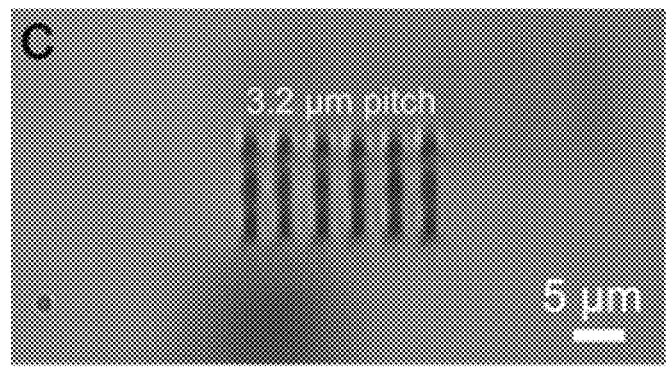
Figure 18D:
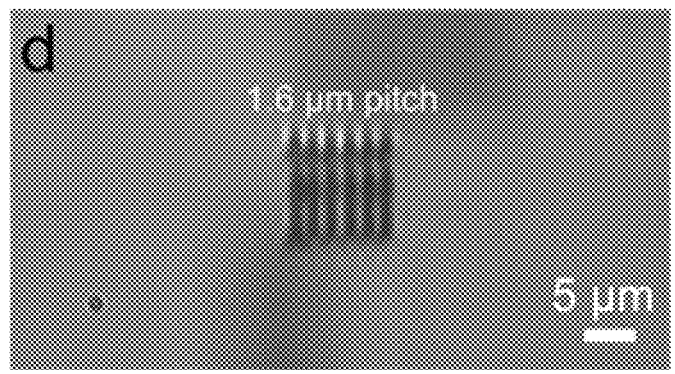
Figure 18E:
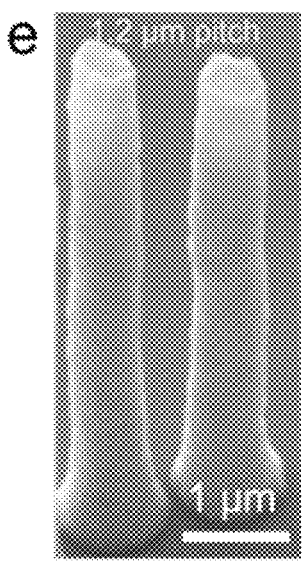
Figure 18F:
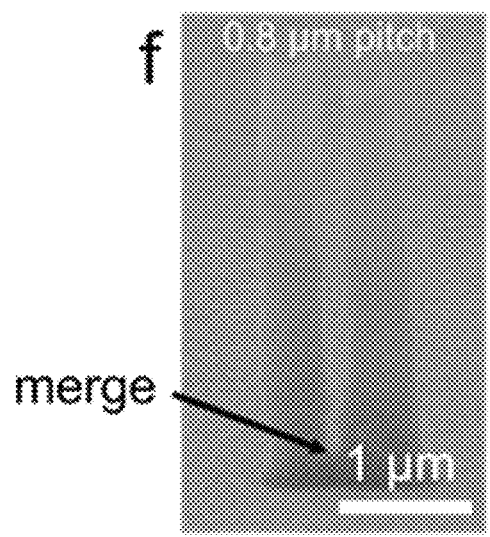
Figure 18G:
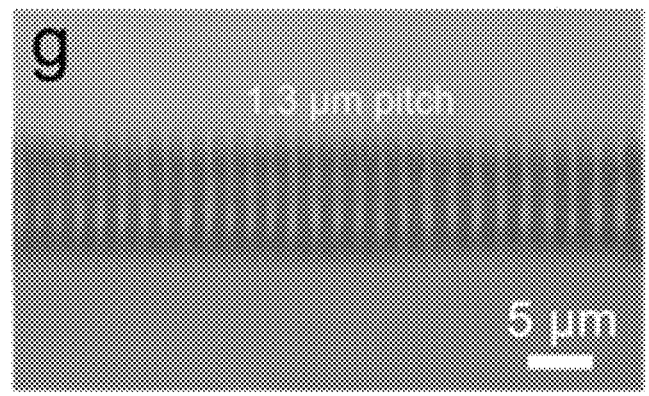
Figure 19A:
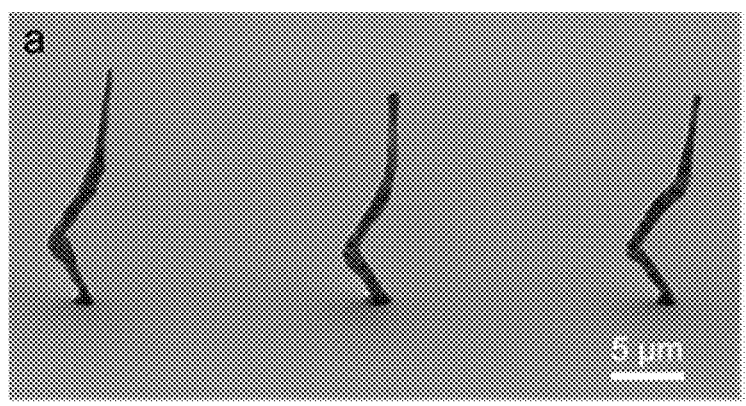
FIGS. 19A-19D show 3D printed perovskites having (FIG. 19A) zig-zag structures, (FIG. 19B) a vertical serpentine structure, (FIG. 19C) a tilted serpentine structure with a constant wavelength, and (FIG. 19D) a freestanding arc-like junction structure, according to an embodiment of the subject invention.
Figure 19B:
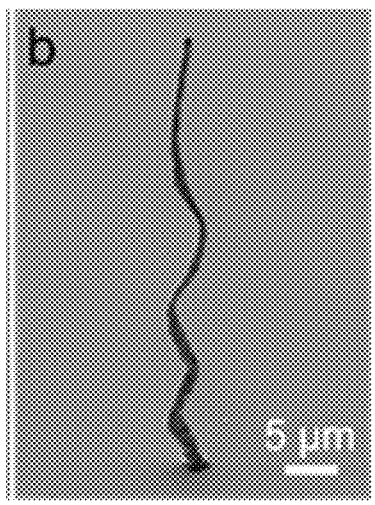
Figure 19C:
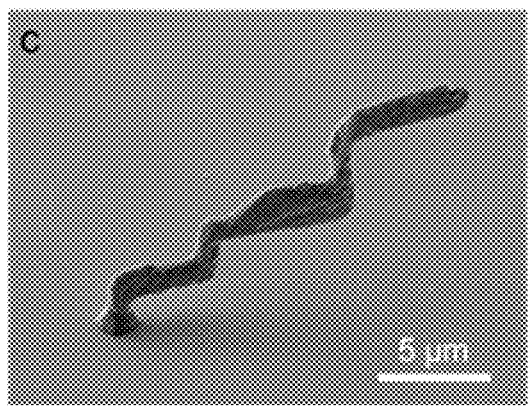
Figure 19D:
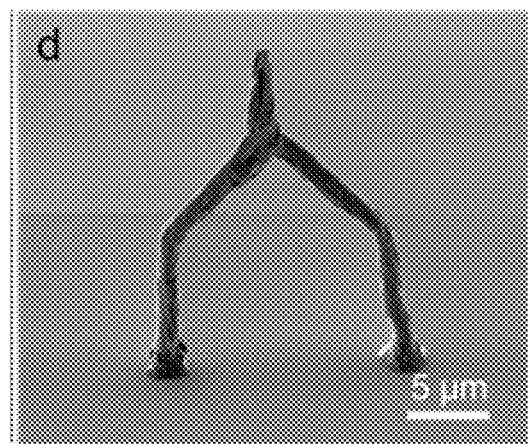

Now referring to FIG. 1H, a side view photoluminescence (PL) image of an array of perovskite RGB nanopixels under UV light illumination is provided. As shown in FIGS. 9, R, G, and B emissions are visible through the radiative recombination of excitons corresponding to emission peaks centered at 760 nm, 535 nm, and 420 nm, respectively.

Further, the crystallographic information of the printed RGB nanopixels can be obtained by transmission electron microscopy (TEM) and selected-area electron diffraction (SAED) measurements. As shown in FIGS. 10A-10E, the RGB nanopixels obtained exhibit polycrystallinity.

Figure 1I:
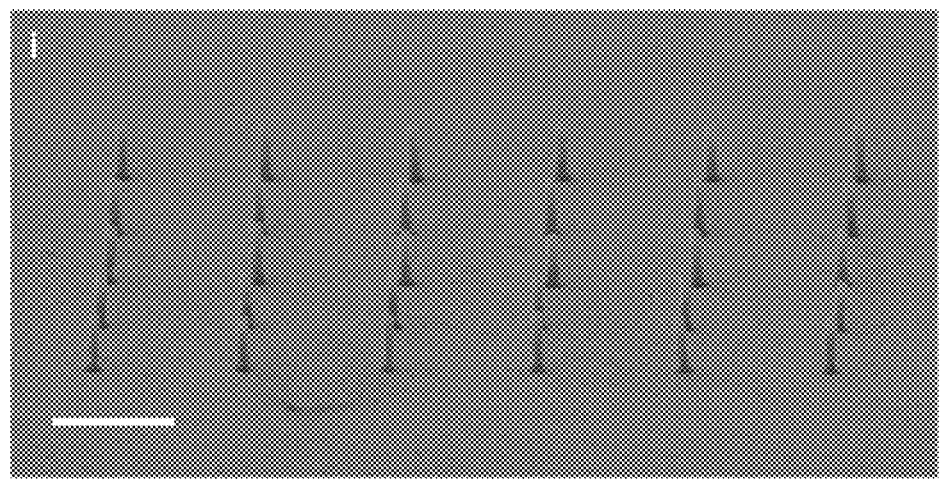
FIG. 1I shows a FE-SEM image of a plurality of arrays of freestanding perovskite nanopixels fabricated by the meniscus-guided crystallization process, wherein the scale bar has a length of 5 μm, according to an embodiment of the subject invention.
Figure 1J:
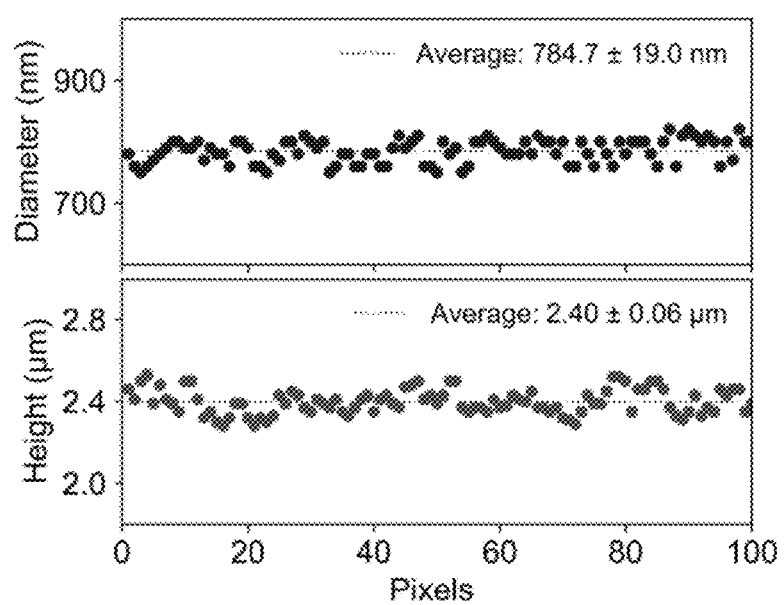
FIG. 1J shows corresponding statistical plot diagrams of the diameter (top) and the height (bottom) of the printed nanopixels of Figure H, according to an embodiment of the subject invention.

Referring to FIGS. 1I and 1J, the perovskite printing process is demonstrated to be reliable. In particular, the FESEM image in FIG. 1I shows an array of freestanding nanopixels with a pitch of 5 μm and FIG. 1J shows the statistical distribution of the measured diameters and heights of 100 nanopixels printed at a printing speed of 5 μm/s, a termination speed of 100 μm/s, and a vertical displacement 2.4 μm. The FE-SEM images of these nanopixels are additionally shown in FIG. 1I.

In one embodiment, the nanopixels may have an average diameter of 780 nm, with a standard deviation of 19 nm (2.4%), and a height of 2.40 μm, with a standard deviation of 0.06 μm (2.5%). Moreover, FIGS. 12A-13G respectively show that the adhesion of the nanopixels to the substrate withstanding bending and compression of substrate, allowing the 3D print method to be applied to advanced flexible display.

The emission characteristics of the 3D-printed nanopixels are also examined. The 3D-printed nanopixels are only visible under high-magnification imaging due to their small sizes.

Therefore, the emission intensity and size are investigated under UV excitation by a wide-field fluorescence microscope. A 40× objective lens having a numerical aperture of 0.55 is employed to excite the pixels and collect the light emissions.

Figure 2A:
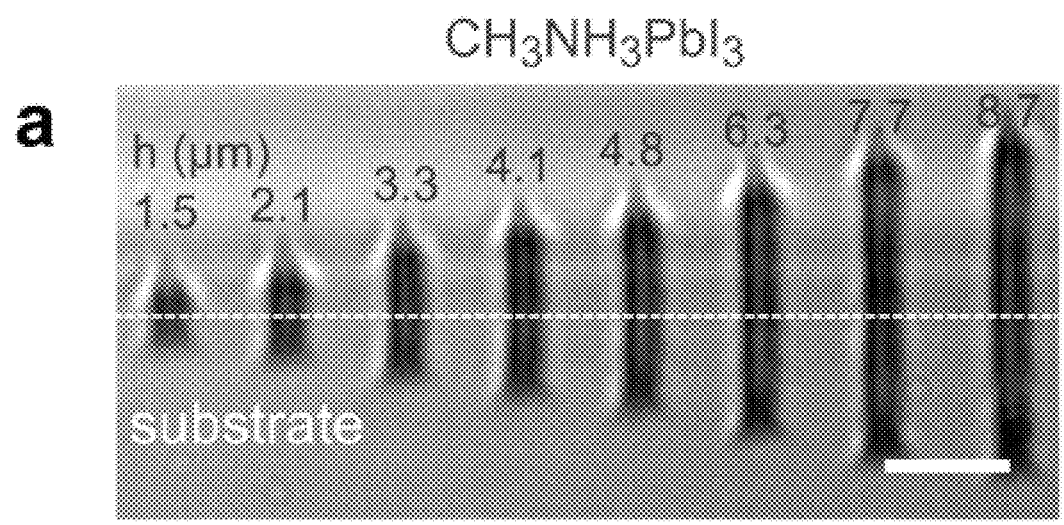
FIG. 2A shows a side view optical micrograph of a group of three-dimensional (3D) printed $CH_3NH_3PbI_3$ nanopixels emitting red color light (R) and respectively having a controlled height of 1.5, 2.1, 3.3, 4.1, 4.8, 6.3, 7.7, or 8.7 μm, wherein the scale bar has a length of 5 μm, according to an embodiment of the subject invention.
Figure 2B:
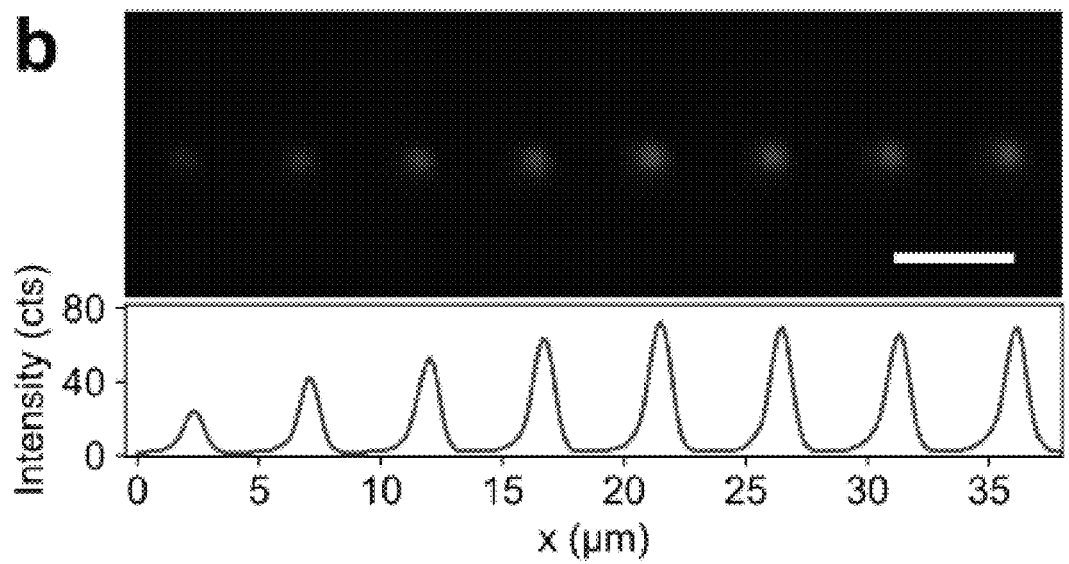
FIG. 2B shows a bottom view wide-field photoluminescence image (top) and its corresponding intensity profile (bottom) of the three-dimensional (3D) printed $CH_3NH_3PbI_3$ nanopixels of FIG. 2A, wherein the scale bar has a length of 5 μm, according to an embodiment of the subject invention.

One of the significant benefits offered by 3D nanopixels is that their emission brightness can be varied in an on-demand manner by adjusting their heights, without a concomitant decrease in the lateral resolution, as demonstrated in FIGS. 2A-2M. In particular, FIG. 2A shows a side view optical image of the printed $CH_3NH_3PbI_3$ nanopixels with an increasing range of heights from 1.5 μm to 8.7 μm. FIG. 2B shows the corresponding bottom view wide-field PL image of the printed $CH_3NH_3PbI_3$ nanopixels and the intensity profile under UV excitation. The brightness of the nanopixels is quantified by the integration of the intensity counts in a bounded region around each nanopixel in the PL image.

Figure 2C:
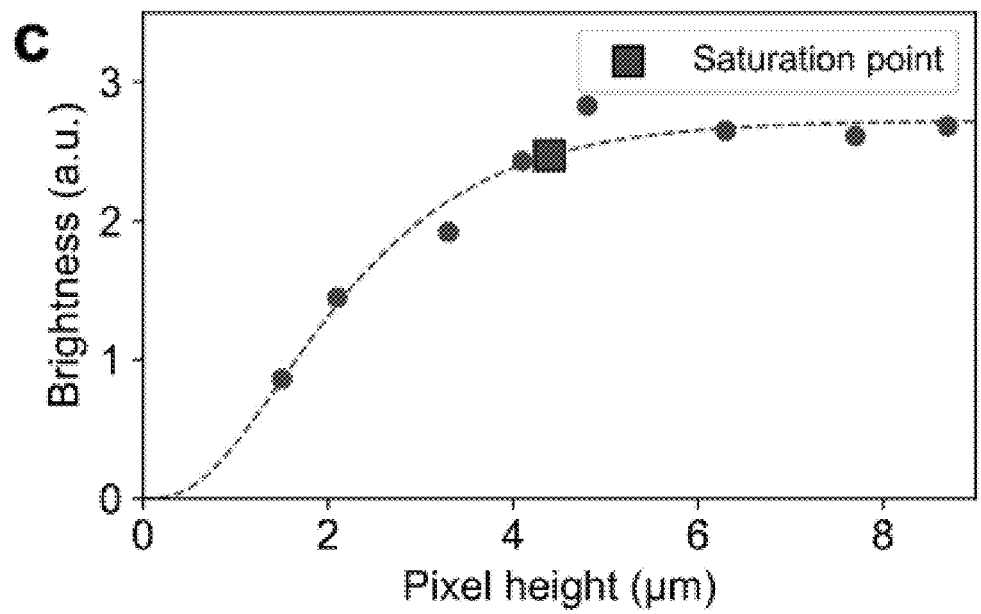
FIG. 2C is a plot diagram showing relationships between the emission intensity and the pixel height of the three-dimensional (3D) printed $CH_3NH_3PbI_3$ nanopixels of FIG. 2A, according to an embodiment of the subject invention.

Referring to FIG. 2C, the PL emission brightness of the nanopixels increases by about 3.3 times when their heights increase from 1.5 μm to 4.8 μm, due to the increased pixel volumes and their interactions with the excitation light. Accordingly, a pixel with a height of 4.8 μm can be about 24 times brighter than a 200 nm thick pixel, which is a typical thickness of a perovskite thin film, with the same diameter as shown in FIGS. 14A-14D.

As the height increases further from 4.8 μm to 8.7 m, the emission brightness of the nanopixels remains constant, indicating saturation. The saturation height is determined to be 4.4 μm by fitting the brightness-height data into the Chapman-Richards growth function. The saturation of the collected PL emission may result from the limited depth of field (DOF) of the high-magnification wide field imaging system. The light-matter interaction beyond the DOF does not contribute significantly to the collected emission brightness. Given that, it is expected that it will be feasible to obtain a uniformly bright PL display by printing 3D nanopixels with heights greater than their saturation height. It is noted that the pixel height has a negligible effect on the size of the emission spot.

The DOF can be theoretically calculated by the following equation:

$$DOF = \frac{\lambda \times n}{NA^2} + \frac{n}{M \times NA} e$$

where DOF represents the depth of field, λ represents the incident wavelength, n represents the refractive index of the medium between the coverslip and the objective lens, NA represents the objective numerical aperture, and the variable e is the smallest distance that can be resolved by a detector and M is the lateral magnification.

The parameters of the optical system used for the theoretical calculation of DOF are listed in Table 1 below.

TABLE 1

| | |
|---|---|
| λ | 760 nm (red), 535 nm (green), 420 nm (blue) |
| N | 1.55 |
| NA | 0.55 |
| M | 40 |
| e | 1.5 μm |

Figure 2D:
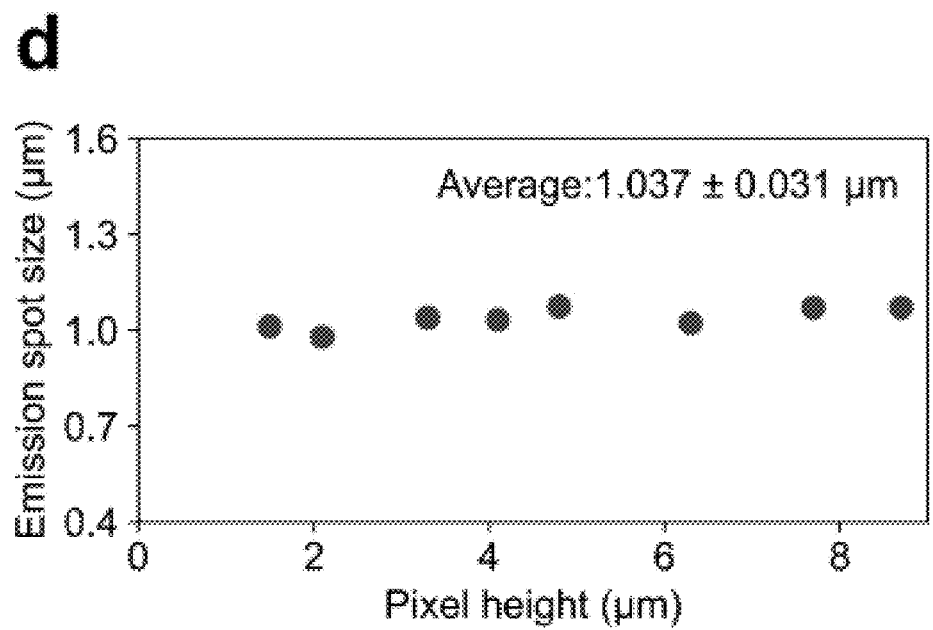
FIG. 2D is a plot diagram showing relationships between the emission spot size and the pixel height of the three-dimensional (3D) printed $CH_3NH_3PbI_3$ nanopixels of FIG. 2A, according to an embodiment of the subject invention.
Figure 2E:
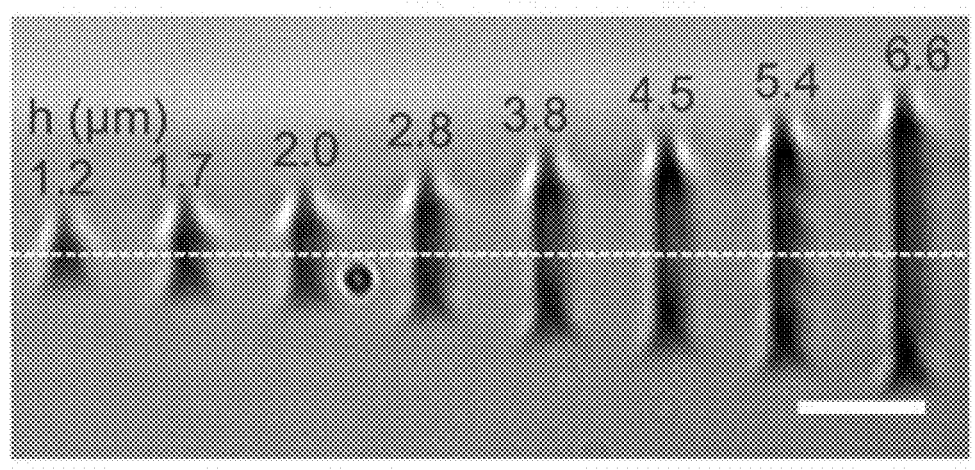
FIG. 2E shows a side view optical micrograph of a group of three-dimensional (3D) printed $CH_3NH_3PbBr_3$ nanopixels emitting green color light (G) and respectively having a controlled height of 1.2, 1.7, 2.0, 2.8, 3.8, 4.5, 5.4, or 6.6 μm, wherein the scale bar has a length of 5 μm, according to an embodiment of the subject invention.
Figure 2F:
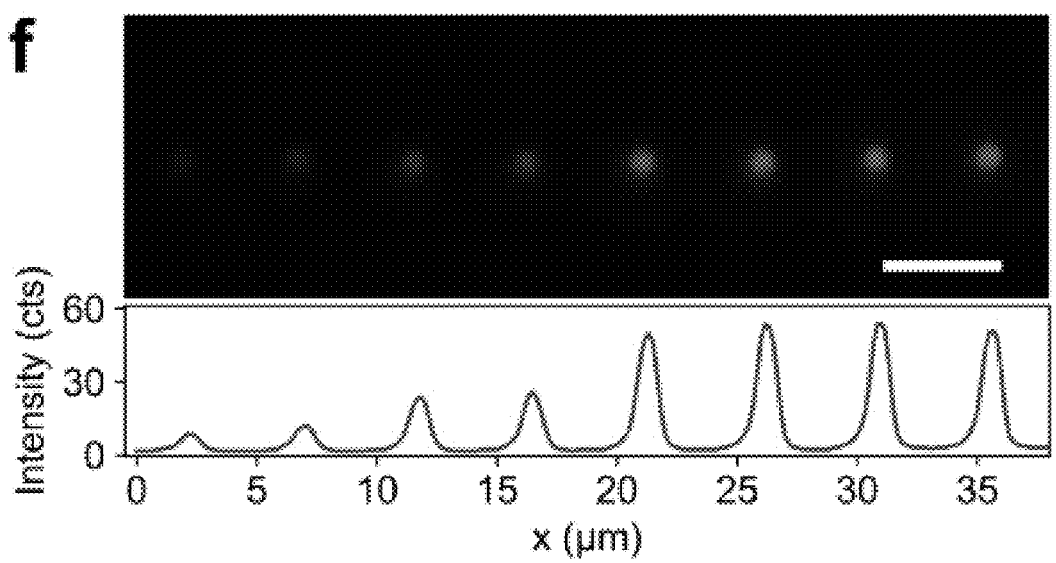
FIG. 2F shows a bottom view wide-field photoluminescence image (top) and its corresponding intensity profile (bottom) of the three-dimensional (3D) printed $CH_3NH_3PbBr_3$ nanopixels emitting green color light of FIG. 2E, wherein the scale bar has a length of 5 μm; according to an embodiment of the subject invention.

FIG. 2D shows the lateral emission sizes of nanopixels with different heights, which are measured from the full width at half-maximum of each emission peak and the corresponding Gaussian fit data are shown in FIGS. 15A-15H. As mentioned above, despite the increase in pixel heights from 1.5 μm to 8.7 μm, the diameter of the emission spot remains constant, at 1.03±0.03 μm. The result proves that the nanopixels fabricated according to the methods of the subject invention have improved nanopixel brightness without sacrificing lateral integration density.

Similar effects of pixel height on emission brightness and spot size are found for the $CH_3NH_3PbBr_3$ (G) nanopixels as shown in FIGS. 2E, 2F and FIGS. 16A-16H and $CH_3NH_3PbCl_3$ (B) nanopixels as shown in FIGS. 2I, 2J and FIGS. 17A-17H. Moreover, similar emission brightness-height saturation curves and height-independent emission sizes for $CH_3NH_3PbBr_3$ (G) are observed in FIGS. 2G and 2H and similar emission brightness-height saturation curves and height-independent emission sizes for $CH_3NH_3PbCl_3$ (B) are observed in FIGS. 2K and 2L.

Figure 2G:
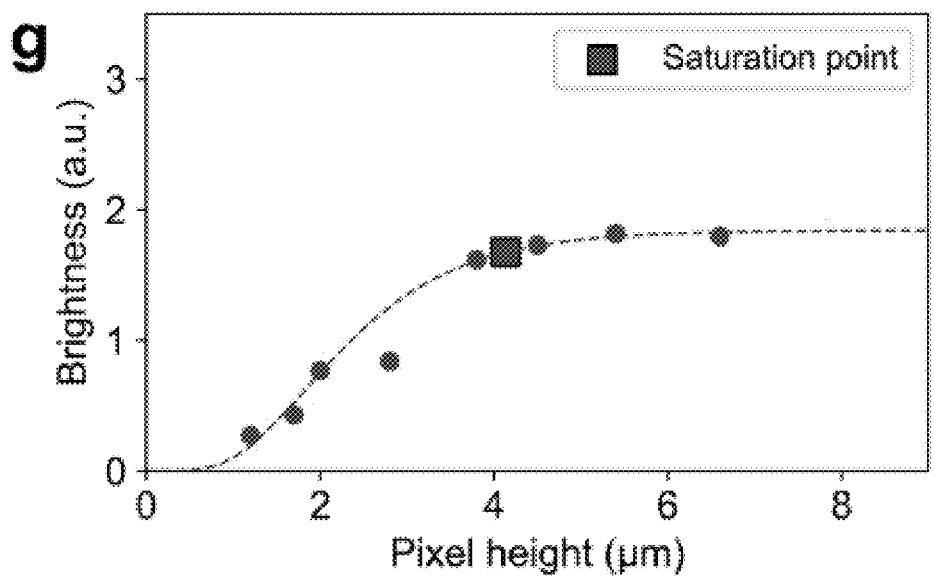
FIG. 2G is a plot diagram showing relationships between the emission intensity and the pixel height of the three-dimensional (3D) printed $CH_3NH_3PbBr_3$ nanopixels of FIG. 2E, according to an embodiment of the subject invention.
Figure 2H:
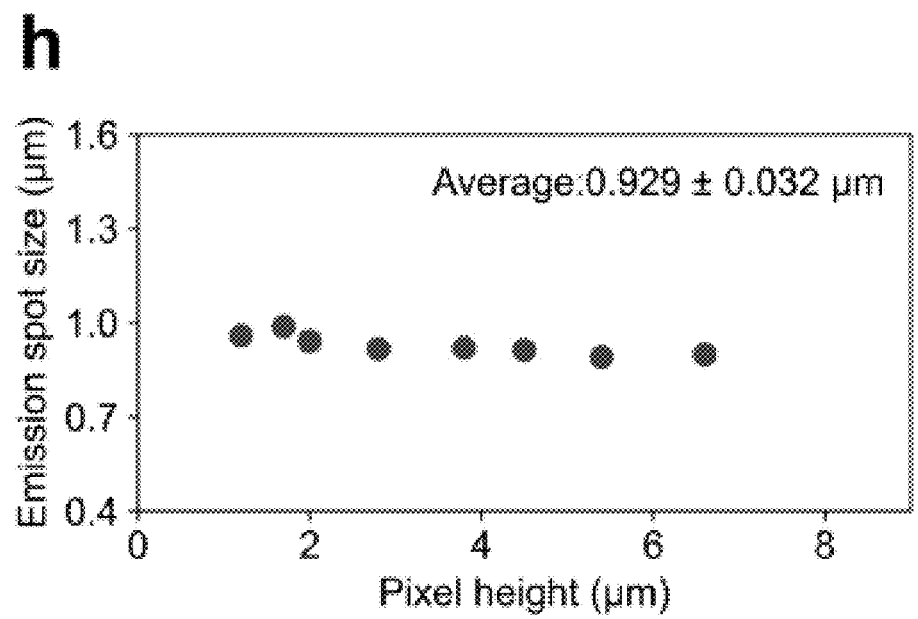
FIG. 2H is a plot diagram showing relationships between the emission spot size and the pixel height of the three-dimensional (3D) printed $CH_3NH_3PbBr_3$ nanopixels of FIG. 2E, according to an embodiment of the subject invention.
Figure 2I:
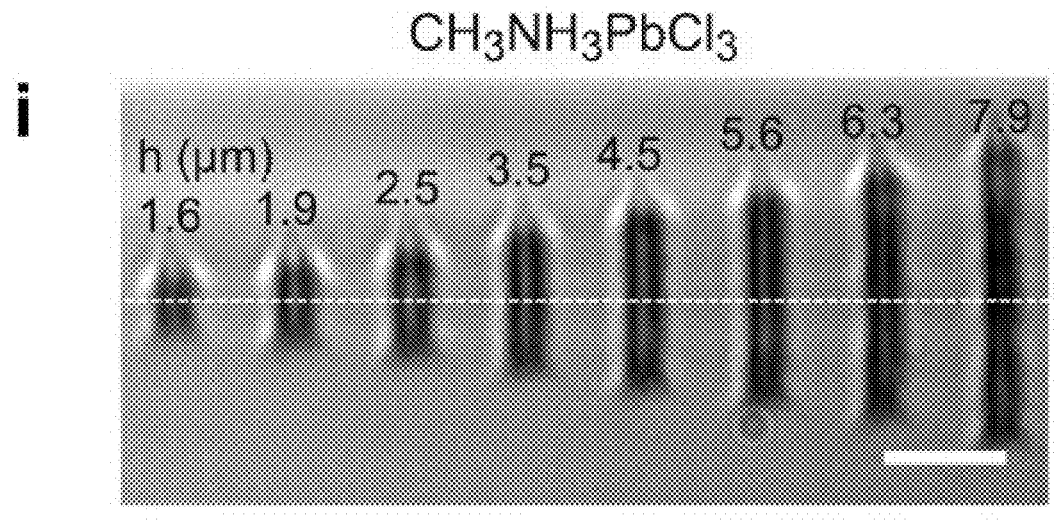
FIG. 2I shows a side view optical micrograph of a group of three-dimensional (3D) printed $CH_3NH_3PbCl_3$ nanopixels emitting blue color light (B) and respectively having a controlled height of 1.6, 1.9, 2.5, 3.5, 4.5, 5.6, 6.3, or 7.9 μm, wherein the scale bar has a length of 5 μm, according to an embodiment of the subject invention.
Figure 2J:
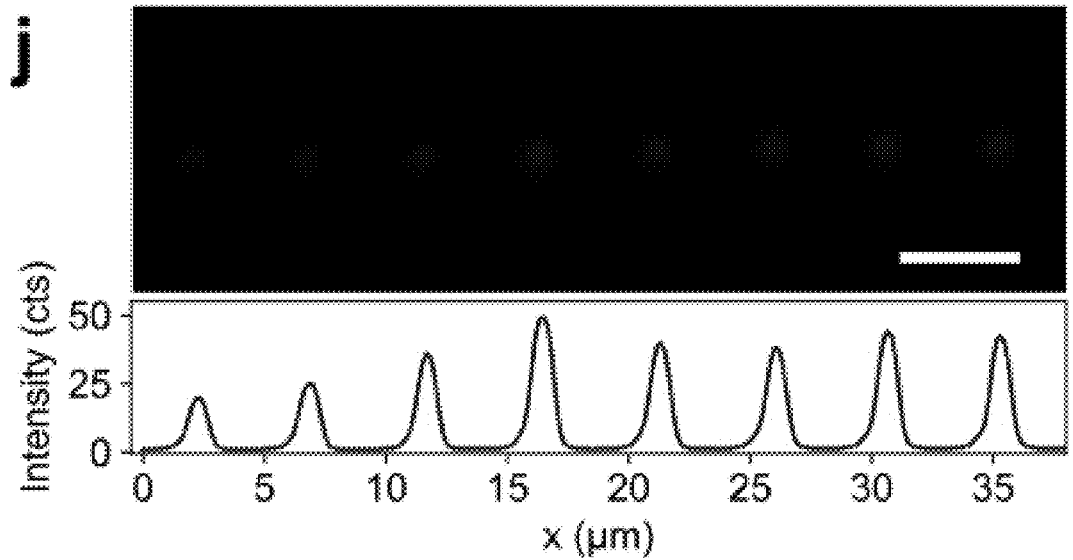
FIG. 2J shows a bottom view wide-field photoluminescence image (top) and its corresponding intensity profile (bottom) of the three-dimensional (3D) printed $CH_3NH_3PbCl_3$ nanopixels of FIG. 2I, wherein the scale bar has a length of 5 μm, according to an embodiment of the subject invention.
Figure 2K:
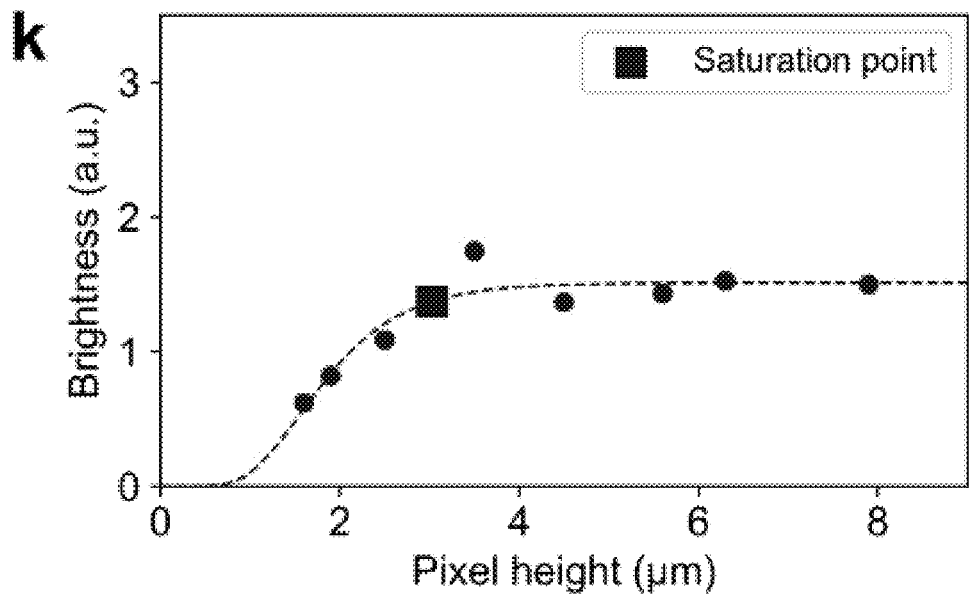
FIG. 2K is a plot diagram showing relationships between the emission intensity and the pixel height of the three-dimensional (3D) printed $CH_3NH_3PbCl_3$ nanopixels of FIG. 2I, according to an embodiment of the subject invention.
Figure 2L:
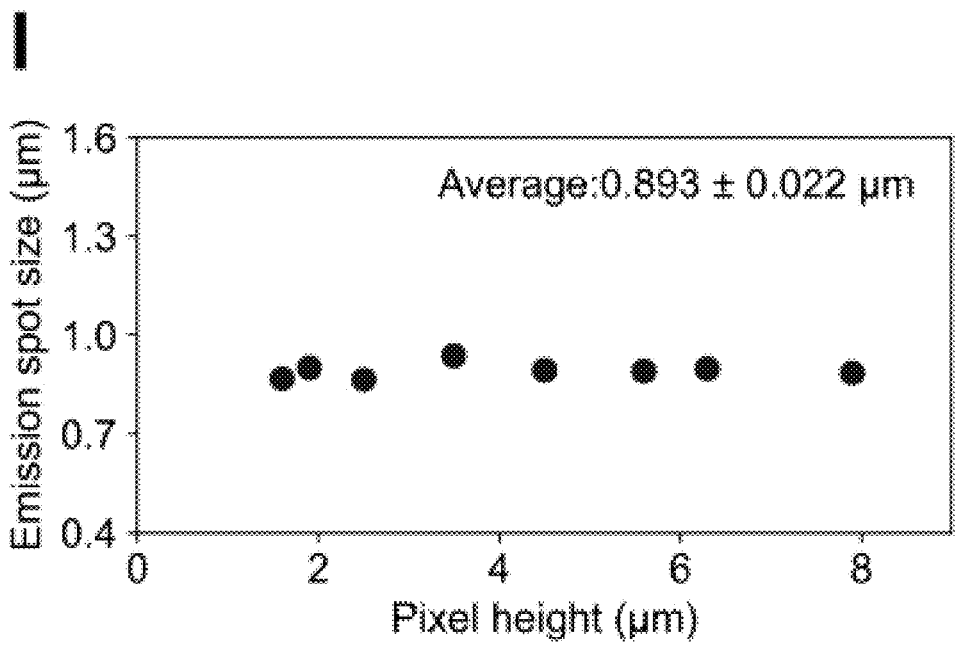
FIG. 2L is a plot diagram showing relationships between the emission spot size and the pixel height of the three-dimensional (3D) printed $CH_3NH_3PbCl_3$ nanopixels of FIG. 2I, according to an embodiment of the subject invention.
Figure 2M:
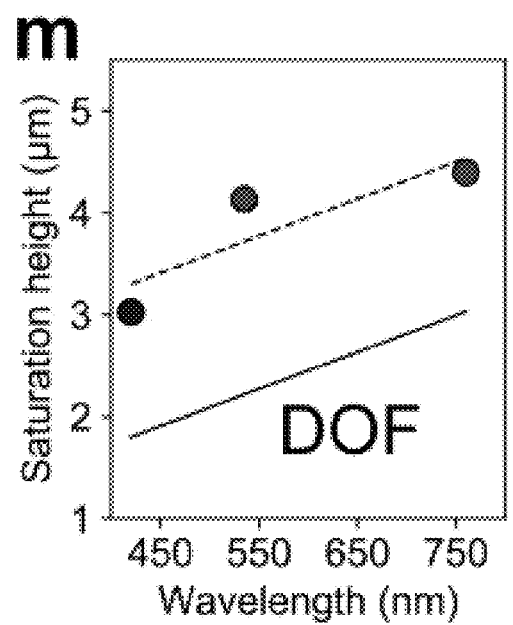
FIG. 2M is a plot diagram showing relationships between the saturation height and the emission wavelength and its correlation with the depth of field (DOF), according to an embodiment of the subject invention.

FIG. 2M shows the dependence of the saturation height on the emission wavelength. It can be seen that the saturation height increases from 3.0 μm to 4.4 μm when the emission wavelength increases from 420 nm to 760 nm. This linear trend (dashed line) may contribute to a linear DOF-wavelength dependence (solid line).

Accordingly, the 3D printing approach enables exceptional on-demand controllability of nanopixel dimensions such as height and diameter at a single-entity level, allowing a flexible response to changes in the DOF of an optical imaging system. The nanoscale 3D printing, therefore, has the potential to produce color digital displays with ultrahigh resolution. In particular, the saturation behavior of nanoscale pixels as shown in FIGS. 2A-2M can be employed to achieve uniform and highly intense emissions.

Figure 3A:
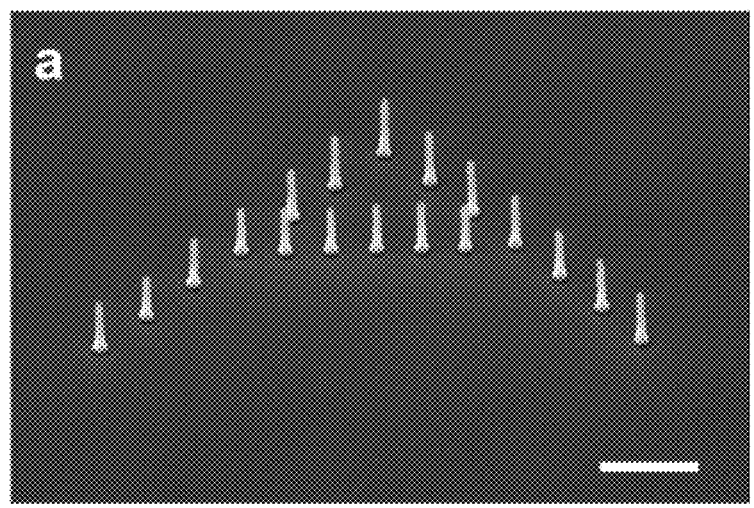
FIG. 3A shows a 45°-tilt-view FE-SEM image of a 3D-printed "A"-shaped matrix comprising vertical $CH_3NH_3PbBr_3$ nanopixels emitting green color light and having a height of about 5.47±0.36 μm, where the scale bar has a length of 5 μm, according to an embodiment of the subject invention.
Figure 3B:
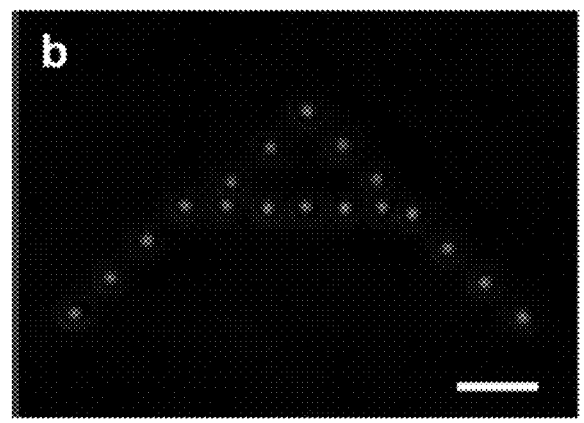
FIG. 3B shows a corresponding bottom-view photoluminescence (PL) image of the nanopixels of FIG. 3A, where the scale bar has a length of 5 μm, according to an embodiment of the subject invention.
Figure 3C:
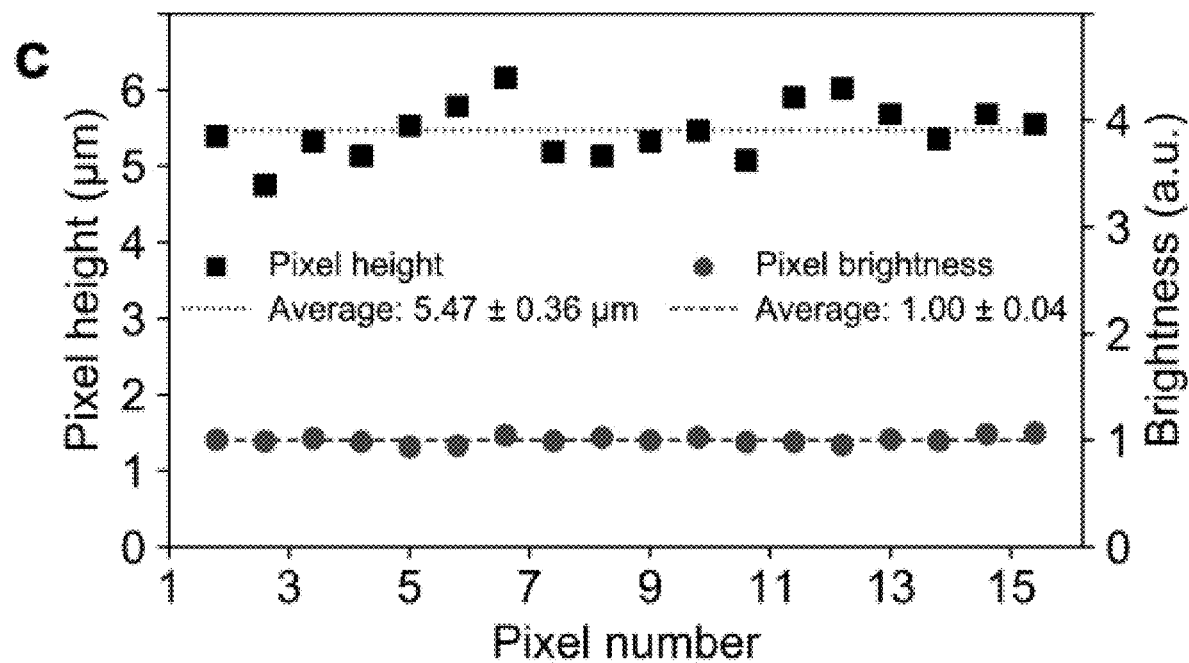
FIG. 3C shows a plot diagram of quantitative distribution of the nanopixel heights and brightness, wherein a.u. stands for arbitrary unit, according to an embodiment of the subject invention.
Figure 3D:
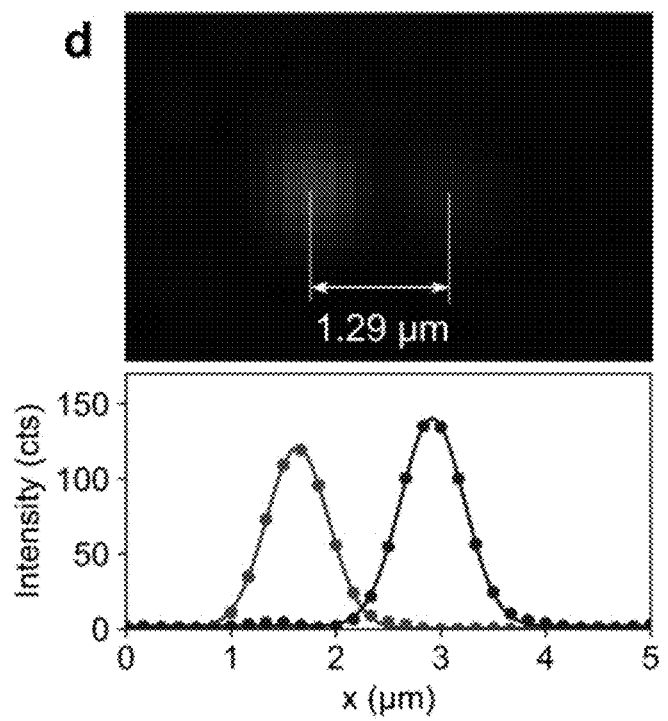
FIG. 3D shows bottom-view PL images (top) and corresponding intensity profiles (bottom) of bi-color G-B nanopixels, according to an embodiment of the subject invention.
Figure 3E:
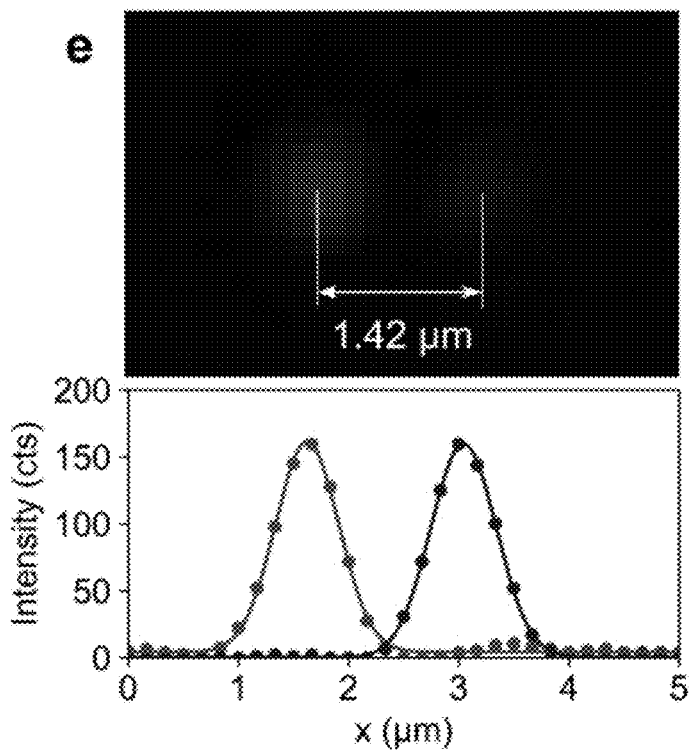
FIG. 3E shows bottom-view PL images (top) and corresponding intensity profiles (bottom) of bi-color R-B nanopixels, according to an embodiment of the subject invention.
Figure 3F:
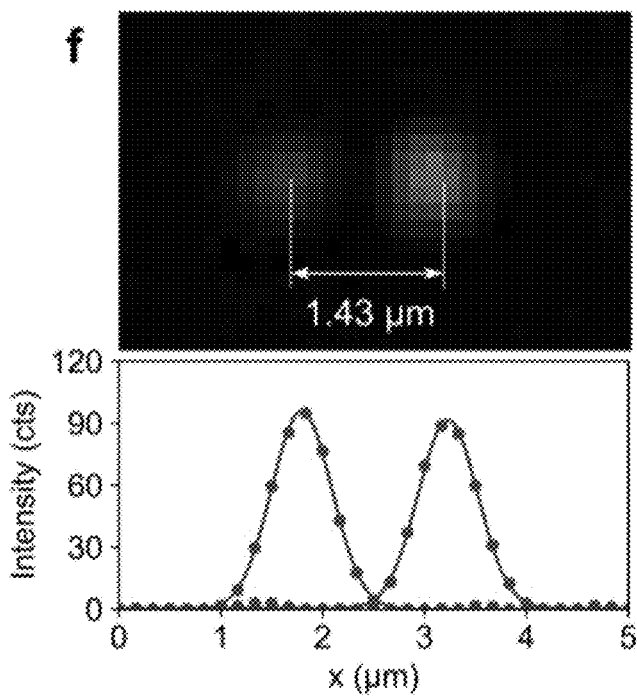
FIG. 3F shows bottom-view PL images (top) and corresponding intensity profiles (bottom) of bi-color R-G nanopixels, according to an embodiment of the subject invention.

Referring to FIG. 3A, a FE-SEM image shows an "A"-shaped $CH_3NH_3PbBr_3$ nanopixel pattern fabricated on a quartz substrate and having an average height of about 5.4 µm (standard deviation 0.3 m) which is greater than its saturation height in FIG. 2G. The corresponding PL image exhibits an "A"-shaped emission of uniform intensity as shown in FIG. 3B. Quantitative analysis results in FIG. 3C additionally reveal that the emissions of these nanopixels exhibit only a 4% deviation resulted from their 6.6% height deviations. FIGS. 3D-3F presents the bottom-view PL images and corresponding intensity profiles of bicolor (G-B, R-B, and R-G) nanopixels with a pitch <1.5 µm.

As illustrated in FIGS. 18A-18G, the method of the subject invention provides a facile route to control the pitch down to about 1.3 µm for high-density pixel integration. Achieving a sub-micrometer pitch still remains a challenge for the printing configuration due to the unwanted merging between the feet of neighboring pixels.

Figure 3G:
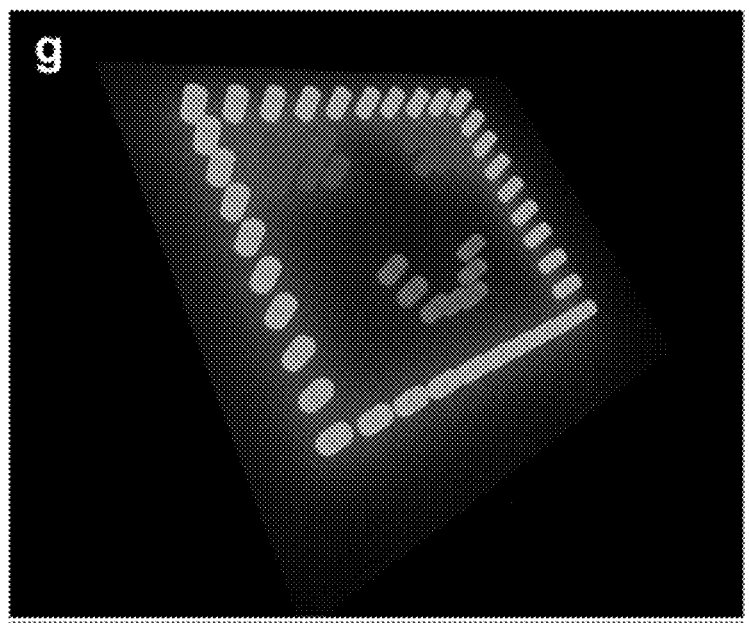
FIG. 3G shows an image of 3D-printed multicolor displays having nanopixel matrix with a "smiley face" pattern, according to an embodiment of the subject invention.
Figure 3H:
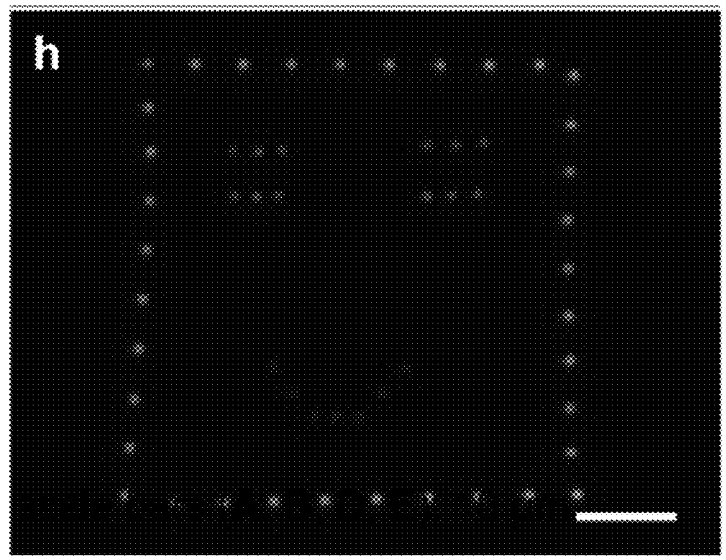
FIG. 3H shows the corresponding PL image of FIG. 3G, wherein the scale bar has a length of 10 µm, according to an embodiment of the subject invention.
Figure 3I:
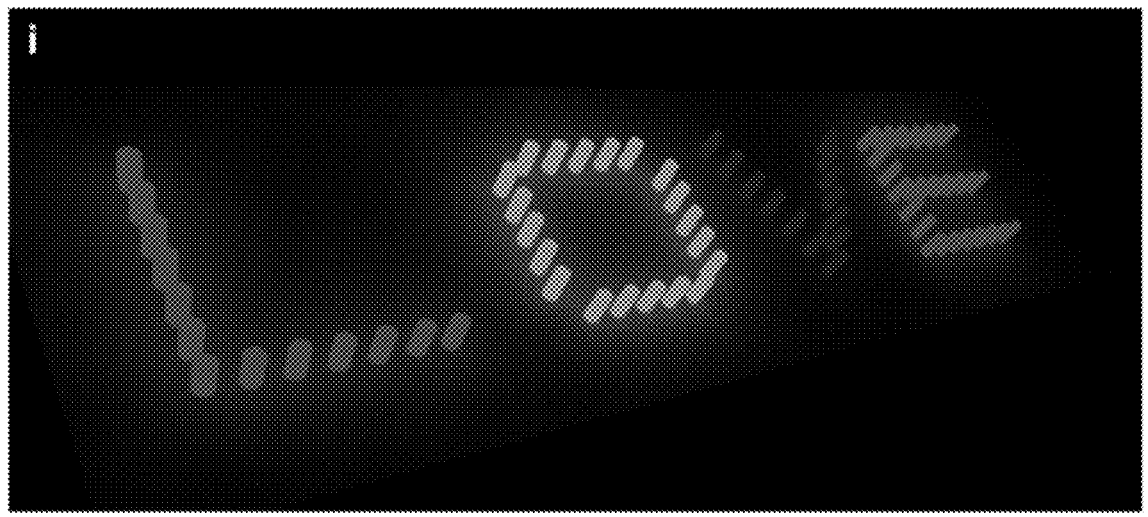
FIG. 3I shows an image of a nanopixel matrix having a pattern of the word "LOVE", according to an embodiment of the subject invention.
Figure 3J:
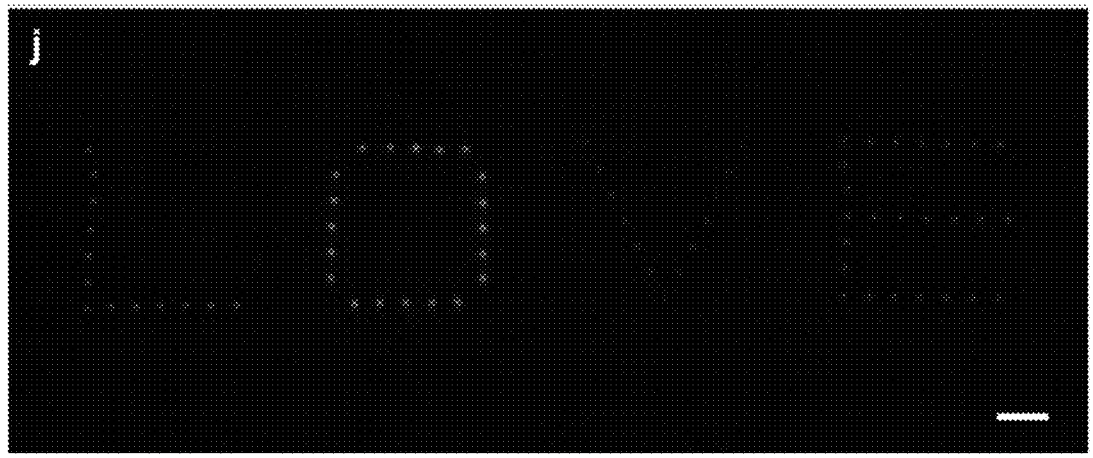
FIG. 3J shows the corresponding PL image of FIG. 3I, wherein the scale bar has a length of 10 µm, according to an embodiment of the subject invention.

Design of multicolor digital displays with an ultrasmall, for example, about 1 µm emission spot and a micrometer pitch, for example, <5 µm are demonstrated in FIGS. 3G-3J. In particular, FIGS. 3G and 3H show the design scheme and corresponding PL image of a "smiley face" comprising R, G, and B saturated nanopixels and the word "LOVE" is spelled out in three-color saturated nanopixels in FIGS. 3I and 3J.

Moreover, in certain embodiments of the subject invention, it is demonstrated that the 3D-printed perovskite nanopixels can serve as building blocks for multilevel anti-counterfeiting labels. The first level of security results from the small size of the nanopixels, since the sub-micrometer diameters of the nanopixels are invisible absent the aid of a high-magnification microscope. The second level of security results from the fact that the fluorescent color information of 3D-printed perovskite nanopixels is only available upon UV excitation.

Figure 4A:
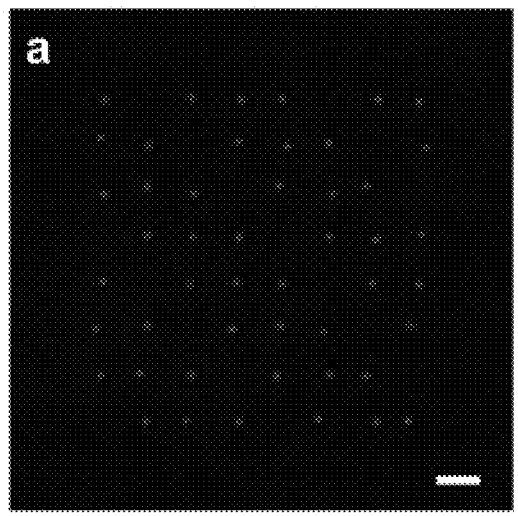
FIG. 4A shows a bottom view PL image of a bi-color data matrix code comprising red (R) and green (G) 3D perovskite nanopixels for multi-level anti-counterfeiting, wherein the scale bar has a length of 5 µm, according to an embodiment of the subject invention.
Figure 4B:
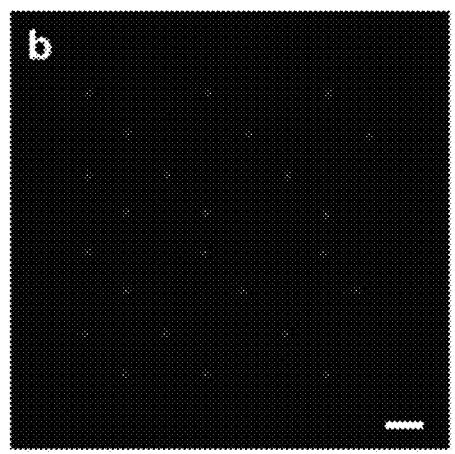
FIG. 4B shows a PL image of an R code visualized from the 3D perovskite nanopixels of FIG. 4A using an R band-pass filter, where the scale bar has a length of 5 µm, according to an embodiment of the subject invention.
Figure 4C:
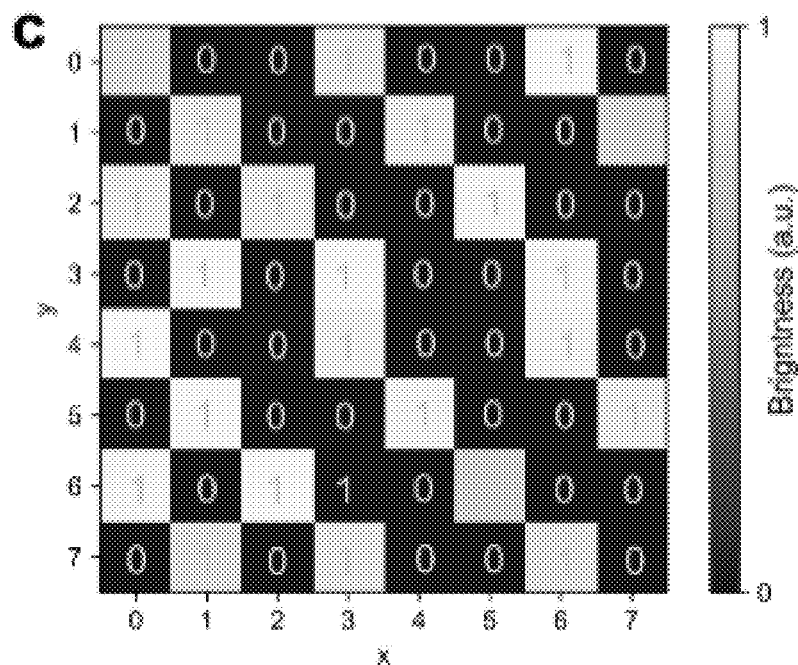
FIG. 4C is a schematic representation of the corresponding binary information matrix of the R code of FIG. 4B, according to an embodiment of the subject invention.

Referring to FIG. 4A, a bicolor (R-G) data matrix code comprising 3D-printed $CH_3NH_3PbI_3$ and $CH_3NH_3PbBr_3$ nanopixels is visualized under a wide-field fluorescence microscope. The luminescent spots indicate "1", while the empty spots indicate "0". The selection of certain pixel colors allows two different binary information codes to be created. Thus, an RG matrix code is shaped into a single-color R binary code via an R band-pass filter as shown in FIG. 4B, thereby decoding the selected binary information as shown in FIG. 4C.

Figure 4D:
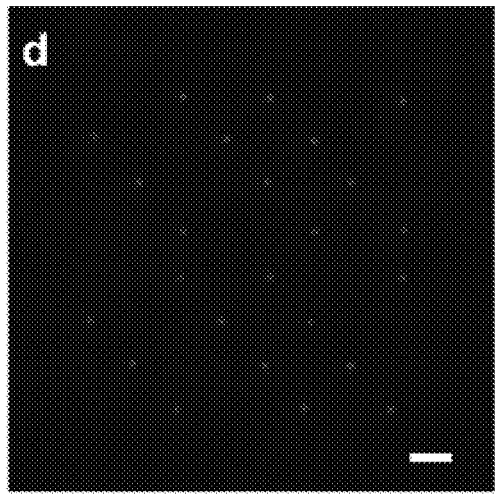
FIG. 4D shows a PL image of a G code visualized from the 3D perovskite nanopixels of FIG. 4A using a G band-pass filter, wherein the scale bar has a length of 5 µm, according to an embodiment of the subject invention.
Figure 4E:
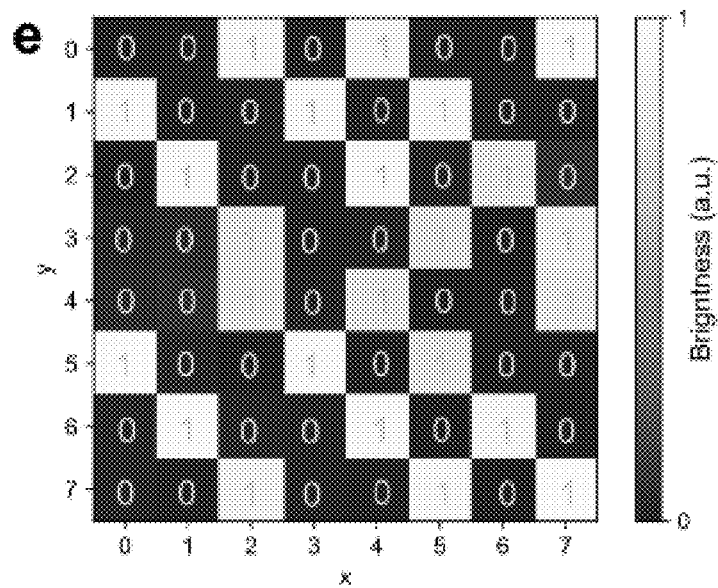
FIG. 4E is a schematic representation of the corresponding binary information matrix of the G code of FIG. 4D, according to an embodiment of the subject invention.

Similarly, a single-color G binary code is obtained by a G band-pass filter as shown in FIGS. 4D and 4E.

The primary advantage of the 3D-printed pixels is that they provide an additional dimension through which data can be stored and/or encrypted. For example, if an 8×8 matrix comprising pixels with four different heights, the resulting 2-bit, 8×8 matrix can encode 464 combinations, which is far greater than the 264 combinations that can be encoded by a traditional binary 8×8 matrix.

FIGS. 4F and 4K show the designs of two 3D matrix codes comprising perovskite G nanopixels with four discrete heights of 0 m, 5 m, 10 m, and 15 m, which are encoded as "0", "1", "2", and "3", respectively. The two codes are designed to have the same 2-bit configuration except their first row, which is "01230123" for code 1 as shown in FIG. 4F and "02310231" for code 2 as shown in FIG. 4K.

It is noted that it is not feasible for a wide-field fluorescence microscope to access the entire information encoded in the nanopixel. As the pixel height of 5 µm for "1" is greater than the saturation height, the measured emission intensity presents only binary information. As a result, the PL images of codes 1 and 2 appear to be identical as shown in FIGS. 4G and 4L.

Accordingly, their emission-intensity based digital codes quantitatively exhibit the same information. For example, the first rows of both codes denote "01110111" as shown in FIGS. 4H and 4M, demonstrating that the height-encrypted 3D matrix codes have the same function as a binary Quick Response (QR) code.

In addition, such height-encrypted 3D information can be decrypted via high-resolution 3D imaging such as, confocal microscopy. The confocal PL images of the 3D-printed code 1 in FIG. 4I and code 2 in FIG. 4N clearly show the 2-bit, 8×8 3D data matrix codes in FIGS. 4J and 4O, respectively, with their first rows denoting "01230123" and "02310231", respectively, though the 2D information presents "01110111" identically, which proves that information can be encrypted by the pixel height to offer an additional level of security for anti-counterfeiting applications. It is also noted that the data storage capacity and the encryption level of the 3D-printed pixels can easily be enhanced by increasing the number of discrete height levels by the flexible and effective 3D printing methods of the subject invention.

The patterns of nanopixels fabricated according to the 3D printing method can be diversified to include various complex geometries as shown in FIGS. 19A-19D, by optimizing the printing speeds and the fabrication scalability through techniques such as parallel 3D printing, allowing a wide spectrum of applications of the 3D printing method.

The nanoscale 3D printing of perovskite nanopixels with programmed dimensions, placements, and emission characteristics based on femtolitermeniscus-guided in situ crystallization processes enables ultrahigh-density fabrication of vertically freestanding red, green, and blue perovskite pixels with a lateral dimension of about 550 nm and a pitch ranging from 5 µm to 1.3 µm for ultra-high-resolution digital displays.

The vertical on-demand printing process provides two key benefits. First, the pixel height can be increased to enhance emission brightness to be tens of times greater than the thin-film pixels fabricated by the conventional technology without decreasing the lateral resolution, allowing formation of high-resolution display devices with improved brightness. Second, the pixel height can be utilized as an additional dimension for encoding/decoding data, as it is not quantitatively accessible by conventional wide-field microscopes that are depth-of-field limited. As a result, multilevel and high-resolution anti-counterfeiting security labels can be achieved by combining the luminescence of perovskite nanopixels with variations in pixel height.

Therefore, the embodiments of the subject invention are advantageous in providing single-entity-level, on-demand fabrication of perovskite nanopixels or untrasmall perovskites anti-counterfeiting units. Furthermore, the entire fabrication process is 'lithography-free' and the methods can be generalized for a broad range of materials for low-cost, solution-mediated crystallization processes of 3D printing.

The platform for 3D perovskite nanofabrication provided by the embodiments of the subject invention opens up exciting new avenues for the realization of ultrahigh-resolution, high performance, and multifunctional photonic devices.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

REFERENCES (1) Kumar, K.; Duan, H.; Hegde, R. S.; Koh, S. C. W.; Wei, J. N.; Yang, J. K. W. Printing Colour at the Optical Diffraction Limit. Nat. Nanotechnol. 2012, 7, 557-561.
(2) Zhu, X.; Vannahme, C.; Højlund-Nielsen, E.; Mortensen, N. A.; Kristensen, A. Plasmonic Color Laser Printing. Nat. Nanotechnol. 2016, 11, 325-329.
(3) Franklin, D.; Frank, R.; Wu, S.-T.; Chanda, D. Actively Addressed Single Pixel Full-Colour Plasmonic Display. Nat. Commun. 2017, 8, 15209.
(4) Su, M.; Huang, Z.; Li, Y.; Qian, X.; Li, Z.; Hu, X.; Pan, Q.; Li, F.; Li, L.; Song, Y. A 3D Self-Shaping Strategy for Nanoresolution Multicomponent Architectures. Adv. Mater. 2018, 30, 1703963.
(5) Li, Q.; Ji, M. G.; Kim, J. Grayscale Nanopixel Printing at Sub-10-nanometer Vertical Resolution via Light-Controlled Nanocapillarity. ACS Nano 2020, 14, 6058-6066.
(6) Ko, J.; Ma, K.; Joung, J. F.; Park, S.; Bang, J. Ligand-Assisted Direct Photolithography of Perovskite Nanocrystals Encapsulated with Multifunctional Polymer Ligands for Stable, Full-Colored, High-Resolution Displays. Nano Lett. 2021, 21, 2288-2295.
(7) Kwak, J.; Bae, W. K.; Lee, D.; Park, I.; Lim, J.; Park, M.; Cho, H.; Woo, H.; Yoon, D. Y.; Char, K.; Lee, S.; Lee, C. Bright and Efficient Full-Color Colloidal Quantum Dot Light-Emitting Diodes Using an Inverted Device Structure. Nano Lett. 2012, 12, 2362-2366.
(8) Zhang, F.; Zhong, H.; Chen, C.; Wu, X.-G.; Hu, X.; Huang, H.; Han, J.; Zou, B.; Dong, Y. Brightly Luminescent and Color-Tunable Colloidal $CH_3NH_3PbX_3$ (X=Br, I, Cl) Quantum Dots: Potential Alternatives for Display Technology. ACS Nano 2015, 9, 4533-4542.
(9) Bae, J.; Lee, S.; Ahn, J.; Kim, J. H.; Wajahat, M.; Chang, W. S.; Yoon, S.-Y.; Kim, J. T.; Seol, S. K.; Pyo, J. 3D-Printed Quantum Dot Nanopixels. ACS Nano 2020, 14, 10993-11001.
(10) Sun, B.; Edgar, M. P.; Bowman, R.; Vittert, L. E.; Welsh, S.; Bowman, A.; Padgett, M. J. 3D Computational Imaging with Single-Pixel Detectors. Science 2013, 340, 844-847.
(11) Phillips, D. B.; Sun, M.-J.; Taylor, J. M.; Edgar, M. P.; Barnett, S. M.; Gibson, G. M.; Padgett, M. J. Adaptive Foveated Single-Pixel Imaging with Dynamic Supersampling. Sci. Adv. 2017, 3, e1601782.
(12) Gao, Y.; Huang, C.; Hao, C.; Sun, S.; Zhang, L.; Zhang, C.; Duan, Z.; Wang, K.; Jin, Z.; Zhang, N.; Kildishev, A. V.; Qiu, C.-W.; Song, Q.; Xiao, S. Lead Halide Perovskite Nanostructures for Dynamic Color Display. ACS Nano 2018, 12, 8847-8854.
(13) Carro-Temboury, M. R.; Arppe, R.; Vosch, T.; Sørensen, T. J. An Optical Authentication System Based on Imaging of Excitation-Selected Lanthanide Luminescence. Sci. Adv. 2018, 4, e1701384.
(14) Tan, M.; Li, F.; Wang, X.; Fan, R.; Chen, G. Temporal Multilevel Luminescence Anticounterfeiting through Scattering Media. ACS Nano 2020, 14, 6532-6538.
(15) Zang, X.; Dong, F.; Yue, F.; Zhang, C.; Xu, L.; Song, Z.; Chen, M.; Chen, P.-Y.; Buller, G. S.; Zhu, Y.; Zhuang, S.; Chu, W.; Zhang, S.; Chen, X. Polarization Encoded Color Image Embedded in a Dielectric Metasurface. Adv. Mater. 2018, 30, 1707499.
(16) Liu, Y.; Han, F.; Li, F.; Zhao, Y.; Chen, M.; Xu, Z.; Zheng, X.; Hu, H.; Yao, J.; Guo, T.; Lin, W.; Zheng, Y.; You, B.; Liu, P.; Li, Y.; Qian, L. Inkjet-Printed Unclonable Quantum Dot Fluorescent Anti-Counter-feiting Labels with Artificial Intelligence Authentication. Nat. Commun. 2019, 10, 2409.
(17) Ren, W.; Lin, G.; Clarke, C.; Zhou, J.; Jin, D. Optical Nanomaterials and Enabling Technologies for High-Security-Level Anticounterfeiting. Adv. Mater. 2020, 32, 1901430.
(18) Deng, J.; Deng, L.; Guan, Z.; Tao, J.; Li, G.; Li, Z.; Li, Z.; Yu, S.; Zheng, G. Multiplexed Anticounterfeiting Meta-image Displays with Single-Sized Nanostructures. Nano Lett. 2020, 20, 1830-1838.
(19) Protesescu, L.; Yakunin, S.; Bodnarchuk, M. I.; Krieg, F.; Caputo, R.; Hendon, C. H.; Yang, R. X.; Walsh, A.; Kovalenko, M. V. Nanocrystals of Cesium Lead Halide Perovskites ($CsPbX_3$, X=Cl, Br, and I): Novel Optoelectronic Materials Showing Bright Emission with Wide Color Gamut. Nano Lett. 2015, 15, 3692-3696.
(20) Miao, Y.; Ke, Y.; Wang, N.; Zou, W.; Xu, M.; Cao, Y.; Sun, Y.; Yang, R.; Wang, Y.; Tong, Y.; Xu, W.; Zhang, L.; Li, R.; Li, J.; He, H.; Jin, Y.; Gao, F.; Huang, W.; Wang, J. Stable and Bright Formamidinium-Based Perovskite Light-Emitting Diodes with High Energy Conversion Efficiency. Nat. Commun. 2019, 10, 3624.
(21) Lu, M.; Guo, J.; Sun, S.; Lu, P.; Wu, J.; Wang, Y.; Kershaw, S. V.; Yu, W. W.; Rogach, A. L.; Zhang, Y. Bright cspbi3 Perovskite Quantum Dot Light-Emitting Diodes with Top-Emitting Structure and a Low Efficiency Roll-Off Realized by Applying Zirconium Acetylacetonate Surface Modification. Nano Lett. 2020, 20, 2829-2836.
(22) Xing, G.; Mathews, N.; Lim, S. S.; Yantara, N.; Liu, X.; Sabba, D.; Grätzel, M.; Mhaisalkar, S.; Sum, T. C. Low-Temperature Solution-Processed Wavelength-Tunable Perovskites for Lasing. Nat. Mater. 2014, 13, 476-480.
(23) Fu, Y.; Zhu, H.; Stoumpos, C. C.; Ding, Q.; Wang, J.; Kanatzidis, M. G.; Zhu, X.; Jin, S. Broad Wavelength Tunable Robust Lasing from Single-Crystal Nanowires of Cesium Lead Halide Perovskites ($CsPbX_3$, X=Cl, Br, I). ACS Nano 2016, 10, 7963-7972.
(24) Xing, J.; Liu, X. F.; Zhang, Q.; Ha, S. T.; Yuan, Y. W.; Shen, C.; Sum, T. C.; Xiong, Q. Vapor Phase Synthesis of Organometal Halide Perovskite Nanowires for Tunable Room-Temperature Nanolasers. Nano Lett. 2015, 15, 4571-4577.
(25) Kojima, A.; Teshima, K.; Shirai, Y.; Miyasaka, T. Organometal Halide Perovskites as Visible-Light Sensitizers for Photovoltaic Cells. J. Am. Chem. Soc. 2009, 131, 6050-6051.
(26) Green, M. A.; Ho-Baillie, A.; Snaith, H. J. The Emergence of Perovskite Solar Cells. Nat. Photonics 2014, 8, 506-514.
(27) Yang, W. S.; Park, B.-W.; Jung, E. H.; Jeon, N. J.; Kim, Y. C.; Lee, D. U.; Shin, S. S.; Seo, J.; Kim, E. K.; Noh, J. H.; Seok, S. I. Iodide Management in Formamidinium-Lead-Halide-Based Perovskite Layers for Efficient Solar Cells. Science 2017, 356, 1376-1379.

(28) Veldhuis, S. A.; Boix, P. P.; Yantara, N.; Li, M.; Sum, T. C.; Mathews, N.; Mhaisalkar, S. G. Perovskite Materials for Light-Emitting Diodes and Lasers. Adv. Mater. 2016, 28, 6804-6834.
(29) Zhu, M.; Duan, Y.; Liu, N.; Li, H.; Li, J.; Du, P.; Tan, Z.; Niu, G.; Gao, L.; Huang, Y.; Yin, Z.; Tang, J. Electrohydrodynamically Printed High-Resolution Full-Color Hybrid Perovskites. Adv. Funct. Mater. 2019, 29, 1903294.
(30) Liu, Y.; Li, F.; Qiu, L.; Yang, K.; Li, Q.; Zheng, X.; Hu, H.; Guo, T.; Wu, C.; Kim, T. W. Fluorescent Microarrays of In Situ Crystallized Perovskite Nanocomposites Fabricated for Patterned Applications by Using Inkjet Printing. ACS Nano 2019, 13, 2042-2049.
(31) Shi, L.; Meng, L.; Jiang, F.; Ge, Y.; Li, F.; Wu, X.; Zhong, H. In Situ Inkjet Printing Strategy for Fabricating Perovskite Quantum Dot Patterns. Adv. Funct. Mater. 2019, 29, 1903648.
(32) Zhang, N.; Sun, W.; Rodrigues, S. P.; Wang, K.; Gu, Z.; Wang, S.; Cai, W.; Xiao, S.; Song, Q. Highly Reproducible Organometallic Halide Perovskite Microdevices based on Top-Down Lithography. Adv. Mater. 2017, 29, 1606205.
(33) Wang, S.; Liu, Y.; Li, G.; Zhang, J.; Zhang, N.; Xiao, S.; Song, Q. Lead Halide Perovskite Based Microdisk Lasers for On-Chip Integrated Photonic Circuits. Adv. Opt. Mater. 2018, 6, 1701266.
(34) Lyashenko, D.; Perez, A.; Zakhidov, A. High-Resolution Patterning of Organohalide Lead Perovskite Pixels for Photodetectors Using Orthogonal Photolithography. Phys. Status Solidi A 2017, 214, 1600302.
(35) Harwell, J.; Burch, J.; Fikouras, A.; Gather, M. C.; Falco, A. D.; Samuel, I. D. W. Patterning Multicolor Hybrid Perovskite Films via Top-Down Lithography. ACS Nano 2019, 13, 3823-3829.
(36) Xing, D.; Lin, C.-C.; Ho, Y.-L.; Kamal, A. S. A.; Wang, I.-T.; Chen, C.-C.; Wen, C.-Y.; Chen, C.-W.; Delaunay, J.-J. Self-Healing Lithographic Patterning of Perovskite Nanocrystals for Large-Area Single-Mode Laser Array. Adv. Funct. Mater. 2021, 31, 2006283.
(37) Wang, H.; Haroldson, R.; Balachandran, B.; Zakhidov, A.; Sohal, S.; Chan, J. Y.; Zakhidov, A.; Hu, W. Nanoimprinted Perovskite Nanograting Photodetector with Improved Efficiency. ACS Nano 2016, 10, 10921-10928.
(38) Li, Z.; Moon, J.; Gharajeh, A.; Haroldson, R.; Hawkins, R.; Hu, W.; Zakhidov, A.; Gu, Q. Room-Temperature Continuous-Wave Operation of Organometal Halide Perovskite Lasers. ACS Nano 2018, 12, 10968-10976.
(39) Jeong, B.; Han, H.; Park, C. Micro- and Nanopatterning of Halide Perovskites where Crystal Engineering for Emerging Photo-electronics Meets Integrated Device Array Technology. Adv. Mater. 2020, 32, 2000597.
(40) Kim, B. H.; Onses, M. S.; Lim, J. B.; Nam, S.; Oh, N.; Kim, H.; Yu, K. J.; Lee, J. W.; Kim, J.-H.; Kang, S.-K.; Lee, C. H.; Lee, J.; Shin, J. H.; Kim, N. H.; Leal, C.; Shim, M.; Rogers, J. A. High-Resolution Patterns of Quantum Dots Formed by Electrohydrodynamic Jet Printing for Light-Emitting Diodes. Nano Lett. 2015, 15, 969-973.
(41) Richner, P.; Galliker, P.; Lendenmann, T.; Kress, S. J. P.; Kim, D. K.; Norris, D. J.; Poulikakos, D. Full-Spectrum Flexible Color Printing at the Diffraction Limit. ACS Photonics 2016, 3, 754-757.
(42) Xing, J.; Liu, X. F.; Zhang, Q.; Ha, S. T.; Yuan, Y. W.; Shen, C.; Sum, T. C.; Xiong, Q. Vapor Phase Synthesis of Organometal Halide Perovskite Nanowires for Tunable Room-Temperature Nanolasers. Nano Lett. 2015, 15, 4571-4577.
(43) Chen, J.; Fu, Y.; Samad, L.; Dang, L.; Zhao, Y.; Shen, S.; Guo, L.; Jin, S. Vapor-Phase Epitaxial Growth of Aligned Nanowire Networks of Cesium Lead Halide Perovskites ($CsPbX_3$, X=Cl, Br, I). Nano Lett. 2017, 17, 460-466.
(44) Hu, X.; Zhou, H.; Jiang, Z.; Wang, X.; Yuan, S.; Lan, J.; Fu, Y.; Zhang, X.; Zheng, W.; Wang, X.; Zhu, X.; Liao, L.; Xu, G.; Jin, S.; Pan, A. Direct Vapor Growth of Perovskite $CsPbBr_3$ Nanoplate Electro-luminescence Devices. ACS Nano 2017, 11, 9869-9876.
(45) Chen, M.; Yang, J.; Wang, Z.; Xu, Z.; Lee, H.; Lee, H.; Zhou, Z.; Feng, S.-P.; Lee, S.; Pyo, J.; Seol, S. K.; Ki, D.-K.; Kim, J. T. 3D Nanoprinting of Perovskites. Adv. Mater. 2019, 31, 1904073.
(46) Chen, M.; Xu, Z.; Kim, J. H.; Seol, S. K.; Kim, J. T. Meniscus-On-Demand Parallel 3D Nanoprinting. ACS Nano 2018, 12, 4172-4177.
(47) Kim, J. T.; Seol, S. K.; Pyo, J.; Lee, J. S.; Je, J. H.; Margaritondo, G. Three-Dimensional Writing of Conducting Polymer Nanowire Arrays by Meniscus-Guided Polymerization. Adv. Mater. 2011, 23, 1968-1970.
(48) Hu, J.; Yu, M.-F. Meniscus-Confined Three-Dimensional Electrodeposition for Direct Writing of Wire Bonds. Science 2010, 329, 313-316.
(49) Yi, Z.; Guo, J.; Chen, Y.; Zhang, H.; Zhang, S.; Xu, G.; Yu, M.; Cui, P. Vertical, Capacitive Microelectromechanical Switches Produced via Direct Writing of Copper Wires. Microsyst. Nanoeng. 2016, 2, 16010.

We claim:
1. A method for preparing three-dimensional perovskite nanopixels of a digital display, comprising:
preparing precursor ink by mixing methylammonium halide and lead halide at a certain volume ratio and adding them into another mixture;
stirring the precursor ink for a period of time at a certain temperature;
adding the precursor ink into a nanopipette;
placing the nanopipette with the precursor ink above a silicon (Si) substrate and apart from the Si substrate by a certain distance;
configuring the nanopipette to come into contact with the Si substrate such that a portion of the precursor ink having an interface surface of a shape of a meniscus is formed between the nanopipette and the Si substrate;
performing rapid evaporation of the portion of the precursor ink to facilitate crystallization of perovskite in the portion of the precursor ink;
moving the nanopipette upwardly at a constant speed such that the crystallization of perovskite proceeds upwardly; and
abruptly moving the nanopipette at a speed higher than the constant speed such that the crystallization of perovskite is terminated to generate a freestanding nanopixel with a desired height for emitting light.
2. The method according to claim 1, wherein the methylammonium halide comprises at least one of $CH_3NH_3I$, $CH_3NH_3Br$, and $CH_3NH_3Cl$.
3. The method according to claim 1, wherein the lead halide comprises at least one of $PbI_2$, $PbBr_2$, and $PbCl_2$.
4. The method according to claim 1, wherein the another mixture comprises N,N-dimethylformamide (DMF) and dimethyl sulfoxide (DMSO).
5. The method according to claim 1, wherein the volume ratio of the methylammonium halide and the lead halide is 1:1.

6. The method according to claim 1, wherein the stirring the precursor ink is carried out for about two hours and at about 60° C.

7. The method according to claim 1, wherein the nanopipette has an aperture with a size of about 600 nm.

8. The method according to claim 1, wherein the adding the precursor ink into the nanopipette is carried out at room temperature and at a relative humidity of about 10%.

9. The method according to claim 1, wherein the nanopipette with the precursor ink is spaced apart from the Si substrate by a distance in a range between 0.1 µm and 10 µm.

10. The method according to claim 1, wherein the portion of the precursor ink having an interface surface of a shape of a meniscus has a volume in a range between 0.1 femtoliter and 9.9 femtoliter.

11. The method according to claim 1, wherein the rapid evaporation of the portion of the precursor ink is performed at a certain evaporate rate.

12. The method according to claim 1, wherein when the methylammonium halide comprises $CH_3NH_3I$ and the lead halide comprises $PbI_2$, the freestanding nanopixel generated emits light of a red color.

13. The method according to claim 1, wherein when the methylammonium halide comprises $CH_3NH_3Br$ and the lead halide comprises $PbBr_2$, the freestanding nanopixel generated emits light of a green color.

14. The method according to claim 1, wherein when the methylammonium halide comprises $CH_3NH_3Cl$ and the lead halide comprises $PbCl_2$, the freestanding nanopixel generated emits light of a blue color.

15. The method according to claim 1, wherein the moving the nanopipette at a constant speed is carried out at a speed of 5 µm/s.

16. The method according to claim 1, wherein the abruptly moving the nanopipette at a speed higher than the constant speed is carried out at the higher speed equal to 100 µm/s.

17. The method according to claim 1, further comprising controlling a size of a cross-sectional area of the nanopixel by varying size of the aperture of nanopipette.

18. The method according to claim 1, further comprising controlling a size of a cross-sectional area the nanopixel by varying the constant moving speed of the nanopipette.

* * * * *